US012672381B2

(12) United States Patent
Lee et al.

(10) Patent No.: US 12,672,381 B2
(45) Date of Patent: Jun. 30, 2026

(54) STACK STRUCTURE AND MANUFACTURING METHOD THEREOF, CAPACITOR USING THE SAME, TRANSISTOR USING THE SAME, DYE-SENSITIZED SOLAR CELL USING THE SAME, AND ARCHITECTURAL FILM FOR WINDOW GLASS COATING USING THE SAME

(71) Applicant: RESEARCH & BUSINESS FOUNDATION SUNGKYUNKWAN UNIVERSITY, Suwon-si (KR)

(72) Inventors: Sung Joo Lee, Seongnam-si (KR); Tae Ho Kang, Seoul (KR); Hae Ju Choi, Suwon-si (KR); Jong Wook Jeon, Suwon-si (KR); Sung Pyo Baek, Suwon-si (KR); Sang Min Lee, Suwon-si (KR); Cheol Hwa Jang, Suwon-si (KR); Jong Min Noh, Suwon-si (KR); Seong Kweon Kang, Suwon-si (KR); Na Yeong Lee, Suwon-si (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 18 days.

(21) Appl. No.: 18/748,599

(22) Filed: Jun. 20, 2024

(65) Prior Publication Data

US 2025/0185407 A1 Jun. 5, 2025

(30) Foreign Application Priority Data

Dec. 4, 2023 (KR) ......................... 10-2023-0173012
Dec. 4, 2023 (KR) ......................... 10-2023-0173013
(Continued)

(51) Int. Cl.
H10F 71/00 (2025.01)
H10F 77/169 (2025.01)

(52) U.S. Cl.
CPC ....... *H10F 71/125* (2025.01); *H10F 77/1696* (2025.01)

(58) Field of Classification Search
CPC .......................... H10F 77/1696; H10F 71/125
See application file for complete search history.

(56) References Cited

FOREIGN PATENT DOCUMENTS

CN 108831928 11/2018

OTHER PUBLICATIONS

Li (Year: 2021).*

(Continued)

*Primary Examiner* — Sadie White
(74) *Attorney, Agent, or Firm* — LEX IP MEISTER, PLLC

(57) ABSTRACT

Provided is a method for manufacturing a stack structure. The method for manufacturing a stack structure includes: preparing a substrate; forming a two-dimensional semiconductor material on the substrate; and oxidizing the two-dimensional semiconductor material using oxygen plasma to form a high-k material layer including the high-k material. The stack structure manufactured through the above-described method may be easily applied to a MOS capacitor, a field effect transistor (FET), an impact ionization super-tilt switching device, a dye-sensitized solar cell, an architectural film (particularly, a film used for window coating), and the like.

3 Claims, 63 Drawing Sheets

(30)          Foreign Application Priority Data

Dec. 4, 2023    (KR) ........................ 10-2023-0173014
Feb. 27, 2024    (KR) ........................ 10-2024-0027949

(56)          References Cited

OTHER PUBLICATIONS

Tu Supplemental (Year: 2020).*
Tu (Year: 2020).*
Lai Supplemental (Year: 2018).*
Lai (Year: 2018).*
Kang (Year: 2017).*
Lee (Year: 2023).*
Zhao (Year: 2019).*
Lee, Sungjoo, et al. "High-quality HfO2/HfSe2 gate stack for low-power steep-switching computing devices." (2023).

Mleczko, Michal J., et al. "HfSe2 and ZrSe2: Two-dimensional semiconductors with native high-κ oxides." *Science advances* 3.8 (2017): e1700481.
Kang, Moonshik, et al. "Tunable electrical properties of multilayer HfSe 2 field effect transistors by oxygen plasma treatment." *Nanoscale* 9.4 (2017): 1645-1652.
Lai, Shen, et al. "HfO 2/HfS 2 hybrid heterostructure fabricated via controllable chemical conversion of two-dimensional HfS 2." *Nanoscale* 10.39 (2018): 18758-18766.
Li, Tianran, et al., "A Native Oxide High-K Gate Dielectric for Two-Dimensional Electronics", Nature Electronics, 2020, (6 Pages in English).
Tu, Teng, et al., "Uniform High-K Amorphous Native Oxide Synthesized by Oxygen Plasma for Top-Gated Transistors", Nano Letters, American Chemical Society, 2020, (p. 7469-7475).
Davoudi, Mohammad Rasool, et al., "Multi-Scale Modeling of Transistors Based on the 2D Semiconductor Bi2O2Se", International Conference on Simulation of Semiconductor Processes and Devices, IEEE, 2023, (4 Pages in English).

* cited by examiner

【Fig. 1】
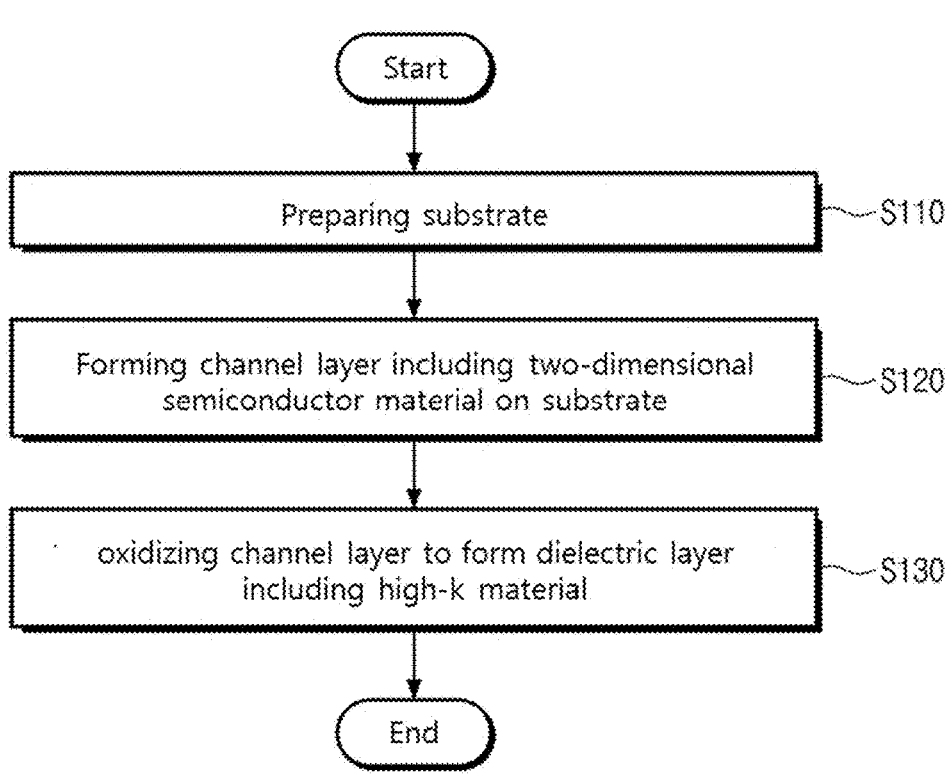

【Fig. 2】
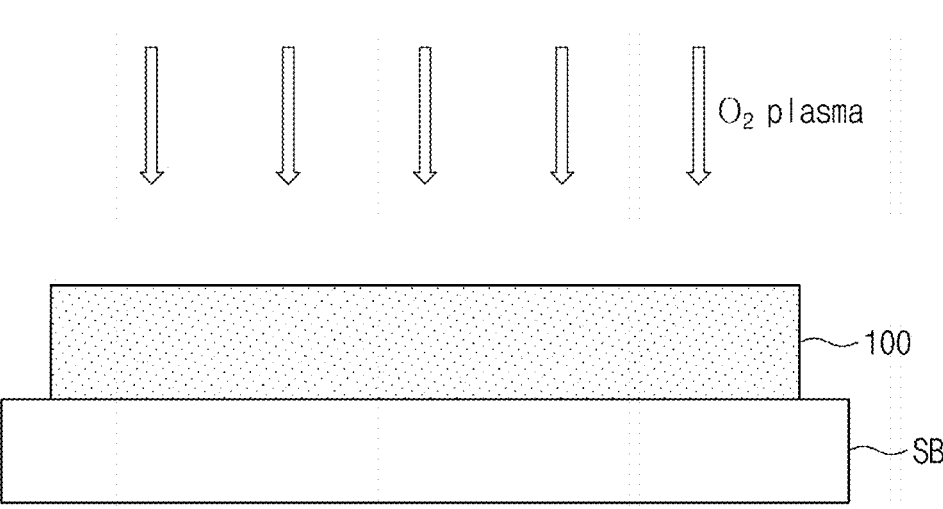
【Fig. 3】
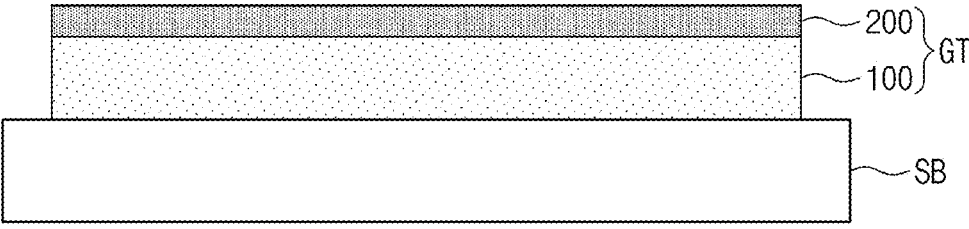

【Fig. 4】
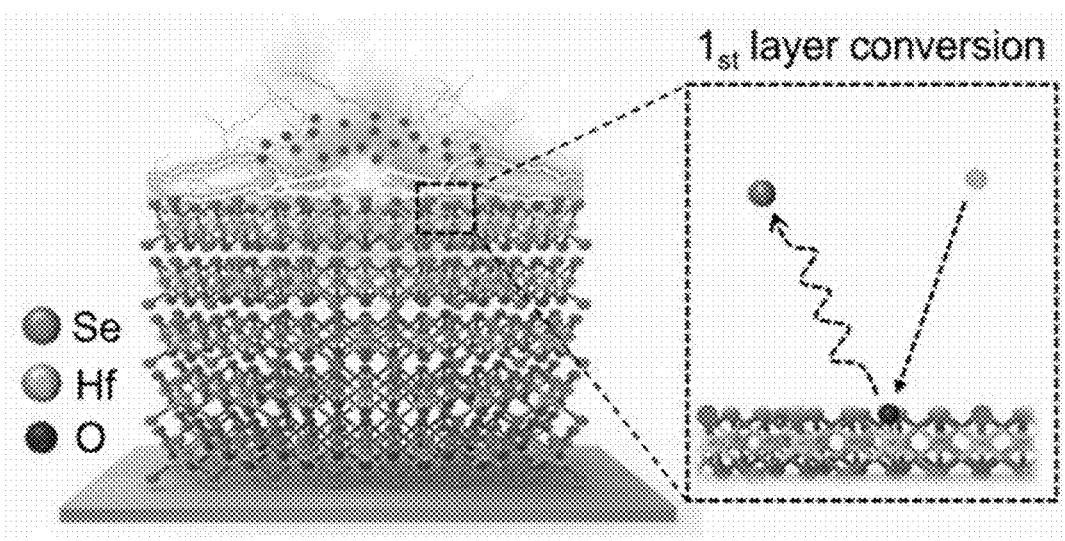

【Fig. 5】
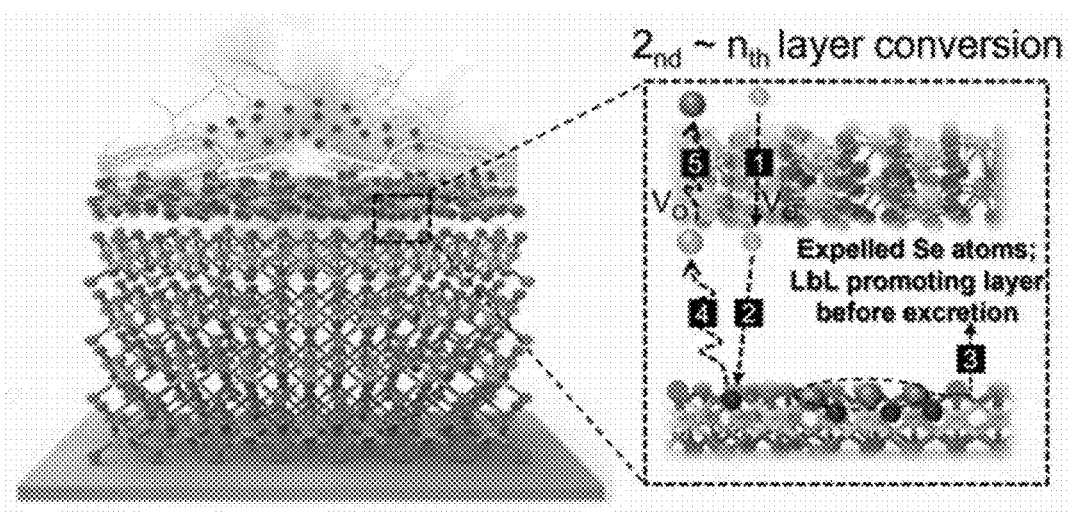
【Fig. 6】
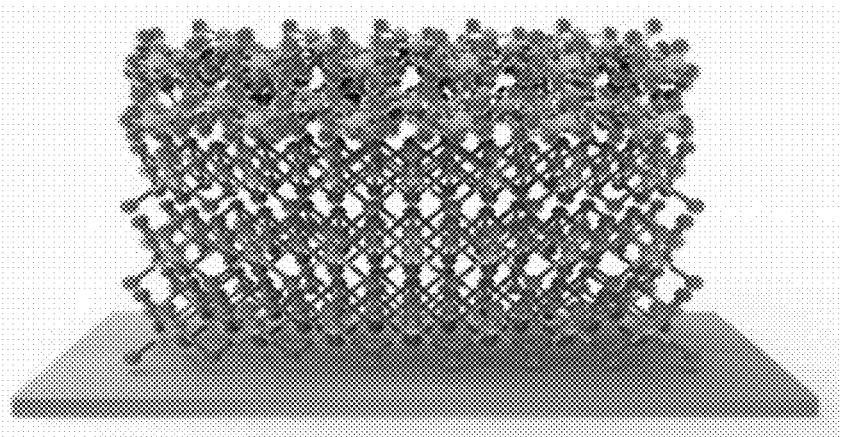

【Fig. 7】
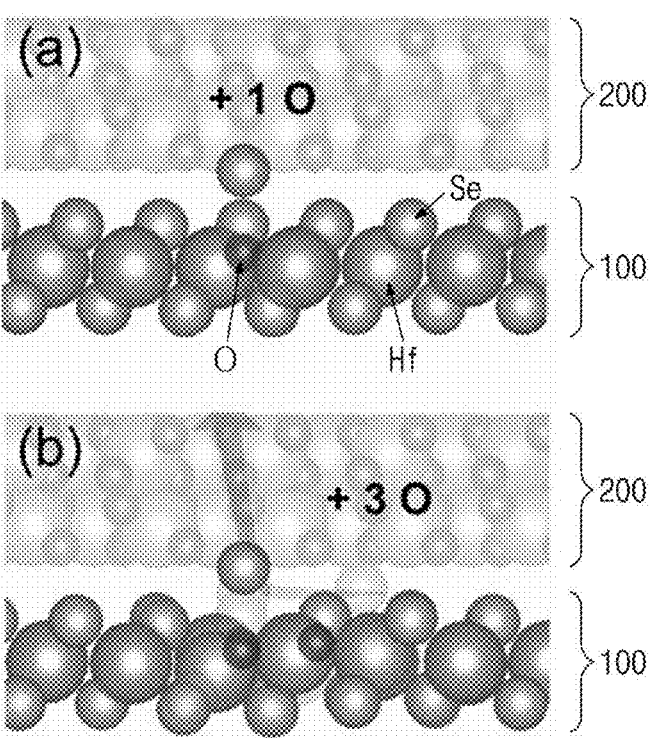

【Fig. 8】
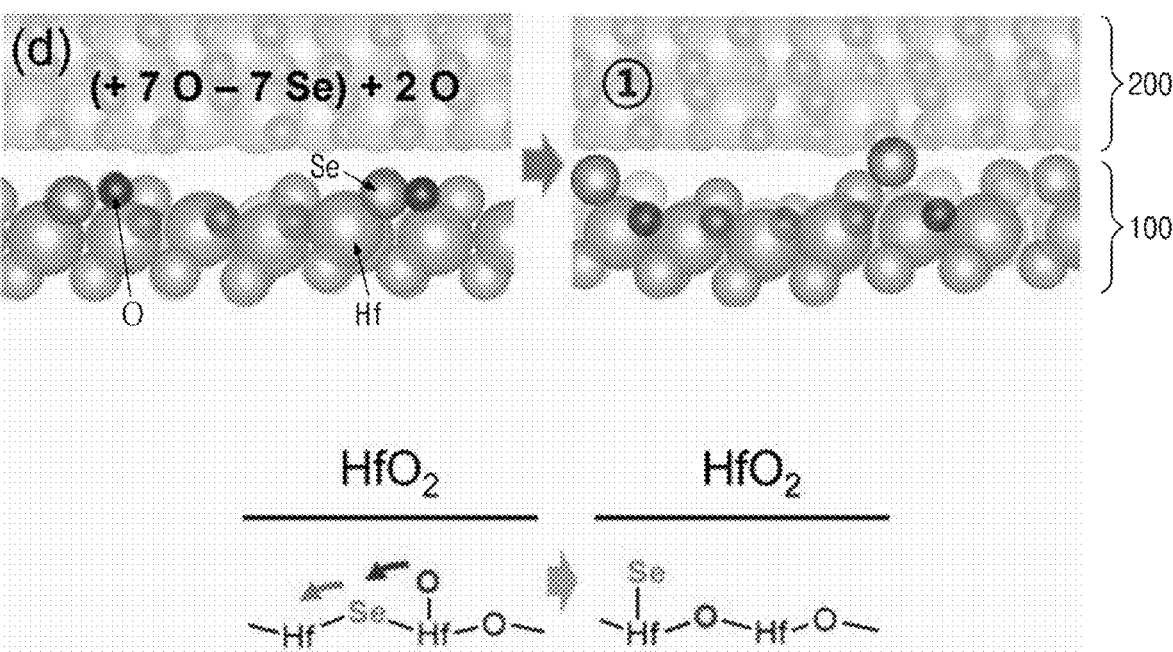

【Fig. 9】
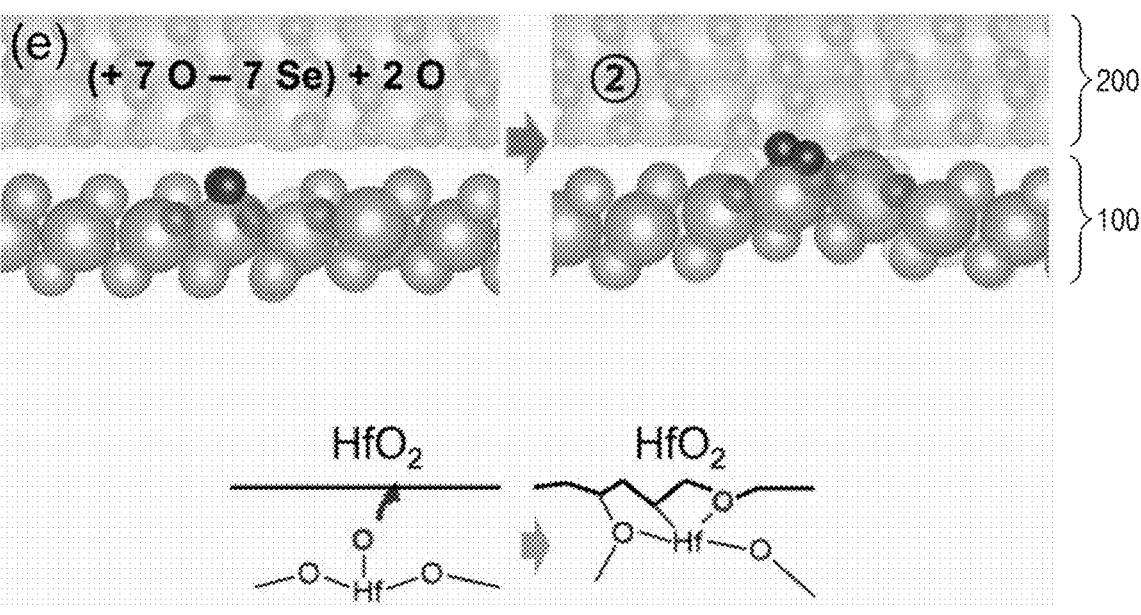

【Fig. 10】
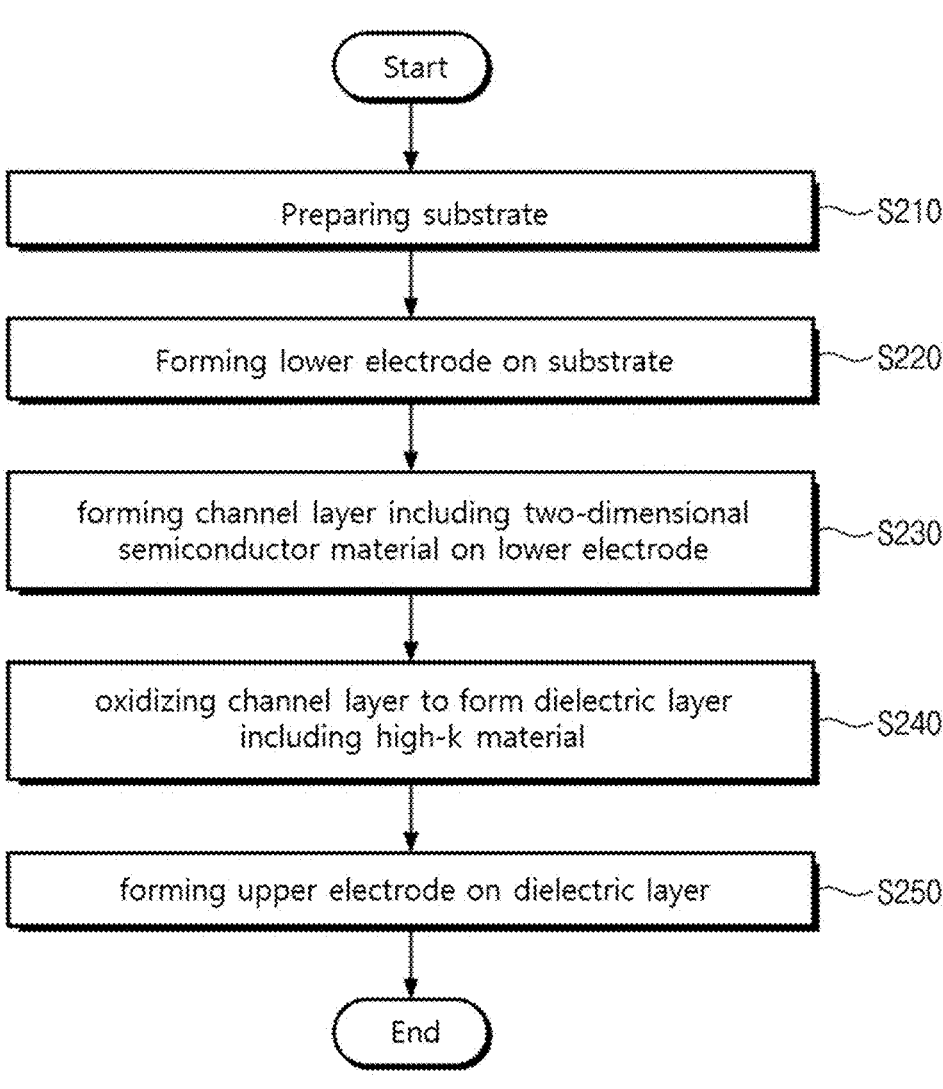

【Fig. 11】
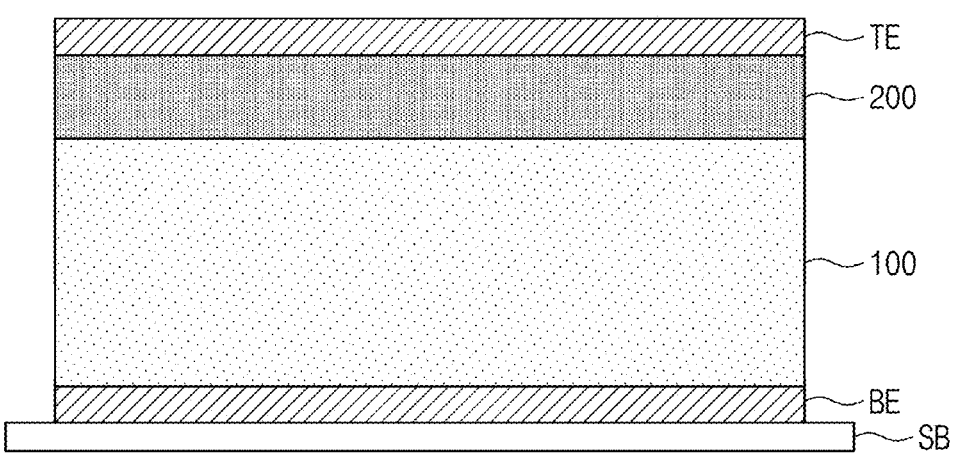

【Fig. 12】
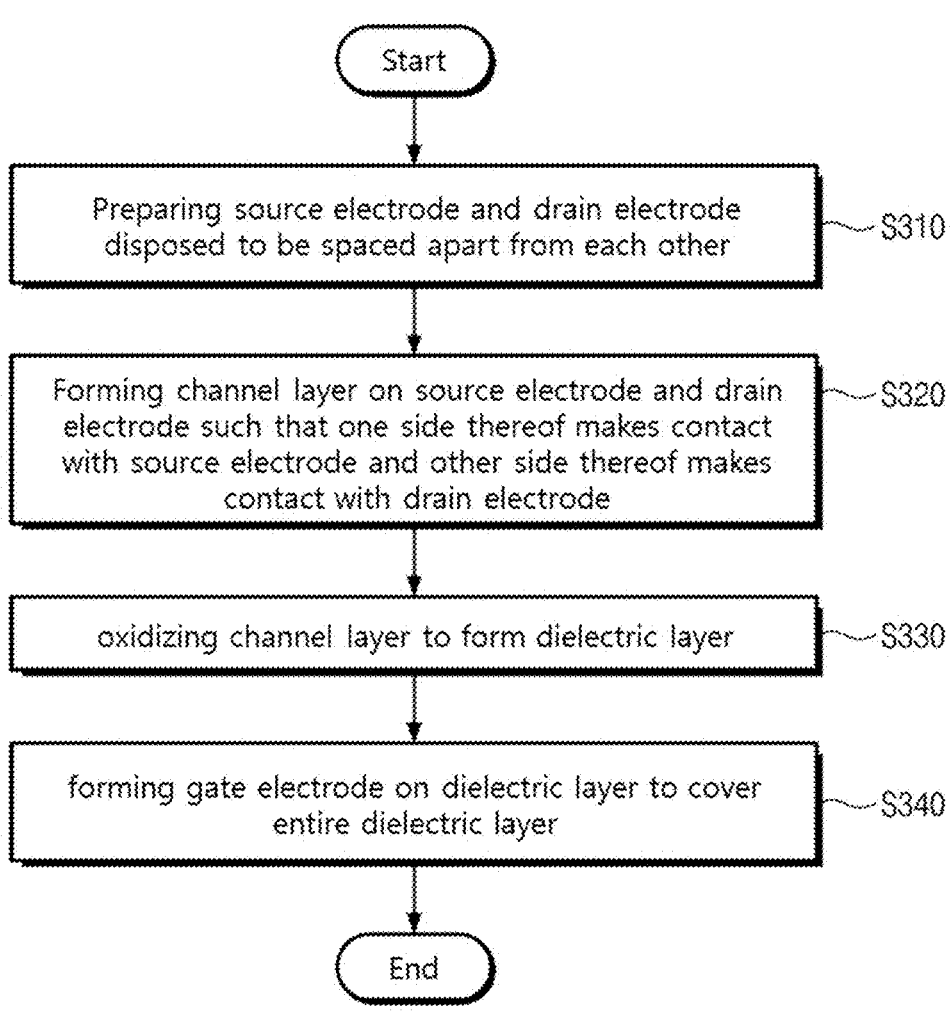

【Fig. 13】
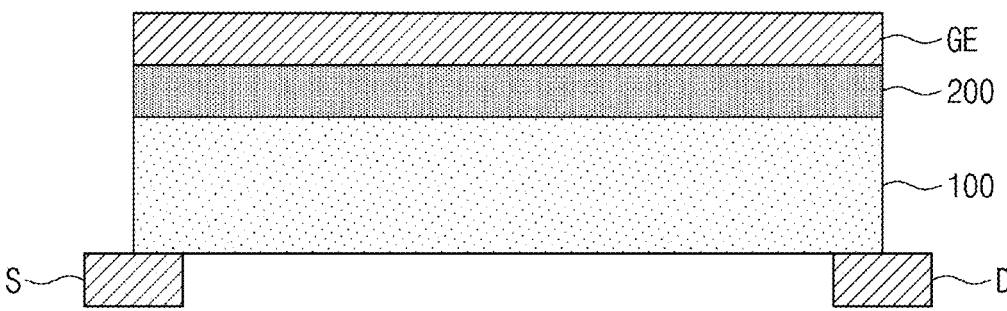

【Fig. 14】
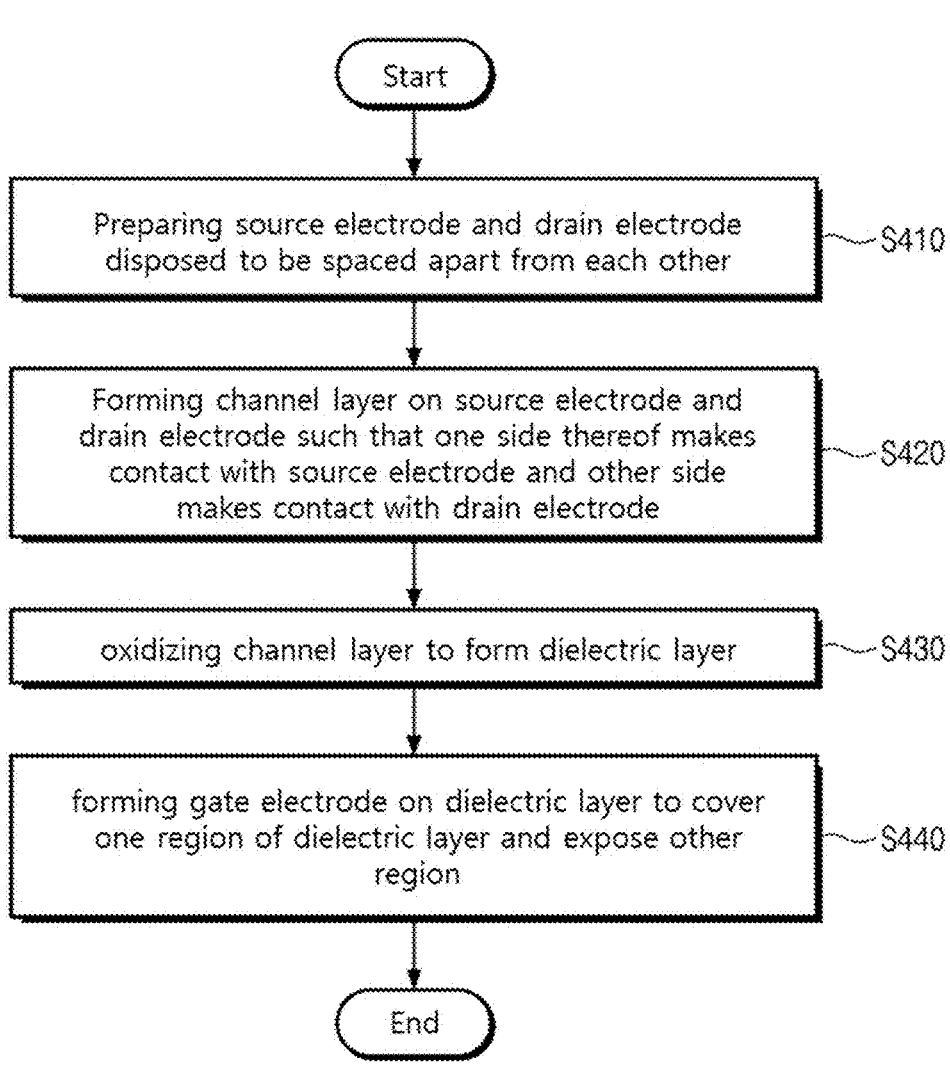

【Fig. 15】
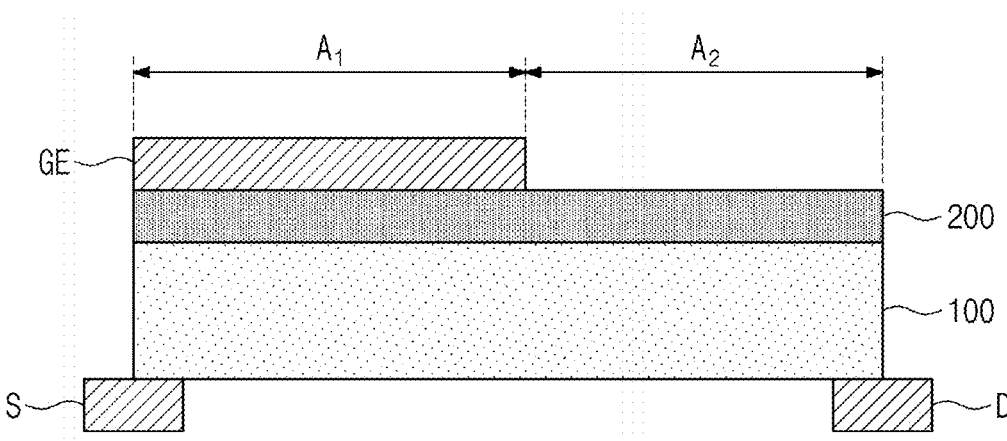

【Fig. 16】
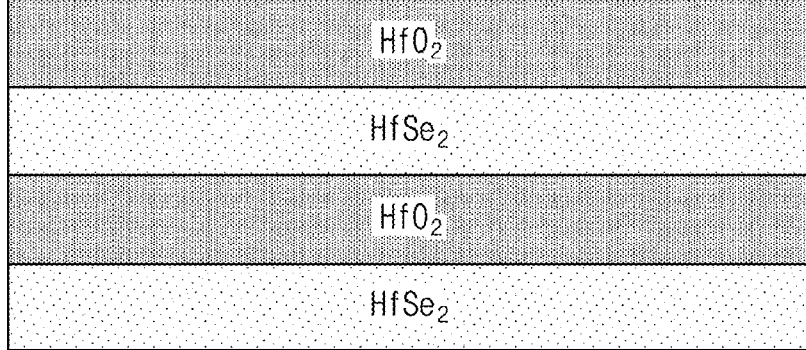

【Fig. 17】
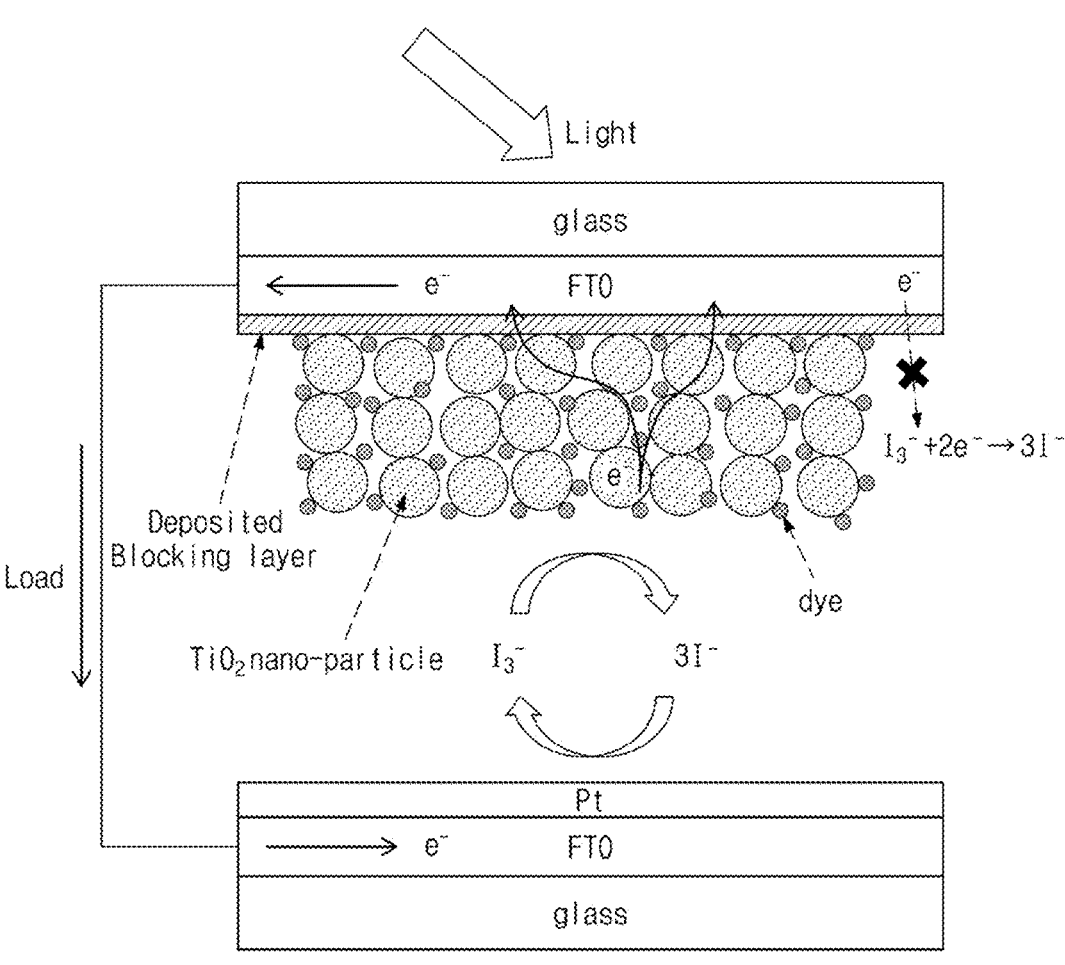

【Fig. 18】
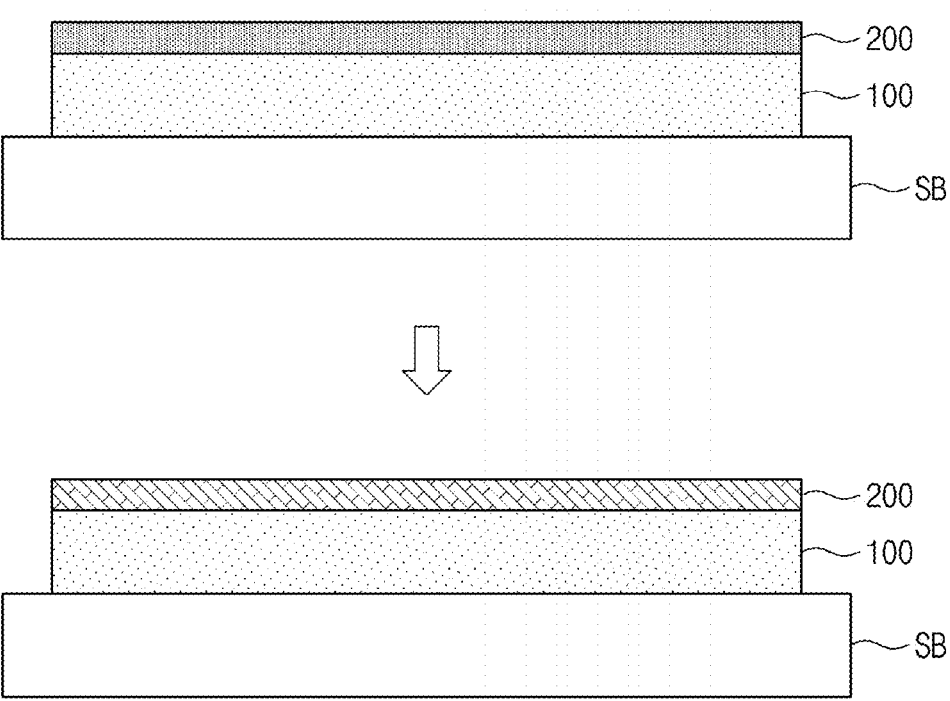

【Fig. 19】
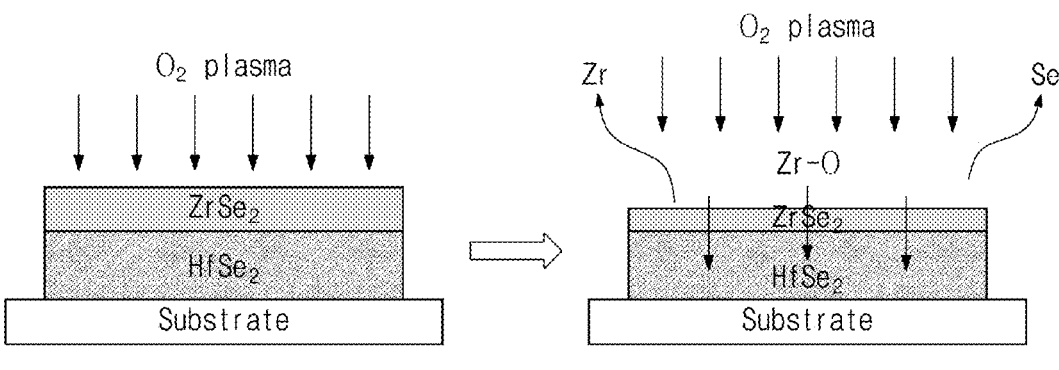
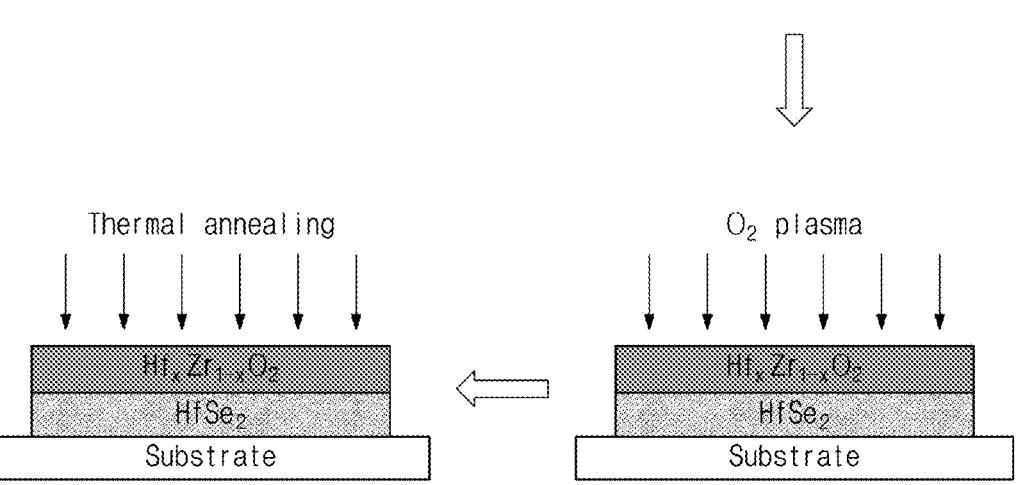

【Fig. 20】
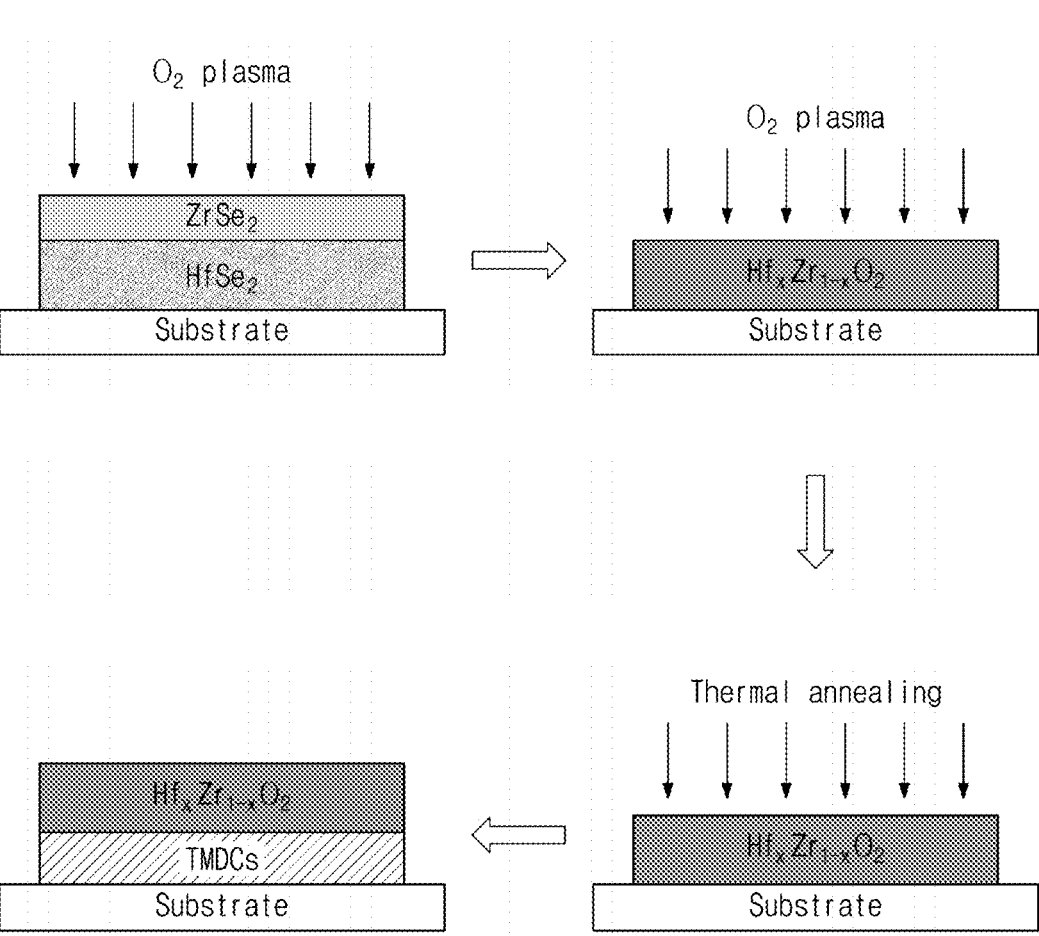

【Fig. 21】
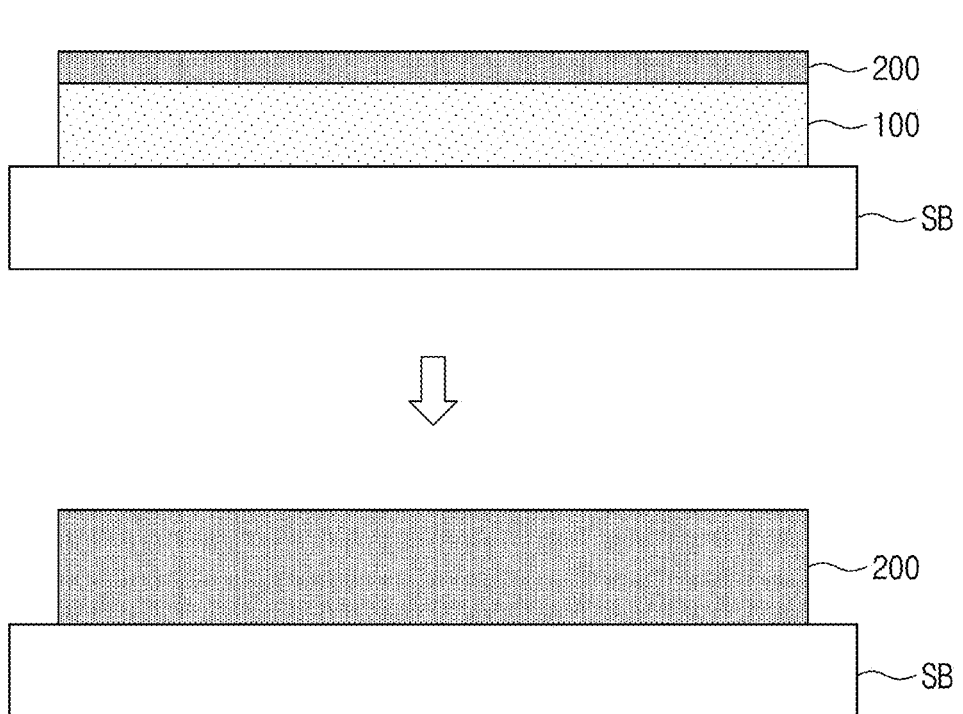

【Fig. 22】
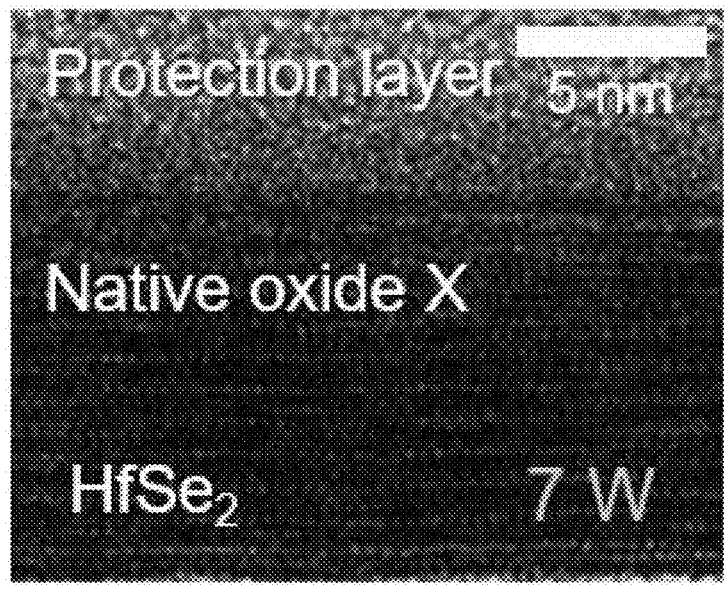
【Fig. 23】
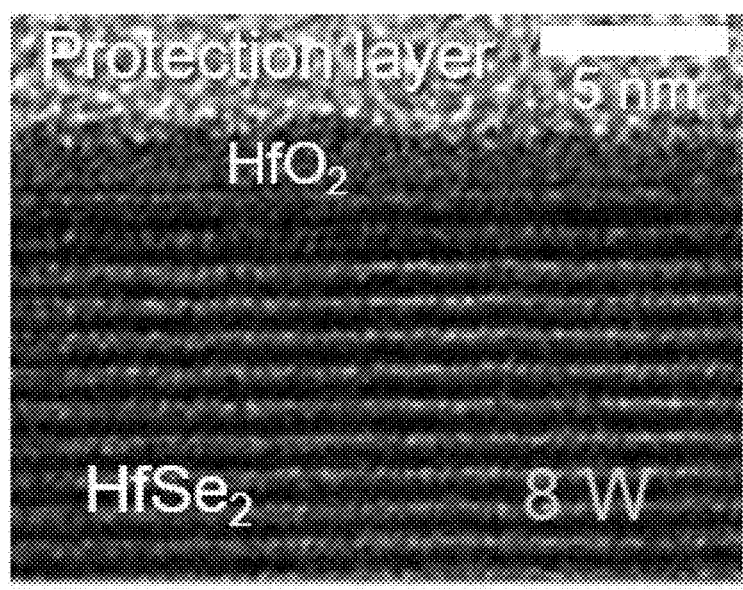

【Fig. 24】
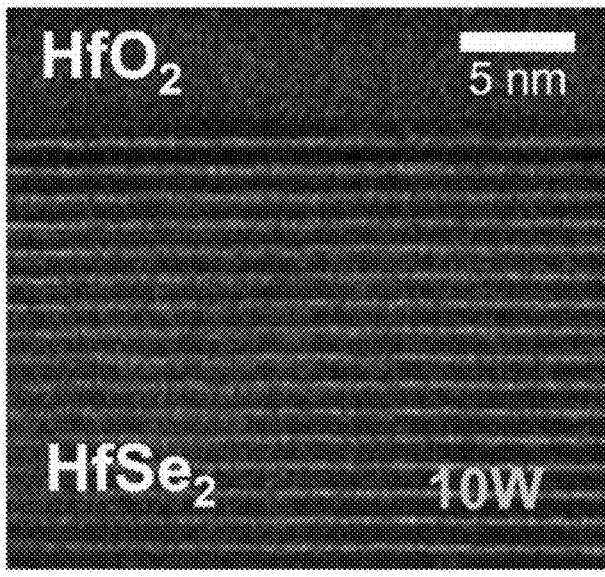
【Fig. 25】
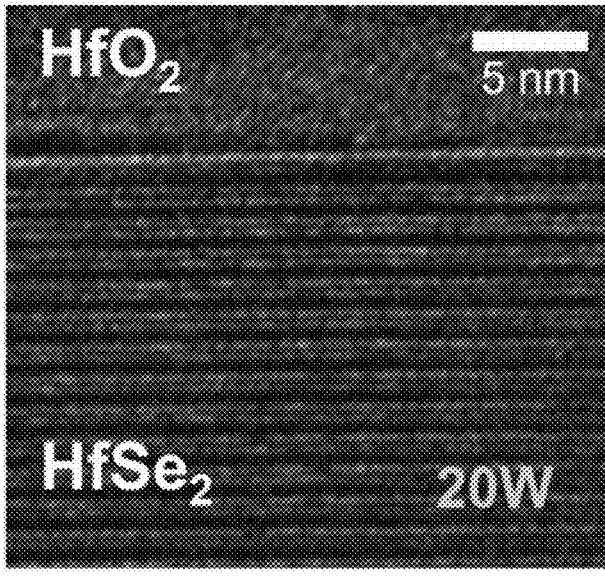

【Fig. 26】
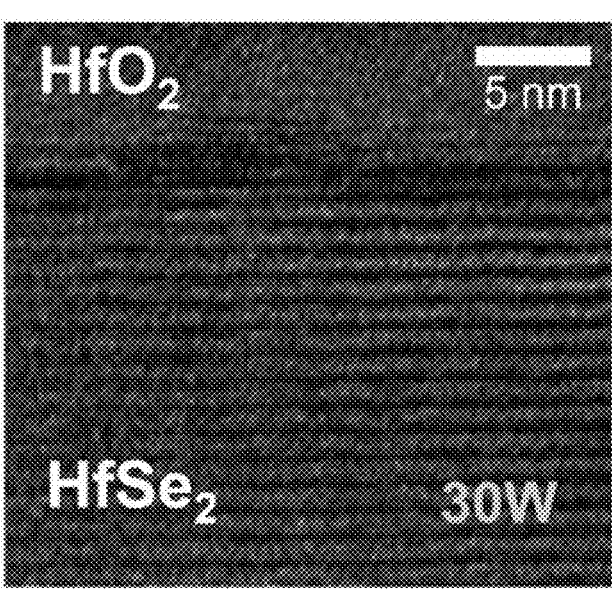

【Fig. 27】
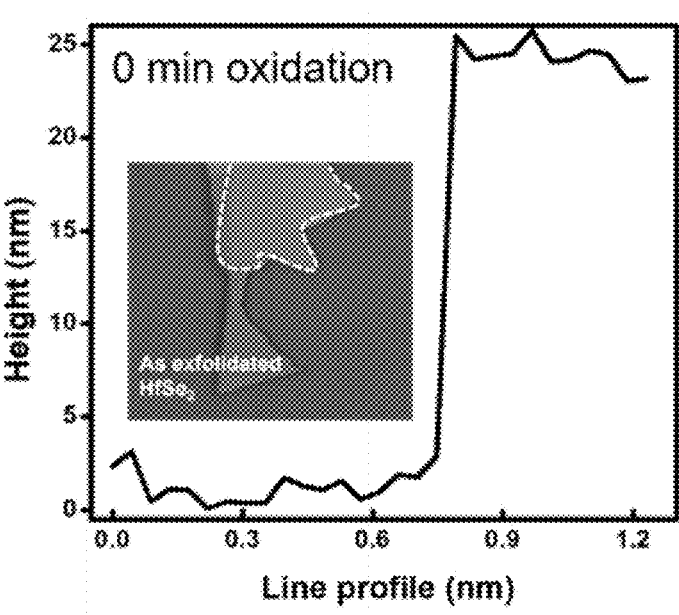

【Fig. 28】
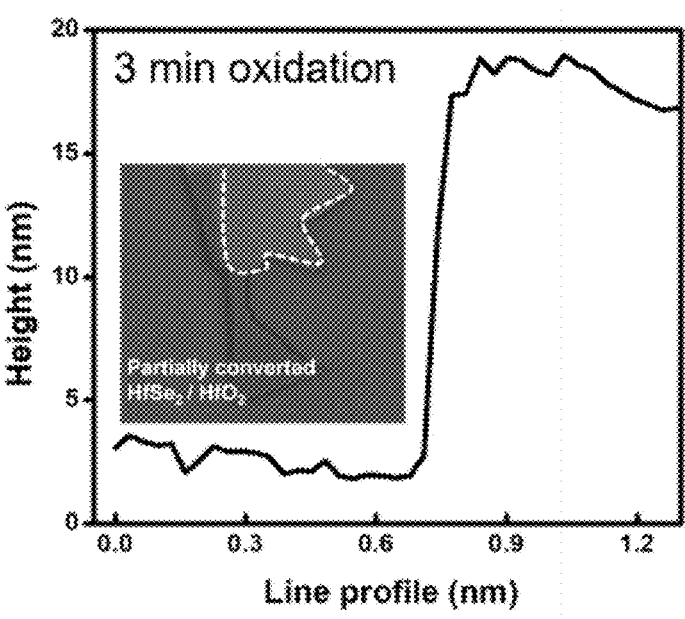

【Fig. 29】
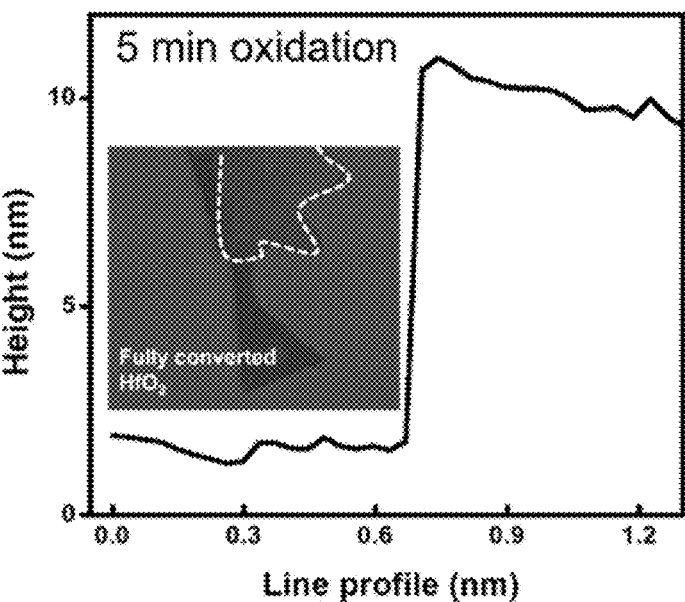

【Fig. 30】
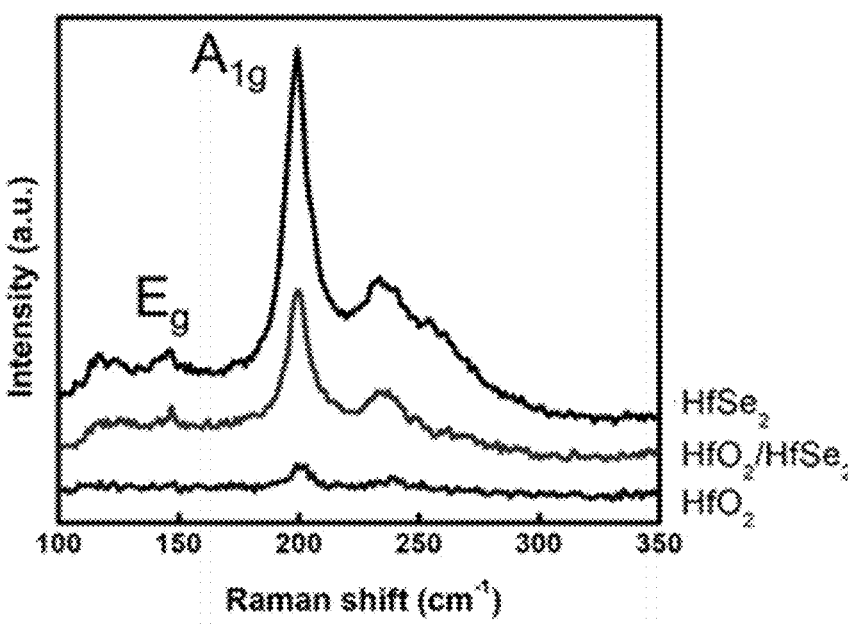

【Fig. 31】
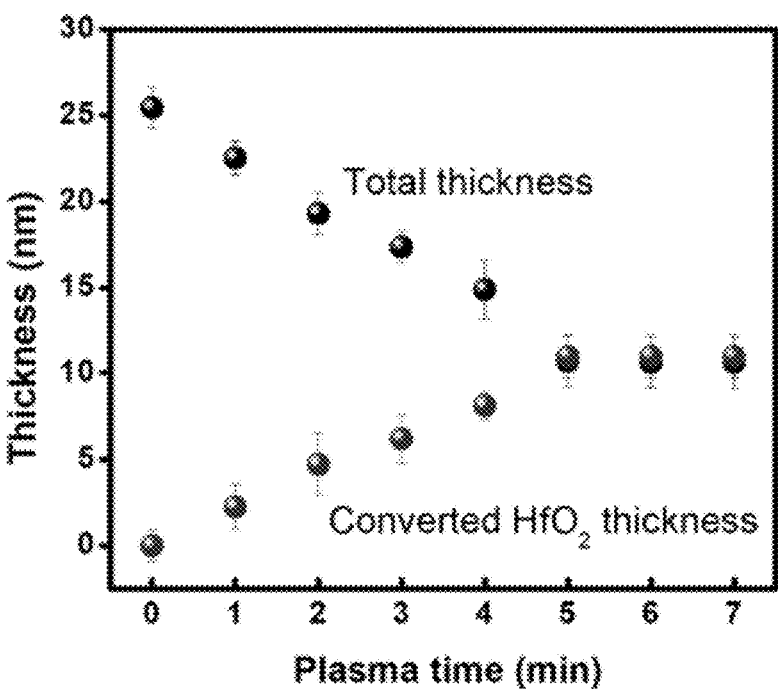

【Fig. 32】
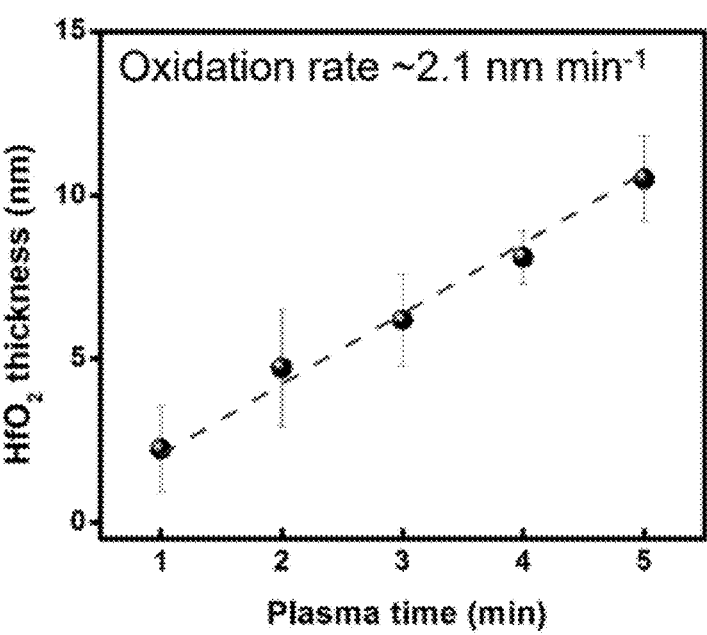

【Fig. 33】
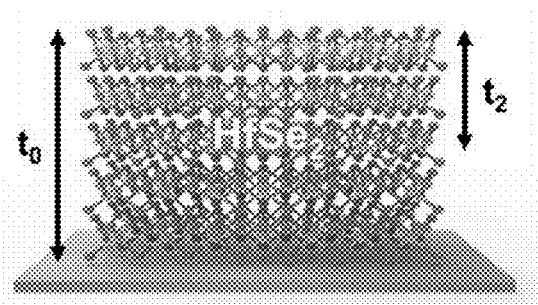 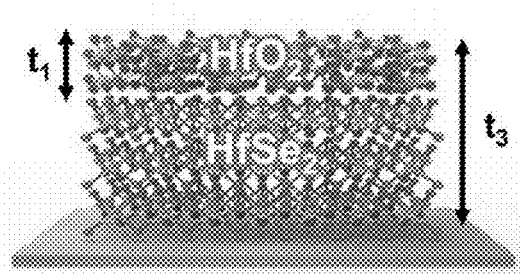

【Fig. 34】
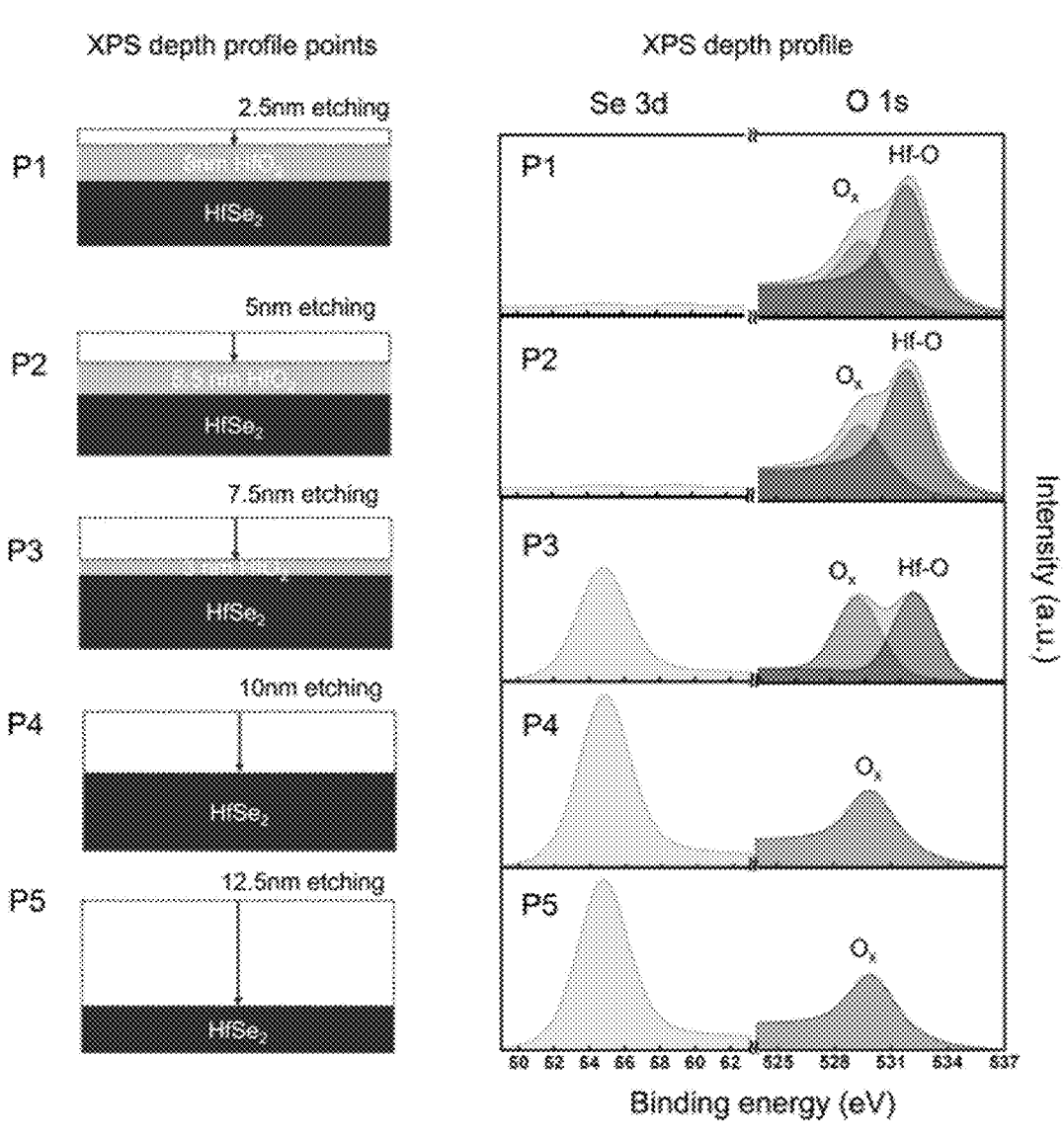

【Fig. 35】
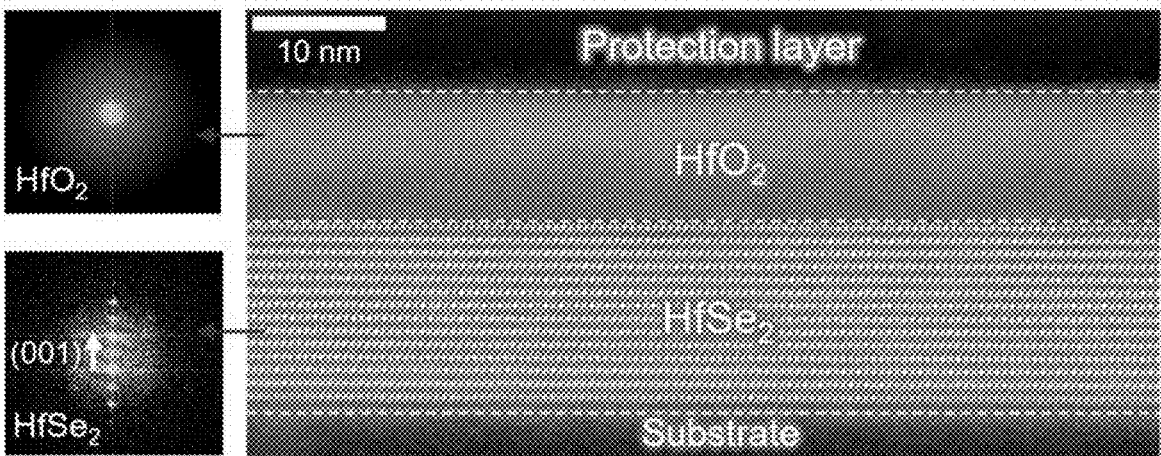

【Fig. 36】
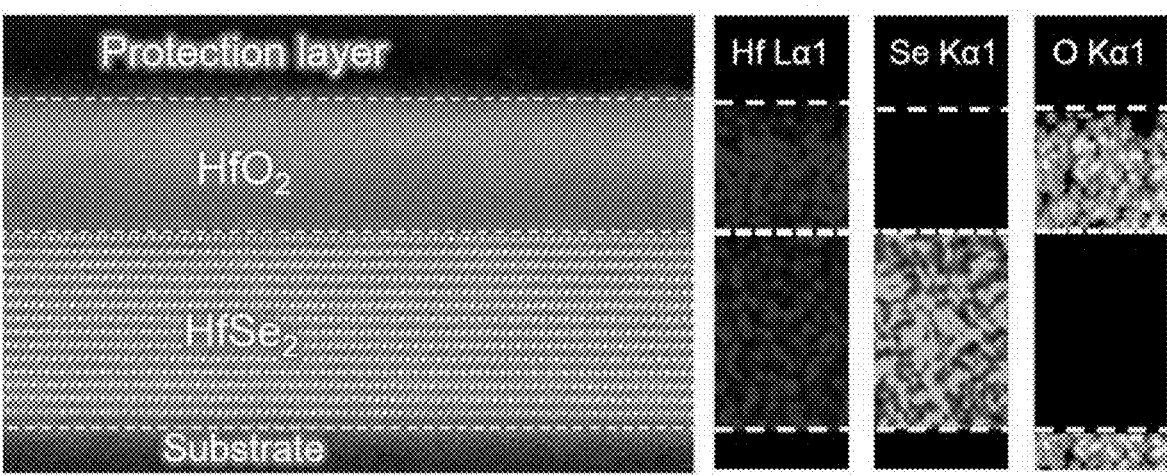

【Fig. 37】
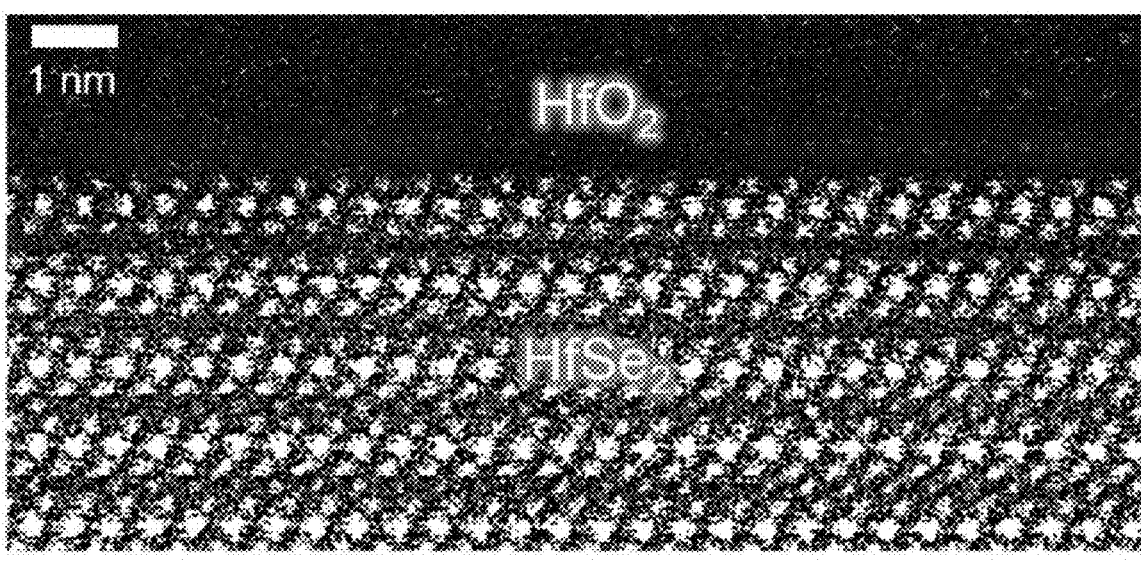

【Fig. 38】
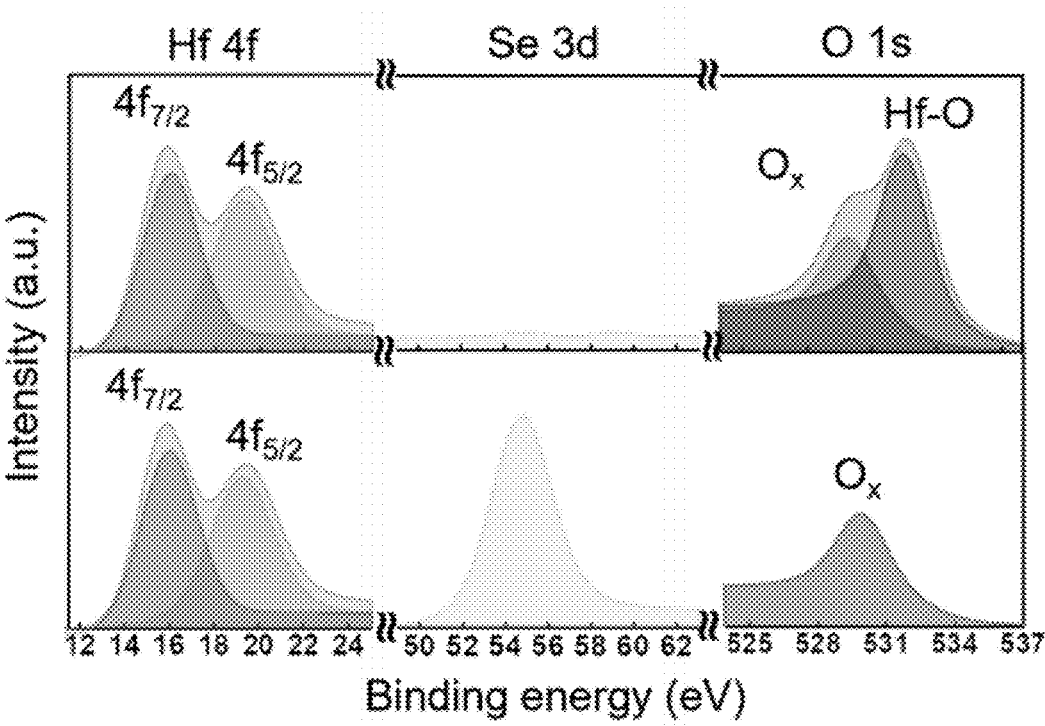

【Fig. 39】
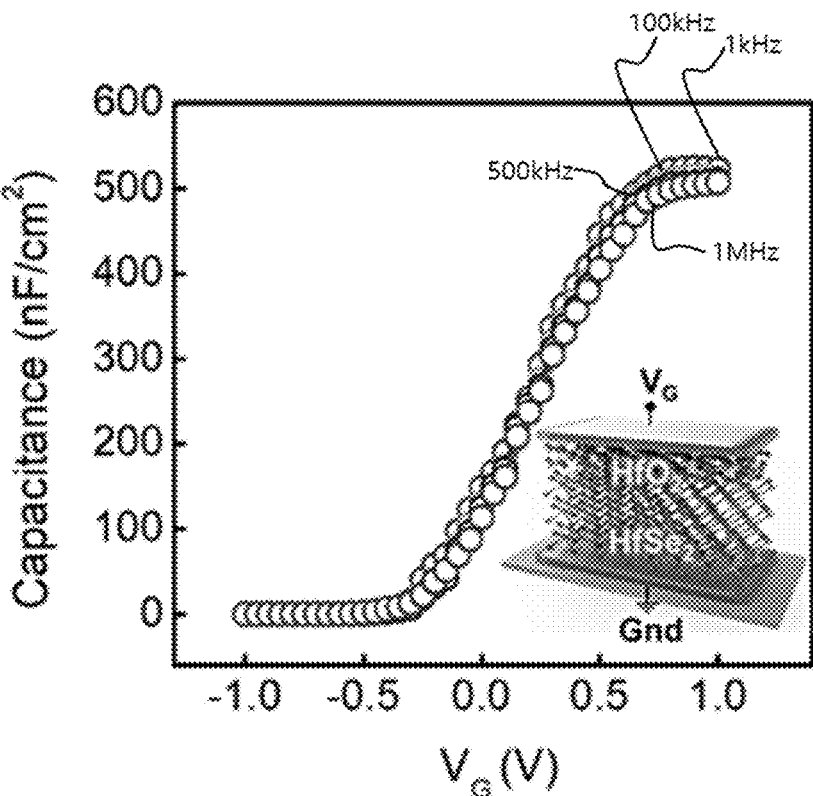

【Fig. 40】
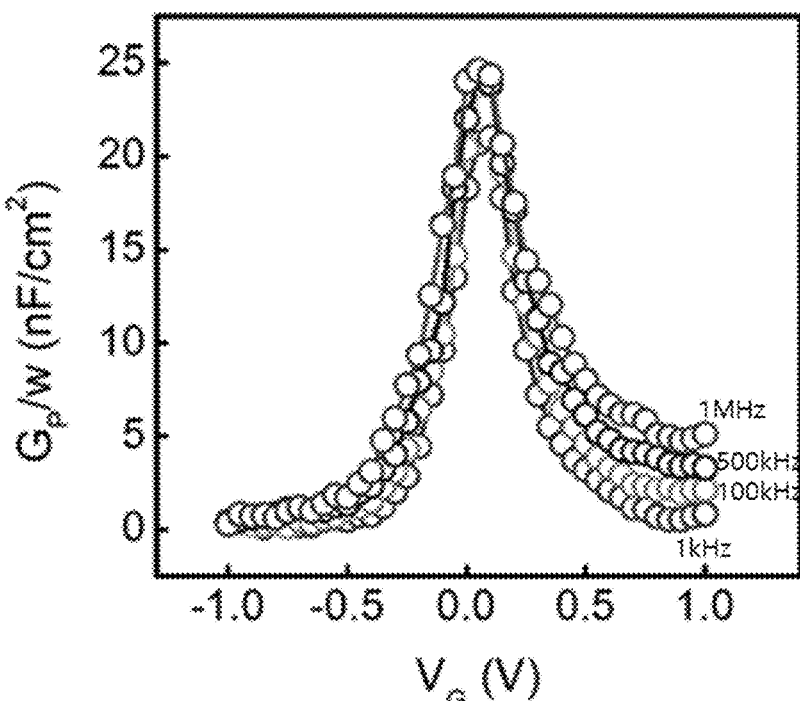

【Fig. 41】
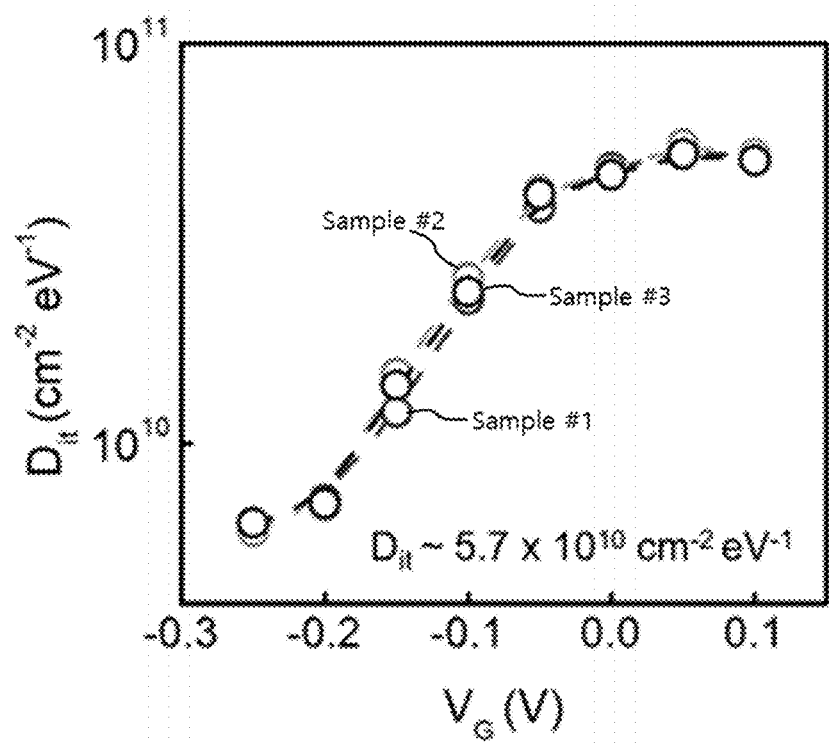

【Fig. 42】
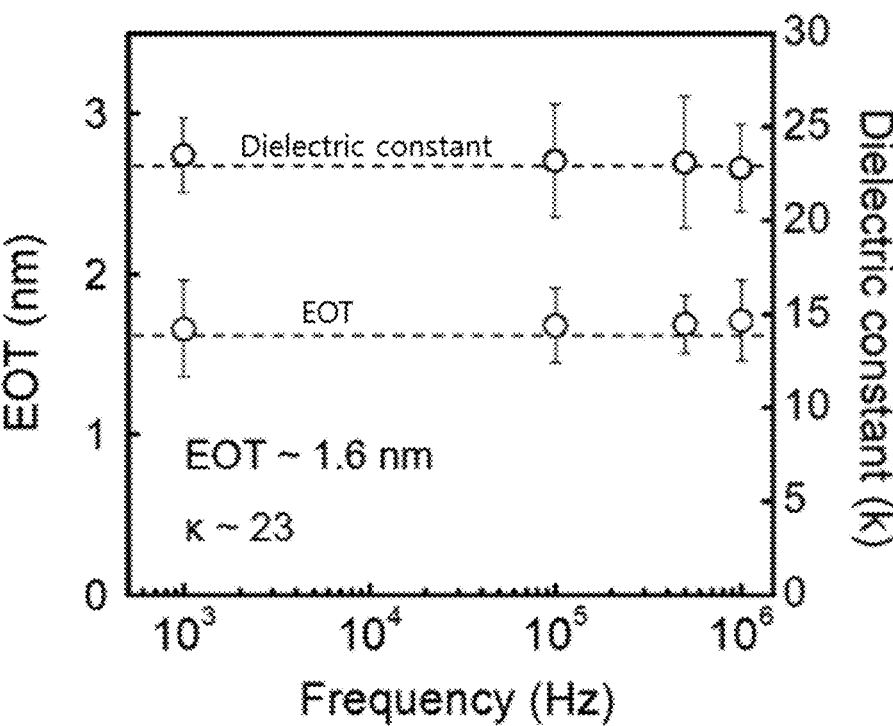

【Fig. 43】
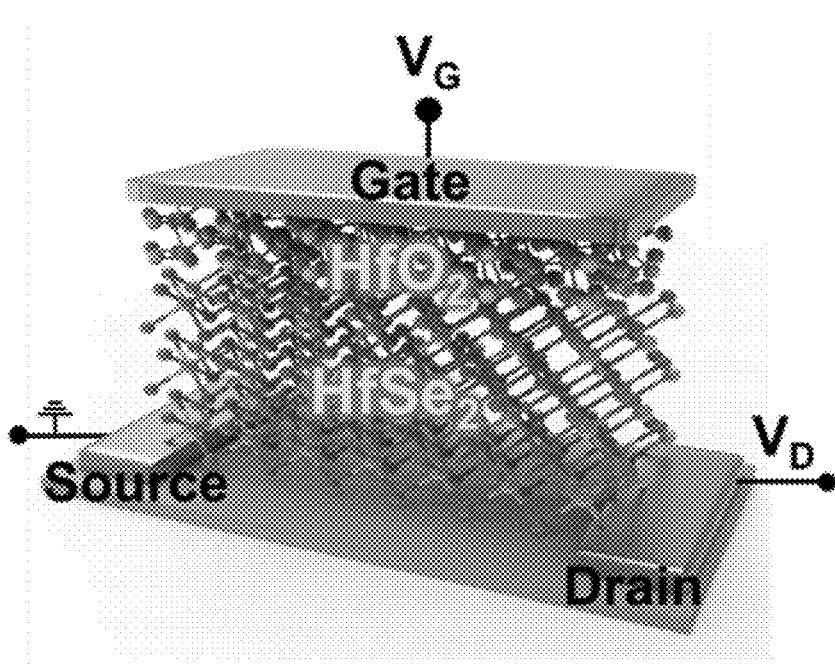

【Fig. 44】
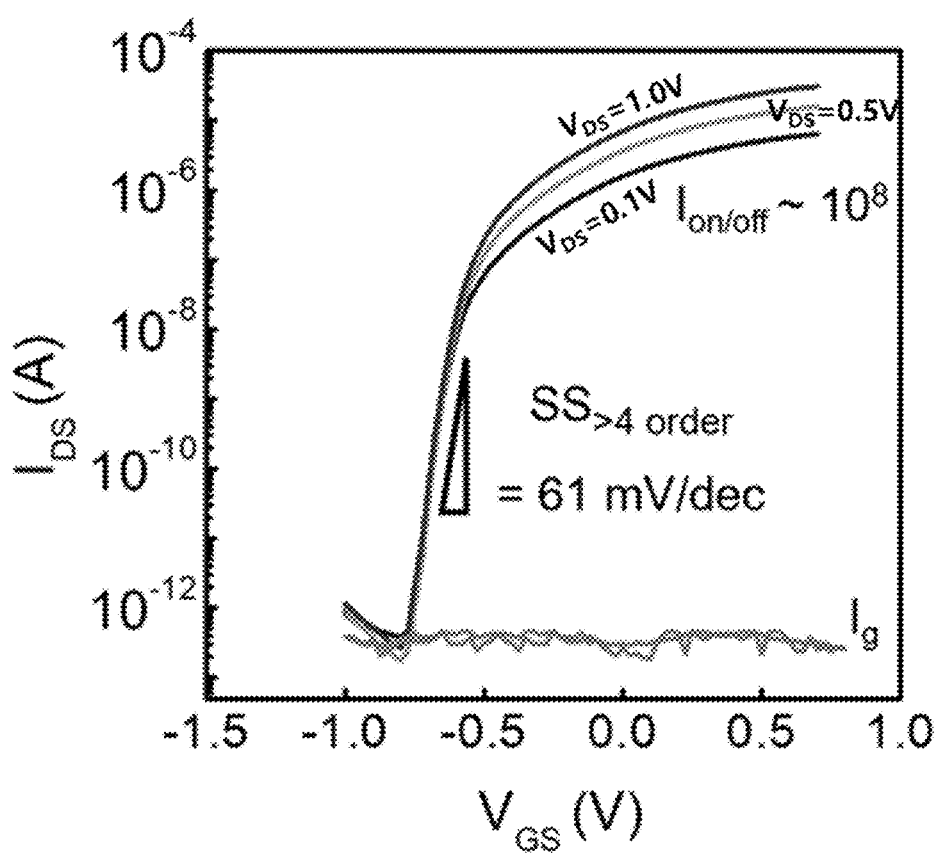

【Fig. 45】
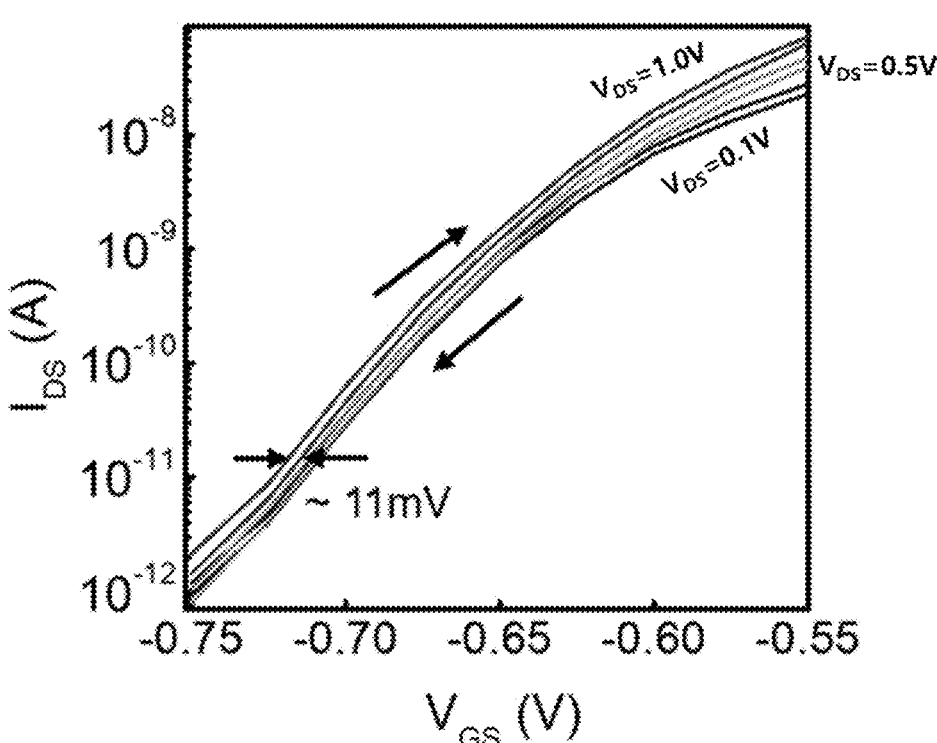

【Fig. 46】
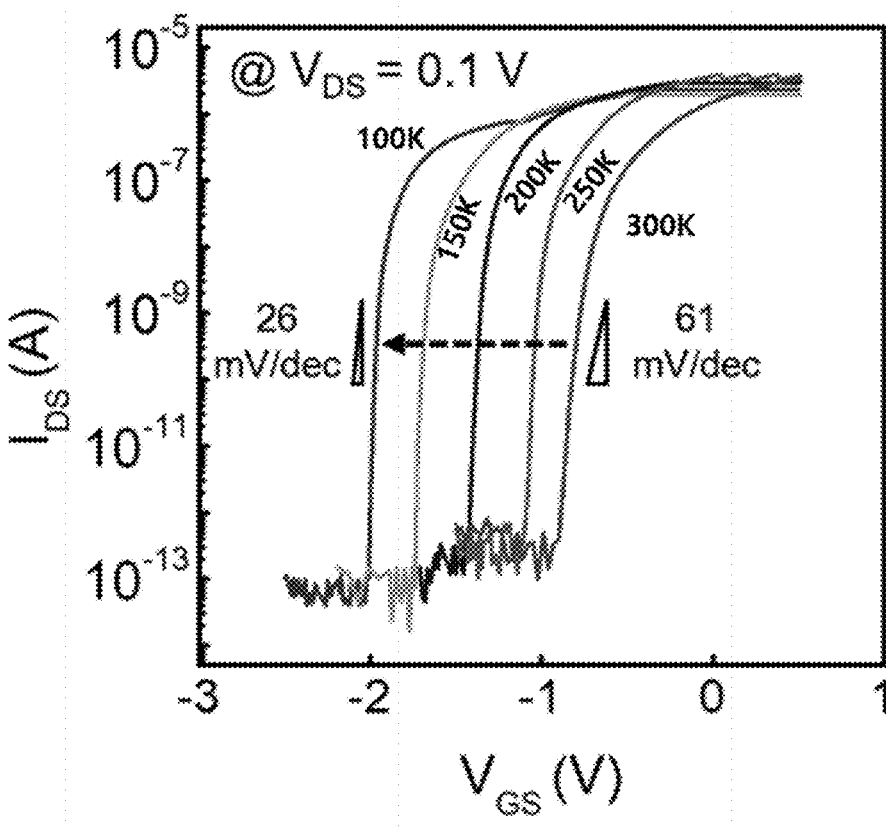

【Fig. 47】
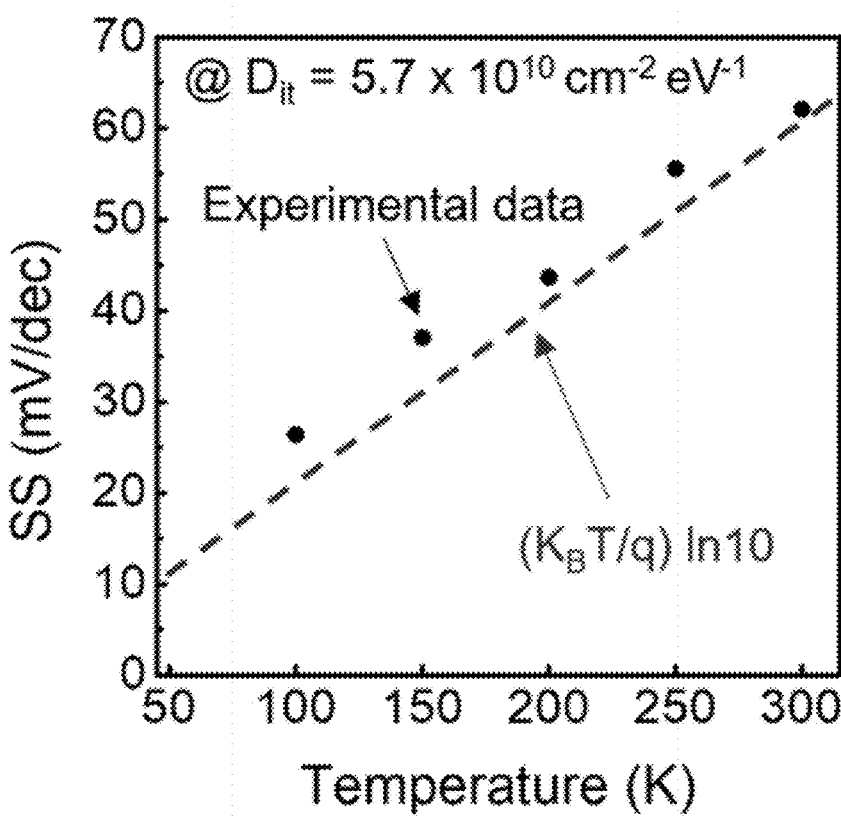

【Fig. 48】
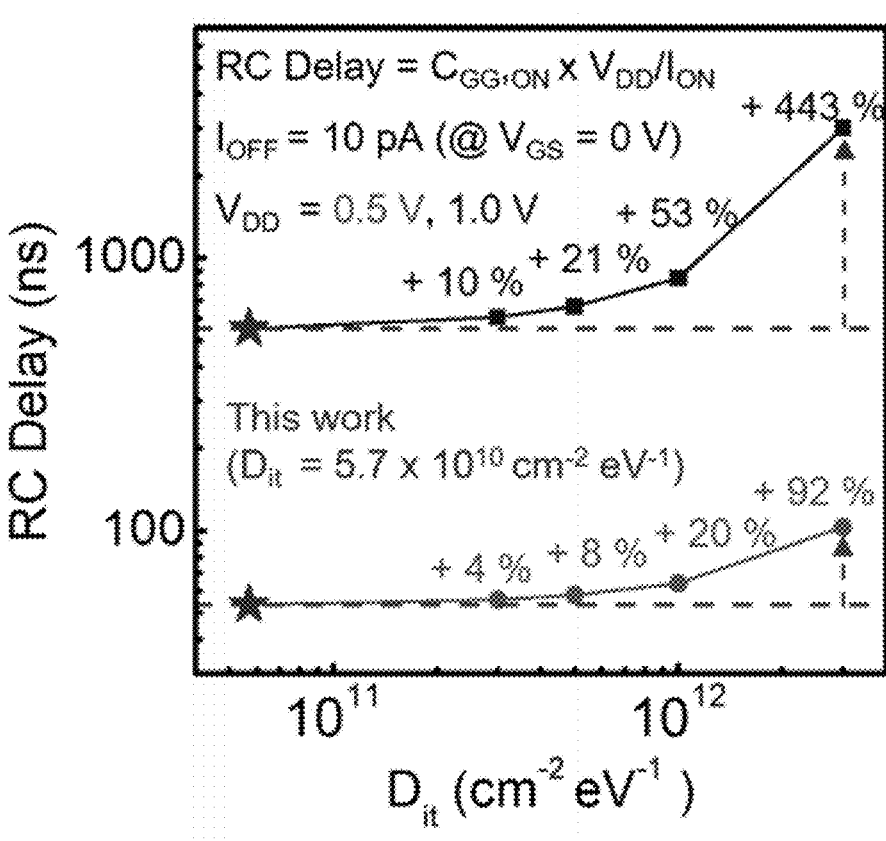

【Fig. 49】
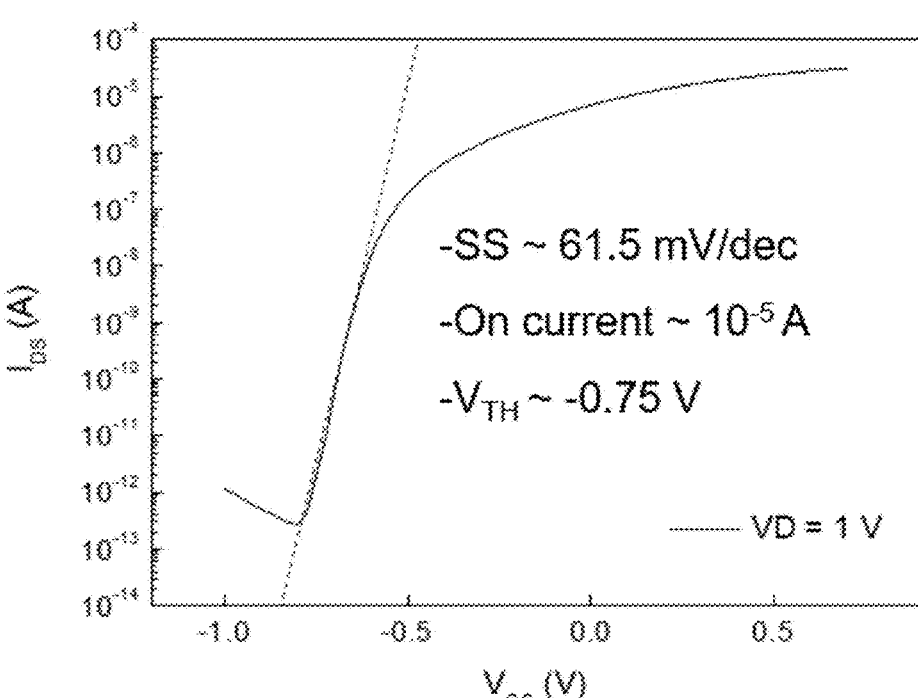

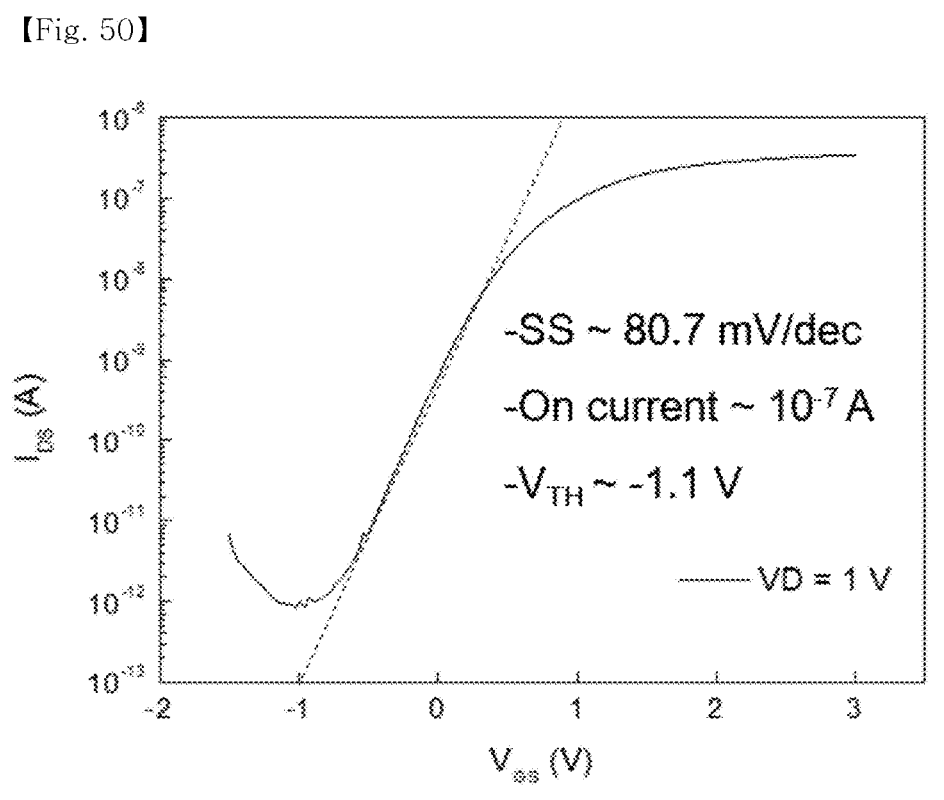

【Fig. 50】

【Fig. 51】
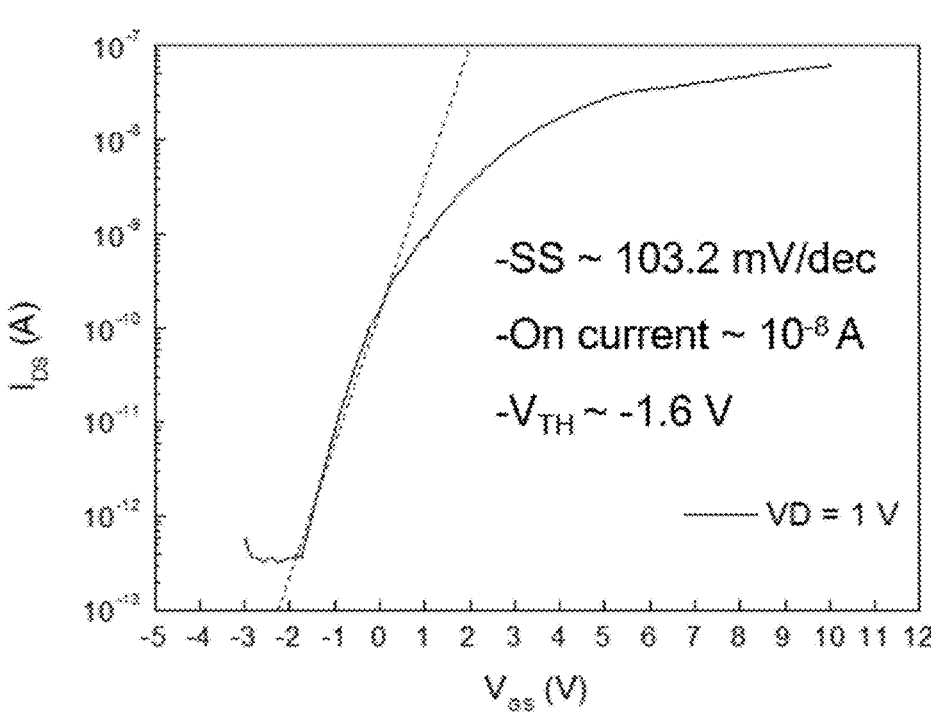

【Fig. 52】
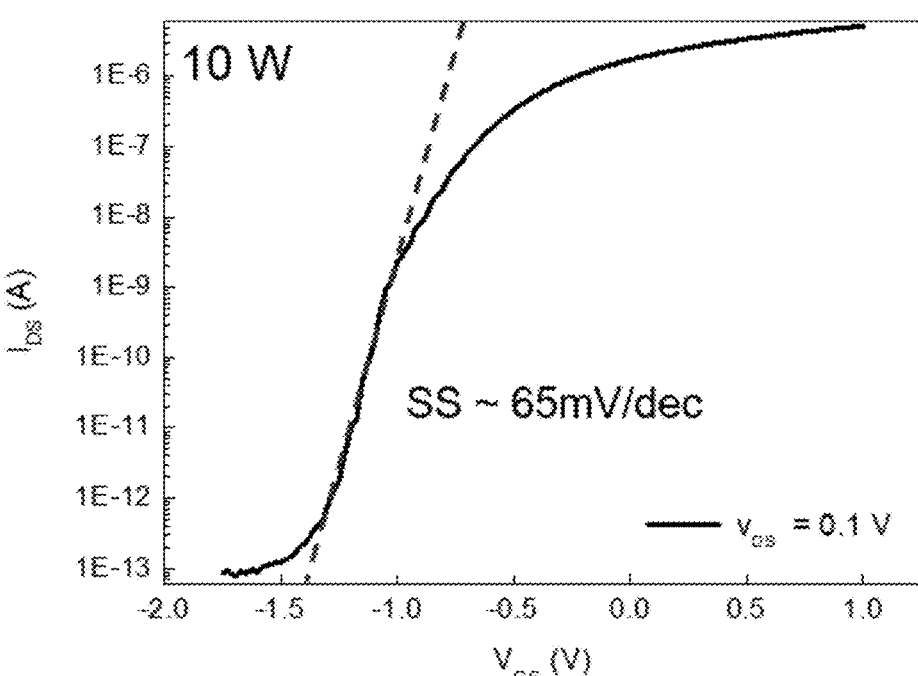

【Fig. 53】
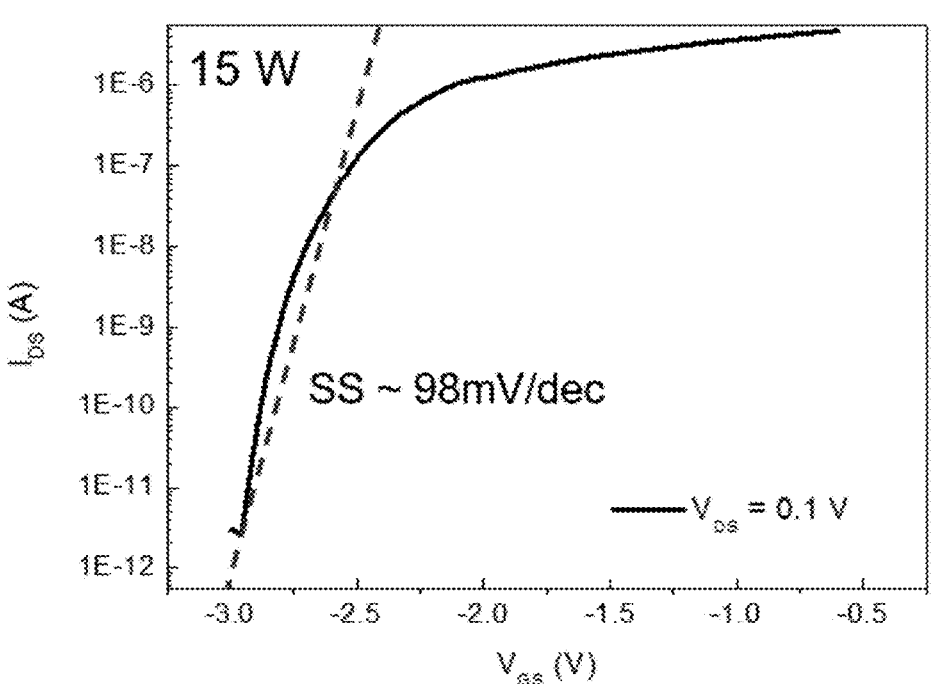

【Fig. 54】
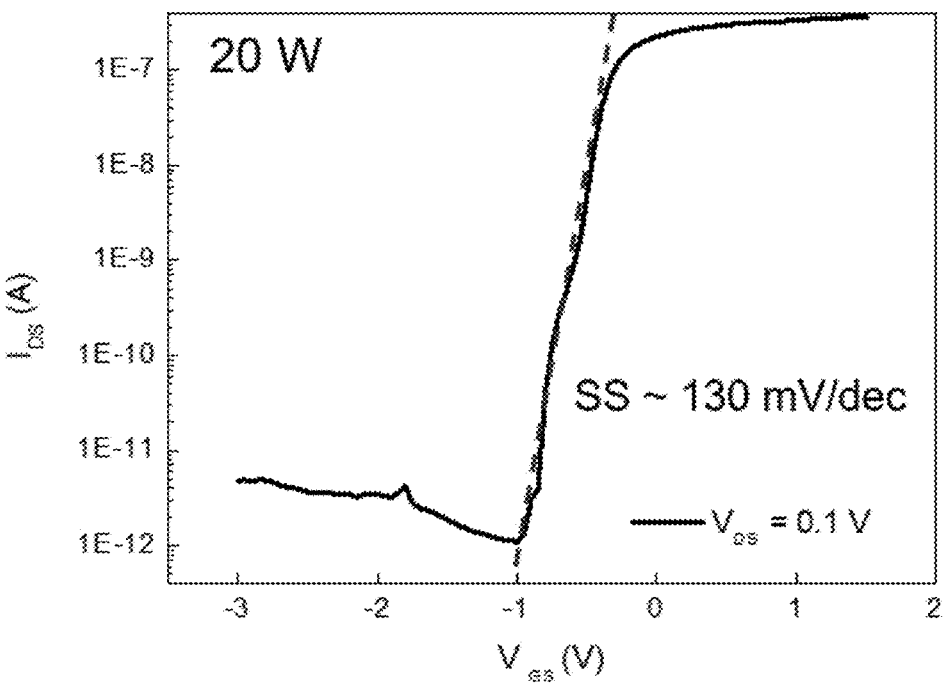

【Fig. 55】
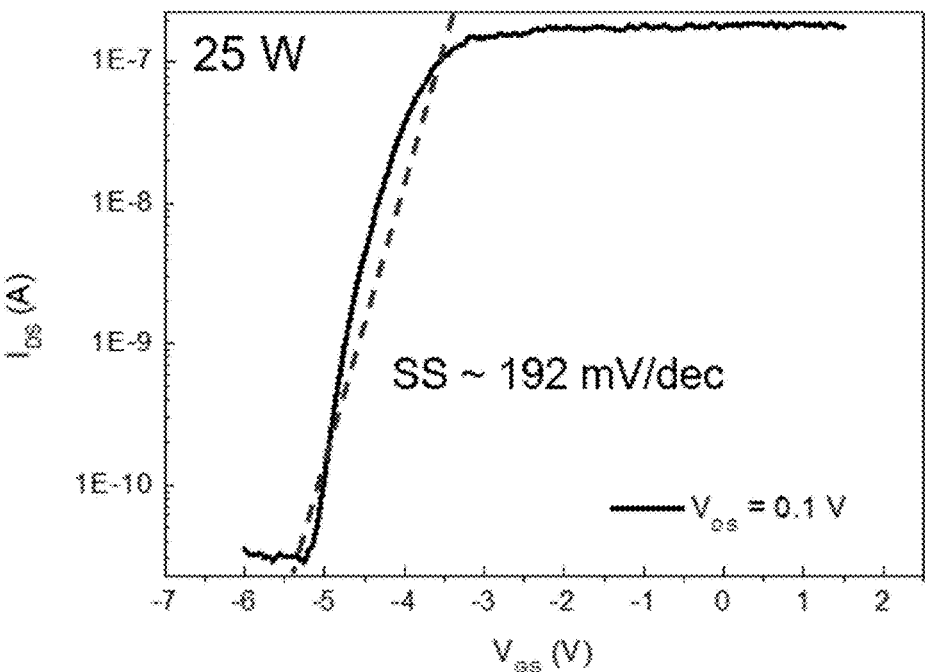

【Fig. 56】
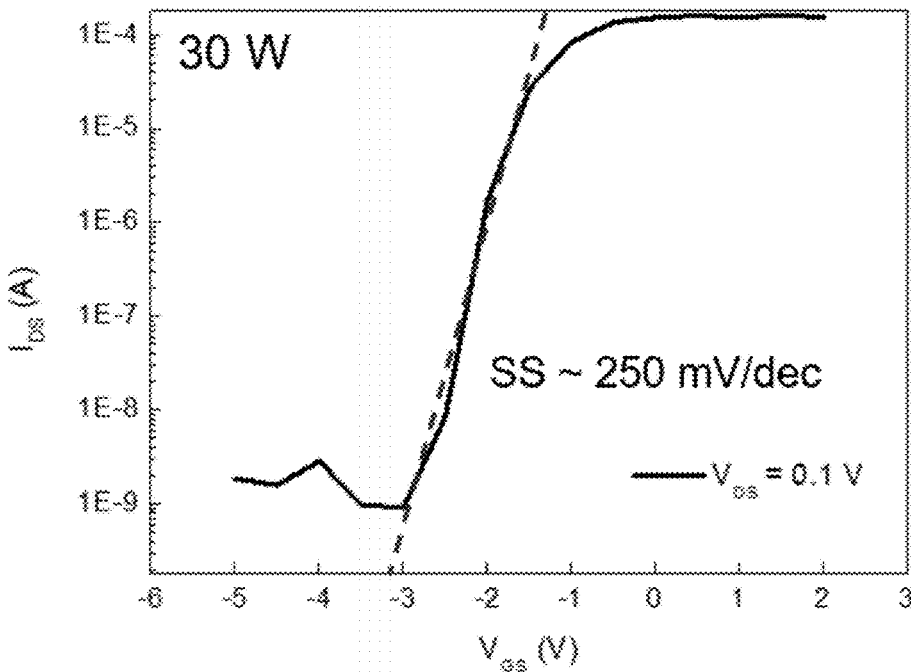

【Fig. 57】
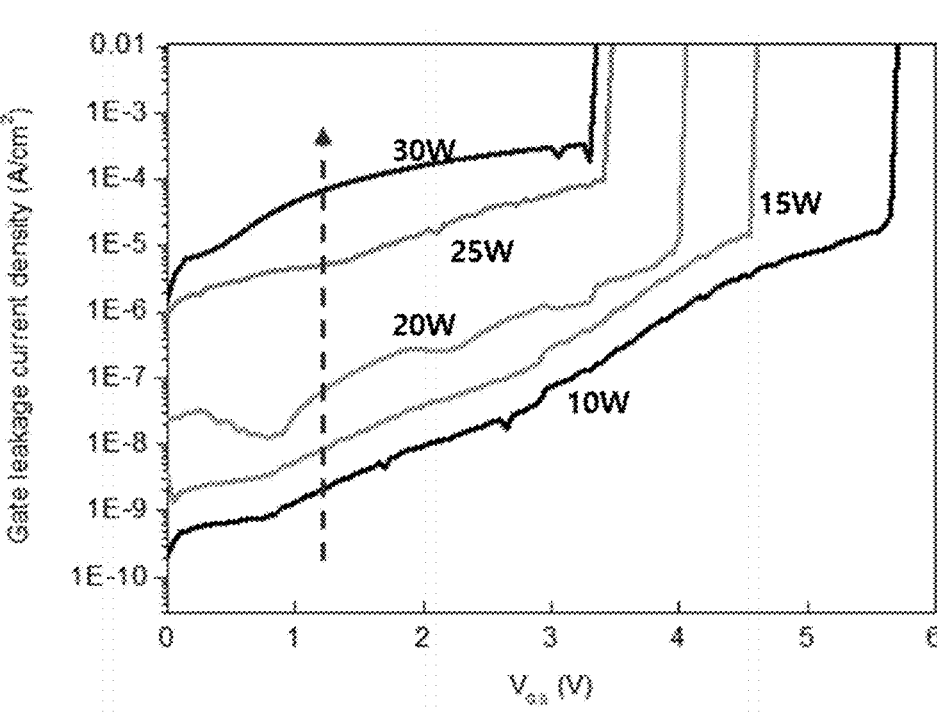

【Fig. 58】
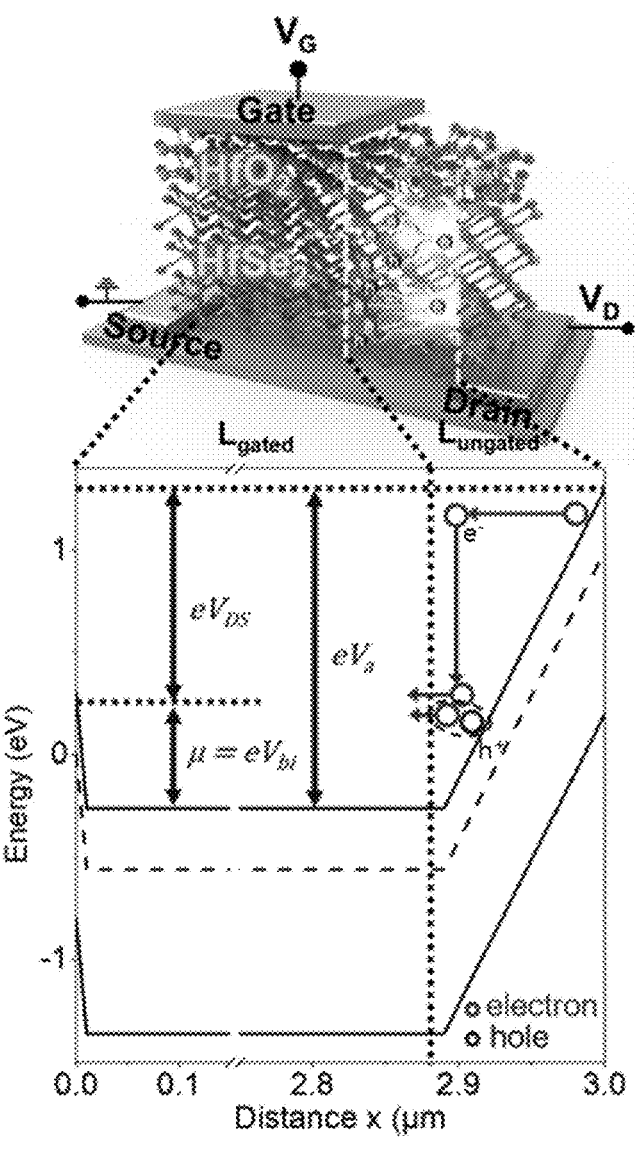

【Fig. 59】
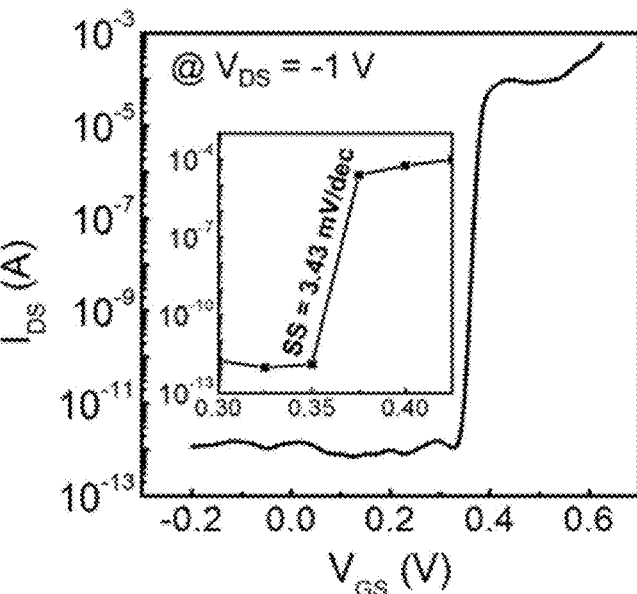

【Fig. 60】
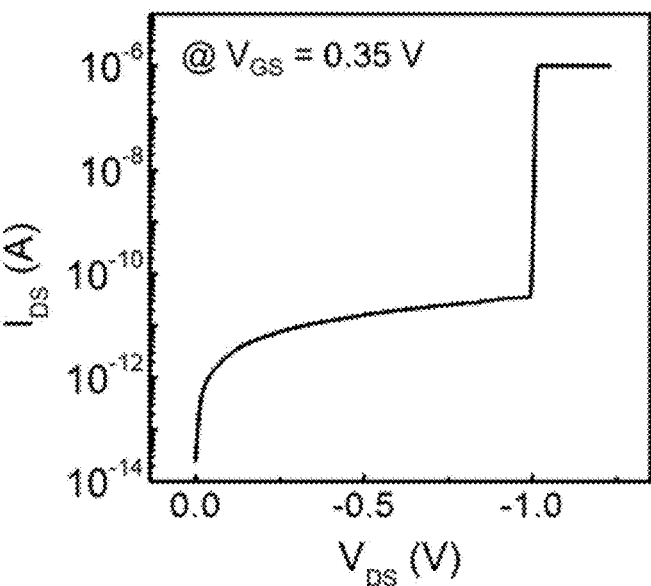

【Fig. 61】
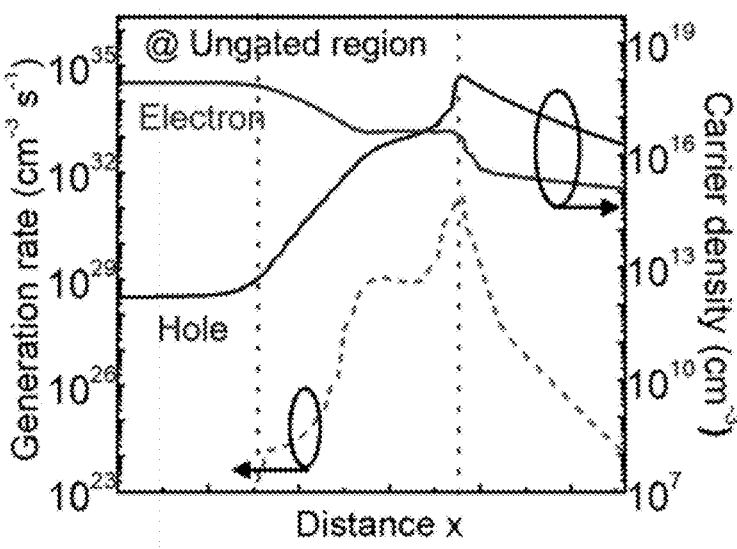
【Fig. 62】
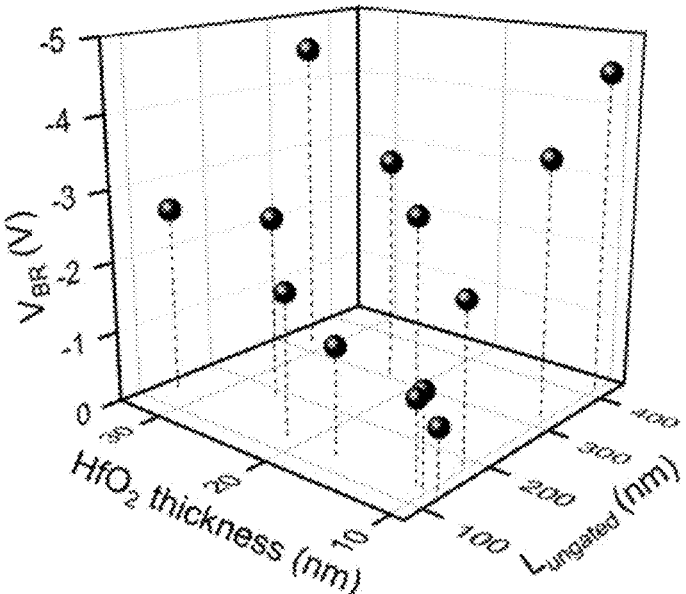

【Fig. 63】
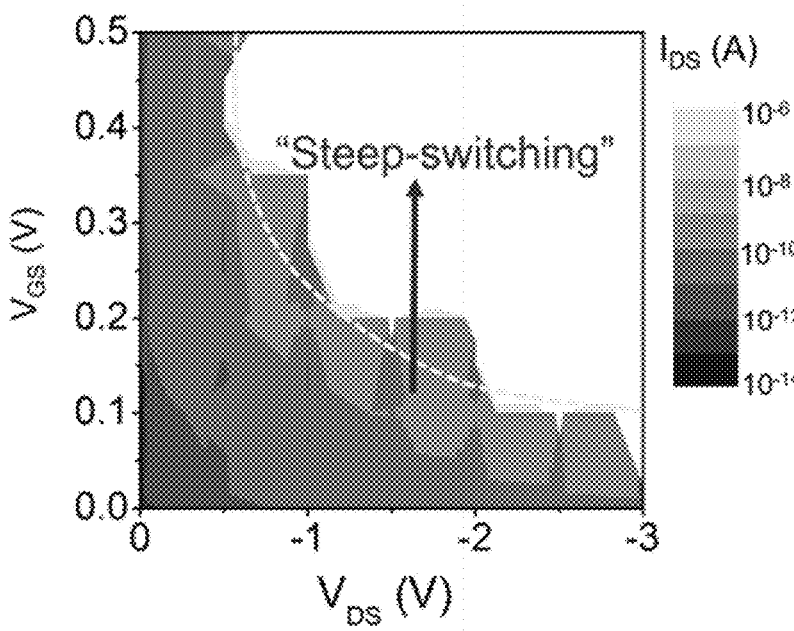
【Fig. 64】
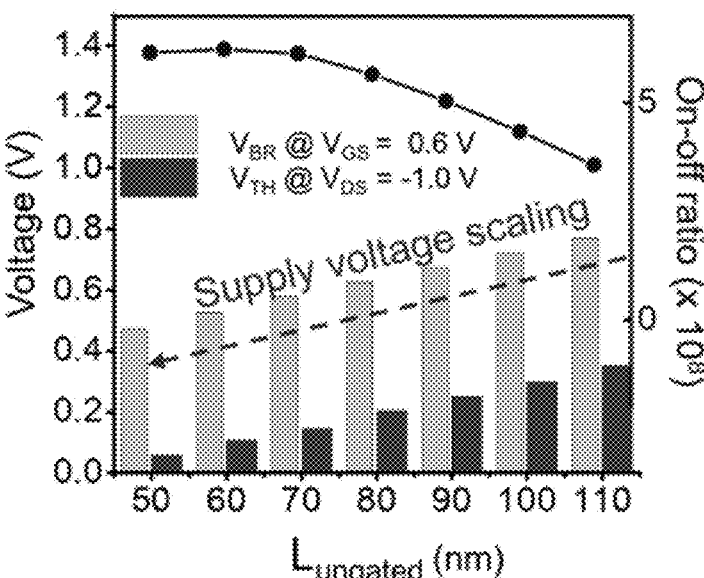

【Fig. 65】
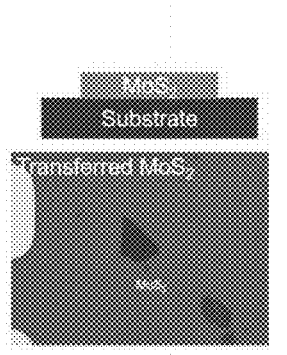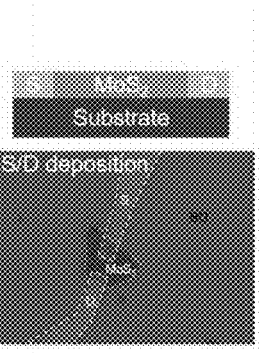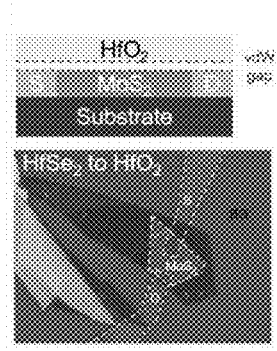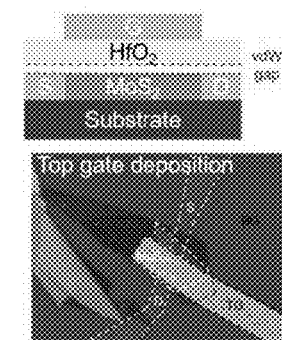

【Fig. 66】
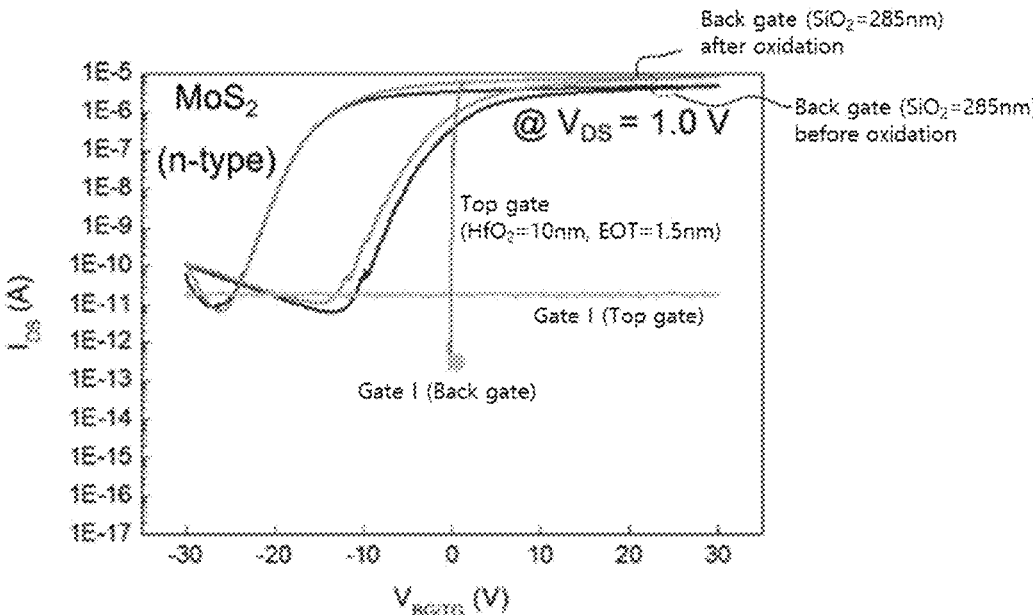

【Fig. 67】
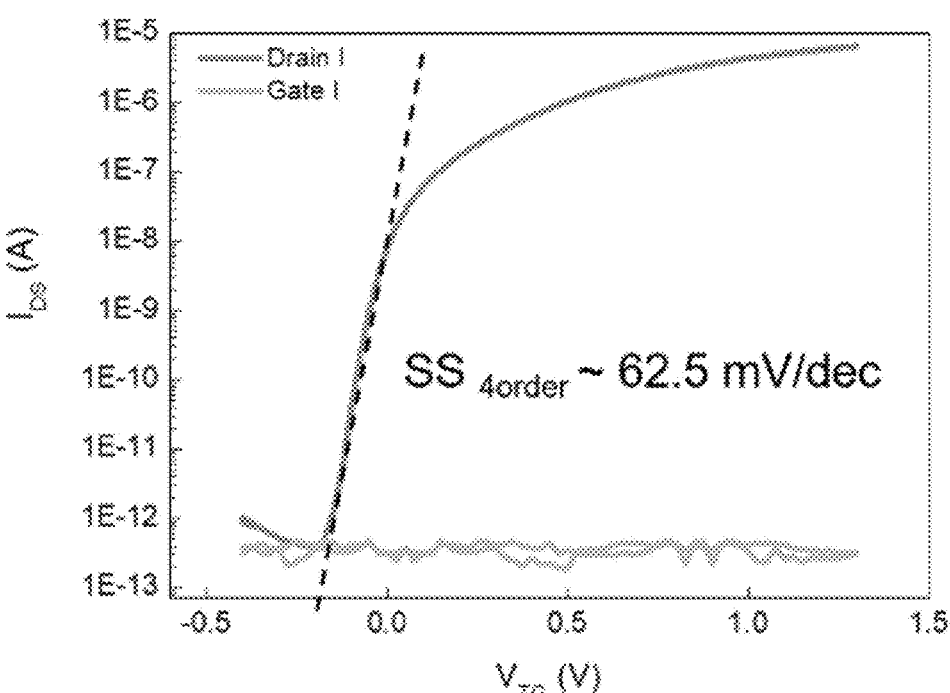

【Fig. 68】
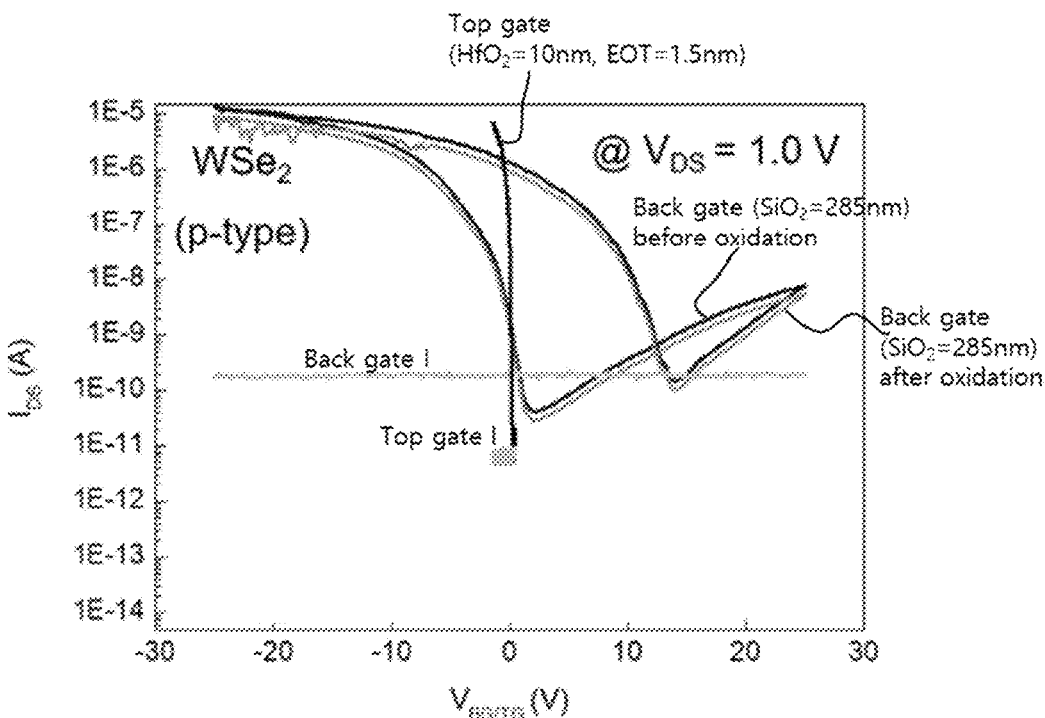

【Fig. 69】
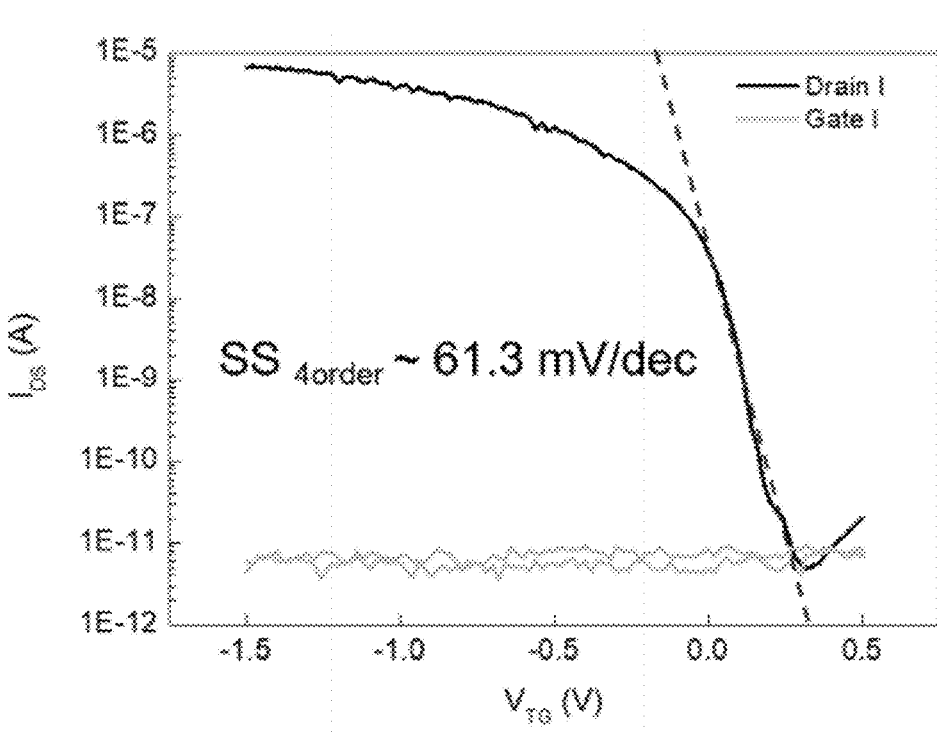

STACK STRUCTURE AND MANUFACTURING METHOD THEREOF, CAPACITOR USING THE SAME, TRANSISTOR USING THE SAME, DYE-SENSITIZED SOLAR CELL USING THE SAME, AND ARCHITECTURAL FILM FOR WINDOW GLASS COATING USING THE SAME

BACKGROUND OF THE INVENTION

1. Field of the Invention

The present application relates to a stack structure and a method for manufacturing the same, and more specifically, to a stack structure having a structure in which a plurality of thin films are stacked and a method for manufacturing the same.

The stack structure and the method for manufacturing the same according to an embodiment of present application may be applied to a MOS capacitor, an ultra-low power switching device, a dye-sensitized solar cell, and an architectural film for glass coating of a window.

2. Description of the Related Art

Since the development of field effect transistors (FETs), a semiconductor/dielectric gate stack structure has served as a basic building block for controlling overall current flow along a conductive channel surface for efficient information processing and computing applications. However, as geometrical scaling of a silicon (Si)-based semiconductor device continues, the possibility of controlling a gate stack is lost, thereby causing a problem in that the overall electrical performance is degraded.

A two-dimensional (2D) van der Waals (vdW) semiconductor material has a low dielectric constant, a thin thickness, and a high charge mobility, and thus can effectively suppress unique problems of a silicon (Si)-based semiconductor device, so that it is attracting attention as a promising material candidate capable of replacing silicon (Si). In particular, a technology of integrating a high-k dielectric with respect to the two-dimensional van der Waals semiconductor material can improve controllability of the gate stack through efficient capacitive coupling by having a thin equivalent oxide thickness, and thus, the development of a high-k gate stack based on the two-dimensional van der Waals semiconductor material is one of the key challenges for a hyper-connected society of the Fourth Industrial Revolution. Accordingly, various studies have been conducted on high-k gate stacks based on two-dimensional semiconductor materials in recent years.

The most commonly used approach for forming gate stacks having a two-dimensional semiconductor/dielectric structure is an atomic layer deposition (ALD) method of depositing a dielectric directly on a two-dimensional semiconductor layer. However, unlike the existing silicon (Si)-based technology, the atomic layer deposition (ALD) method causes non-uniform nuclei and islands to be formed in a two-dimensional semiconductor, resulting in current leakage that easily occurs when equivalent oxide thickness (EOT) is small (Kim, H. G. & Lee, H. B. R. Atomic layer deposition on 2D materials. Chem. Mater. 29, 3809-3826 Apr. 25, 2017).

In order to overcome the problem of the ALD method, introduction of a buffer layer such as perylene tetracarboxylic dianhydride has been proposed (Zhang, X. et al. Van der Waals-Interface-Dominated All-2D Electronics. Adv. Mater. 2207966, Nov. 10, 2022), but effective EOT scaling is not achieved due to the buffer layer.

Therefore, in order to manufacture an electronic device that has higher electrical characteristics and reliability and may be driven at low power, an approach of a method different from the above-described methods is required.

RELATED ART DOCUMENT

Non-Patent Documents

Kim, H. G. & Lee, H. B. R. Atomic layer deposition on 2D materials. Chem. Mater. 29, 3809-3826 (Apr. 25, 2017)

Zhang, X. et al. Van der Waals-Interface-Dominated All-2D Electronics. Adv. Mater. 2207966 (Nov. 10, 2022)

SUMMARY OF THE INVENTION

One technical problem to be solved by the present invention is to provide a stack structure in which a channel layer including a two-dimensional semiconductor material and a dielectric layer including a high-k material are stacked, and a method for manufacturing the same.

Another technical problem to be solved by the present invention is to provide a stack structure with improved interface characteristics between a channel layer and a dielectric layer, and a method for manufacturing the same.

Still another technical problem to be solved by the present invention is to provide a stack structure having a subthreshold swing (SS) value close to a Boltzmann limit at room temperature, and a method for manufacturing the same.

Still another technical problem to be solved by the present invention is to provide a stack structure for easily implementing a low-power device, method and a for manufacturing the same.

Still another technical problem to be solved by the present invention is to provide a capacitor to which the above-described stack structure is applied.

Still another technical problem to be solved by the present invention is to provide a transistor to which the above-described stack structure is applied.

Still another technical problem to be solved by the present invention is to provide a solar cell to which the above-described stack structure is applied.

Still another technical problem to be solved by the present invention is to provide an architectural film to which the above-described stack structure is applied.

The technical problems to be solved by the present invention are not limited to those described above.

In order to solve the above-described technical problems, the present invention provides a method for manufacturing a stack structure.

According to one embodiment, the method for manufacturing a stack structure may include: preparing a substrate; forming a two-dimensional (2D) semiconductor material layer including $Bi_2O_2Se$ on the substrate; and oxidizing the two-dimensional semiconductor material layer to form a high-k material layer including $Bi_2O_2Se$.

According to one embodiment, in the method for manufacturing a k stack structure, a crystal structure of $Bi_2O_2Se$ included in the high-k material layer may be controlled according to an oxidation method of the two-dimensional semiconductor material layer.

In one embodiment, in the method for manufacturing a stack structure, as the two-dimensional semiconductor material layer is oxidized by oxygen ($O_2$) plasma, the high-k material layer including amorphous $Bi_2SeO_5$ may be formed.

In one embodiment, in the method for manufacturing a stack structure, as the two-dimensional semiconductor material layer is natively oxidized, the high-k material layer including crystalline $Bi_2SeO_5$ may be formed.

In one embodiment, in the method for manufacturing a stack structure, as the two-dimensional semiconductor material layer is oxidized by an oxidation method using ultraviolet (UV) rays, the high-k material layer including single crystalline $\beta$-$Bi_2SeO_5$ may be formed.

In another embodiment, a method for manufacturing a stack structure may include: preparing a substrate; forming a channel layer including a two-dimensional (2D) semiconductor material on the substrate; and oxidizing the channel layer to form a dielectric layer including a high-k material.

In another embodiment, in the method for manufacturing the stack structure, as the channel layer is oxidized, one region of the channel layer may be converted into the dielectric layer including the high-k material, and the other region of the channel layer may remain as the channel layer including the two-dimensional semiconductor material.

In another embodiment, the high-k material may be formed by oxidizing the two-dimensional semiconductor material.

In another embodiment, the dielectric layer may be formed by oxidizing the channel layer using oxygen ($O_2$) plasma.

In another embodiment, a thickness of the dielectric layer may be controlled according to an exposure time of the channel layer to the oxygen ($O_2$) plasma.

In order to solve the above-described technical problems, the present invention provides a stack structure.

According to one embodiment, the stack structure may include: a channel layer including a two-dimensional (2D) semiconductor material; and a dielectric layer disposed on the channel layer, in which the dielectric layer may include a high-k material formed by oxidizing the two-dimensional semiconductor material.

According to one embodiment, the two-dimensional semiconductor material may include any one of $Bi_2O_2Se$, hafnium diselenide ($HfSe_2$), hafnium disulfide ($HfS_2$), and zirconium diselenide ($ZrSe_2$).

According to one embodiment, the high-k material may include any one of $Bi_2SeO_5$, hafnium oxide ($HfO_x$, x>0), and zirconium oxide ($ZrO_x$, x>0).

According to one embodiment, an interface may be formed between the channel layer and the dielectric layer.

In order to solve the above-described technical problems, the present invention provides a transistor.

According to one embodiment, the transistor may include: a source electrode and a drain electrode disposed to be spaced apart from each other; a channel layer disposed on the source electrode and the drain electrode such that one side thereof makes contact with the source electrode and the other side thereof makes contact with the drain electrode, and including a two-dimensional (2D) semiconductor material; a dielectric layer disposed on the channel layer and including a high-k material formed by oxidizing the two-dimensional semiconductor material; and a gate electrode disposed on the dielectric layer.

According to one embodiment, the dielectric layer may be formed by oxidizing a portion of the channel layer using oxygen ($O_2$) plasma, and electrical characteristics of the translator may be controlled according to power of the oxygen ($O_2$) plasma supplied to the channel layer.

The method for manufacturing a stack structure according to the embodiment of the present invention may include: preparing a substrate; forming a channel layer including a two-dimensional semiconductor material on the substrate; and oxidizing the channel layer using oxygen ($O_2$) plasma to form a dielectric layer including a high-k material. Accordingly, interface characteristics between the channel layer and the dielectric layer may be improved.

Accordingly, an electronic device (e.g., a field effect transistor, etc.) to which stack structure is applied may have a subthreshold swing (SS) value close to a Boltzmann limit at room temperature, and thus, low-power driving may be easily performed.

BRIEF DESCRIPTION OF THE DRAWINGS

FIG. 1 is a flowchart for explaining a method for manufacturing a stack structure according to an embodiment of the present invention.

FIGS. 2 and 3 are schematic views for explaining a process of manufacturing a stack structure according to the embodiment of the present invention.

FIGS. 4 to 6 are schematic views for explaining a method for manufacturing a $HfO_2$/$HfSe_2$ stack structure.

FIG. 7 is a schematic view for explaining a manufacturing mechanism of the $HfO_2$/$HfSe_2$ stack structure in more detail.

FIG. 8 is a schematic view for explaining a $HfSe_2$ oxidation process at an appropriate oxygen concentration.

FIG. 9 is a schematic view for explaining a $HfSe_2$ oxidation process at an excessive oxygen concentration.

FIG. 10 is a flowchart for explaining a method for manufacturing g a capacitor using the $HfO_2$/$HfSe_2$ stack structure according to the embodiment of the present invention.

FIG. 11 is a schematic view for explaining the capacitor using the $HfO_2$/$HfSe_2$ stack structure according to the embodiment of the present invention.

FIG. 12 is a flowchart for explaining a method for manufacturing a field effect transistor using the $HfO_2$/$HfSe_2$ stack structure according to the embodiment of the present invention.

FIG. 13 is a schematic view for explaining the field effect transistor using the $HfO_2$/$HfSe_2$ stack structure according to the embodiment of the present invention.

FIG. 14 is a flowchart for explaining a method for manufacturing an impact ionization super-tilt switching device using the $HfO_2$/$HfSe_2$ stack structure according to the embodiment of the present invention.

FIG. 15 is a schematic view for explaining the impact ionization super-tilt switching device using the $HfO_2$/$HfSe_2$ stack structure according to the embodiment of the present invention.

FIG. 16 is a schematic view for explaining an architectural film using the $HfO_2$/$HfSe_2$ stack structure according to the embodiment of the present invention.

FIG. 17 is a schematic view for explaining a solar cell using the $HfO_2$/$HfSe_2$ stack structure according to the embodiment of the present invention.

FIG. 18 is a schematic view for explaining a first modification example of the $HfO_2$/$HfSe_2$ stack structure according to the embodiment of the present invention.

FIGS. 19 and 20 are schematic views for explaining a second modification example of the $HfO_2$/$HfSe_2$ stack structure according to the embodiment of the present invention.

FIG. 21 is a schematic view for explaining a third modification example of the $HfO_2$/$HfSe_2$ stack structure according to the embodiment of the present invention.

FIG. 22 is a TEM image of $HfSe_2$ oxidized with oxygen plasma having power of 7 W.

FIG. 23 is a TEM image of $HfSe_2$ oxidized with oxygen plasma having power of 8 W.

FIG. 24 is a TEM image of $HfSe_2$ oxidized with oxygen plasma having power of 10 W.

FIG. 25 is a TEM image of $HfSe_2$ oxidized with oxygen plasma having power of 20 W.

FIG. 26 is a TEM image of $HfSe_2$ oxidized with oxygen plasma having power of 30 W.

FIG. 27 is a view for explaining an OM image and thickness change profile of $HfSe_2$ before being oxidized with oxygen plasma.

FIG. 28 is a view for explaining an OM image and thickness change profile of $HfSe_2$ oxidized with oxygen plasma for 3 minutes.

FIG. 29 is a view for explaining an OM image and thickness change profile of $HfSe_2$ oxidized with oxygen plasma for 5 minutes.

FIG. 30 is a view for explaining a Raman analysis result for a plasma oxidation process of $HfSe_2$.

FIG. 31 is a view for explaining a change in a thickness of $HfSe_2$ according to plasma oxidation and a change in a thickness of $HfO_2$ converted from $HfSe_2$.

FIG. 32 is a view for explaining a conversion rate of $HfSe_2$ according to plasma oxidation of $HfSe_2$.

FIG. 33 is a schematic view for defining various parameters required for calculating the thickness of $HfO_2$ converted from $HfSe_2$.

FIG. 34 is a view for explaining an XPS analysis result of the $HfO_2/HfSe_2$ stack structure.

FIG. 35 is a view showing a STEM image and an FFT pattern for the $HfO_2/HfSe_2$ stack structure.

FIG. 36 is a view showing a STEM image and an EDS mapping result for the $HfO_2/HfSe_2$ stack structure.

FIG. 37 is a view showing a high-resolution STEM image for the $HfO_2/HfSe_2$ stack structure.

FIG. 38 is a view for explaining an XPS analysis result for each of $HfO_2$ and $HfSe_2$ in the $HfO_2/HfSe_2$ stack structure.

FIG. 39 is a view showing capacitance-voltage characteristics and a schematic view of a MOS capacitor according to Experimental Example 2.

FIG. 40 is a view showing conductance-voltage characteristics of the MOS capacitor according to Experimental Example 2.

FIG. 41 is a view for explaining a result of extracting an interface trap density of the MOS capacitor according to Experimental Example 2 by using conductance measured through FIG. 40.

FIG. 42 is a view for explaining an equivalent oxide thickness and a dielectric constant of the MOS capacitor according to Experimental Example 2.

FIG. 43 is a schematic view of a field effect transistor according to Experimental Example 3.

FIG. 44 is a view showing an ID-VG curve of the field effect transistor according to Experimental Example 3.

FIG. 45 is a view showing an ID-VG curve according to a gate voltage sweep of the field effect transistor according to Experimental Example 3.

FIG. 46 is a view showing an ID-VG curve according to a temperature of the field effect transistor according to Experimental Example 3.

FIG. 47 is a view showing a subthreshold swing value according to a temperature of the field effect transistor according to Experimental Example 3.

FIG. 48 is a view for explaining a simulation result of RC Delay characteristics according to an interface charge trap concentration of the field effect transistor according to Experimental Example 3.

FIG. 49 is a view showing electrical characteristics of the field effect transistor according to Experimental Example 3 in which a thickness ratio of $HfO_2:HfSe_2$ is 1:1.

FIG. 50 is a view showing electrical characteristics of the field effect transistor according to Experimental Example 3 in which a thickness ratio of $HfO_2:HfSe_2$ is 1:2.

FIG. 51 is a view showing electrical characteristics of the field effect transistor according to Experimental Example 3 in which a thickness ratio of $HfO_2:HfSe_2$ is 1:3.

FIG. 52 is a view for explaining a result of measuring a subthreshold swing value of the field effect transistor according to Experimental Example 3 to which a $HfO_2/HfSe_2$ stack structure oxidized with oxygen plasma having power of 10 W is applied.

FIG. 53 is a view for explaining a result of measuring a subthreshold swing value of the field effect transistor according to Experimental Example 3 to which a $HfO_2/HfSe_2$ stack structure oxidized with oxygen plasma having power of 15 W is applied.

FIG. 54 is a view for explaining a result of measuring a subthreshold swing value of the field effect transistor according to Experimental Example 3 to which a $HfO_2/HfSe_2$ stack structure oxidized with oxygen plasma having power of 20 W is applied.

FIG. 55 is a view for explaining a result of measuring a subthreshold swing value of the field effect transistor according to Experimental Example 3 to which a $HfO_2/HfSe_2$ stack structure oxidized with oxygen plasma having power of 25 W is applied.

FIG. 56 is a view for explaining a result of measuring a subthreshold swing value of the field effect transistor according to Experimental Example 3 to which a $HfO_2/HfSe_2$ stack structure oxidized with oxygen plasma having power of 30 W is applied.

FIG. 57 is a view for explaining a result of measuring a leakage current value of the field effect transistor according to Experimental Example 3 to which a $HfO_2/HfSe_2$ stack structure oxidized with oxygen plasma having mutually different power is applied.

FIG. 58 is a schematic view of an impact ionization super-tilt switching device according to Experimental Example 4.

FIG. 59 is a view showing an ID-VG curve of the impact ionization super-tilt switching device according to Experimental Example 4.

FIG. 60 is a view showing an ID-VD curve of the impact ionization super-tilt switching device according to Experimental Example 4.

FIG. 61 is a view showing electron-hole pairs generated in a gate non-overlapping region of an impact ionization super-tilt switching device according to Experimental Example 4.

FIG. 62 is a view showing a threshold voltage according to a change in a thickness of $HfO_2$ and a length of the gate non-overlapping region of the impact ionization super-tilt switching device according to Experimental Example 4.

FIG. 63 is a view showing channel currents according to various drain voltages and gate voltages of the impact ionization super-tilt switching device according to Experimental Example 4.

FIG. 64 is a view for explaining a change in electrical characteristics according to the change in the length of the gate non-overlapping region of the impact ionization super-tilt switching device according to Experimental Example 4.

FIG. 65 is a schematic view for explaining a process of manufacturing a transistor according to Experimental Example 5.

FIG. 66 is a view for explaining $MoS_2$ semiconductor characteristics of the transistor according to Experimental Example 5.

FIG. 67 is a view for explaining a subthreshold swing value of the transistor according to Experimental Example 5.

FIG. 68 is a view for explaining $Wse_2$ semiconductor characteristics of a transistor according to Experimental Example 6.

FIG. 69 is a view for explaining a subthreshold swing value of the transistor according to Experimental Example 6.

DETAILED DESCRIPTION OF THE INVENTION

Hereinafter, preferred embodiments of the present invention will be described in detail with reference to the accompanying drawings. However, the present invention may be embodied in different forms and should not be construed as limited to the embodiments set forth herein. Rather, the embodiments are provided so that this disclosure will be thorough and complete, and will fully convey the scope of the present invention to those skilled in the art.

In the present specification, it will be understood that when an element is referred to as being "on" another element, it can be formed directly on the other element or intervening elements may be present. In the drawings, the thicknesses of layers and regions are exaggerated for clarity.

In addition, it will be also understood that although the terms first, second, third, etc. may be used herein to describe various elements, these elements should not be limited by these terms. These terms are only used to distinguish one element from another element. Thus, a first element in some embodiments may be termed a second element in other embodiments without departing from the teachings of the present invention. Embodiments explained and illustrated herein include their complementary counterparts. As used herein, the term "and/or" includes any and all combinations of one or more of the associated listed elements.

The singular expression also includes the plural meaning as long as it does not differently mean in the context. In addition, the terms "comprise", "have" etc., of the description are used to indicate that there are features, numbers, steps, elements, or combination thereof, and they should not exclude the possibilities of combination or addition of one or more features, numbers, operations, elements, or a combination thereof. Furthermore, it will be understood that when an element is referred to as being "connected" or "coupled" to another element, it may be directly connected or coupled to the other element or intervening elements may be present.

In addition, when detailed descriptions of related known functions or constitutions are considered to unnecessarily cloud the gist of the present invention in describing the present invention below, the detailed descriptions will not be included.

Stack Structure And Manufacturing Method Thereof

FIG. 1 is a flowchart for explaining a method for manufacturing a stack structure according to an embodiment of the present invention, and FIGS. 2 and 3 are schematic views for explaining a process of manufacturing a stack structure according to the embodiment of the present invention.

Referring to FIGS. 1 to 3, a substrate SB may be prepared (S110). According to one embodiment, the substrate SB may be a silicon semiconductor substrate. Alternatively, according to another embodiment, the substrate SB may be a compound semiconductor substrate. Alternatively, according to still another embodiment, the substrate SB may be a glass substrate. Alternatively, according to still another embodiment, the substrate SB may be a plastic substrate. The type of the substrate SB is not limited.

A channel layer 100 including a two-dimensional semiconductor material may be formed on the substrate SB (S120). According to one embodiment, the two-dimensional semiconductor material may include any one of $Bi_2O_2Se$, hafnium diselenide ($HfSe_2$), hafnium disulfide ($HfS_2$), and zirconium diselenide ($ZrSe_2$). According to one embodiment, the channel layer 100 may be formed by using various deposition methods such as chemical vapor deposition (CVD) and physics vapor deposition (PVD) using precursors. Alternatively, the channel layer 100 may be formed by transferring a two-dimensional semiconductor material exfoliated from a bulk onto the substrate SB. The method for forming the channel layer 100 is not limited.

The channel layer 100 may be oxidized to form a dielectric layer 200 including a high-k material (S130). In one embodiment, as the channel layer 100 is oxidized, one region of the channel layer 100 may be converted into the dielectric layer 200 including the high-k material, and the other region of the channel layer 100 may remain as the channel layer 100 including the two-dimensional semiconductor material. That is, when the channel layer 100 is oxidized, the oxidized region in the channel layer 100 is converted into the high-k material formed by oxidizing the two-dimensional semiconductor material, and the non-oxidized region may remain as the two-dimensional semiconductor material. Therefore, the high-k material may be defined as a material formed by oxidizing two-dimensional semiconductor material.

According to one embodiment, the high-k material may include any one of $Bi_2SeO_5$, hafnium oxide ($HfO_x$, $x>0$), and zirconium oxide ($ZrO_x$, $x>0$). More specifically, when the two-dimensional semiconductor material includes $Bi_2O_2Se$, $Bi_2O_2Se$ may be converted into a $Bi_2SeO_5$ high-k material as the two-dimensional semiconductor material is oxidized. Alternatively, when the two-dimensional semiconductor material includes hafnium diselenide ($HfSe_2$) or hafnium disulfide ($HfS_2$), hafnium diselenide ($HfSe_2$) or hafnium disulfide ($HfS_2$) may be converted into a hafnium oxide ($HfO_x$, $x>0$) high-k material as the two-dimensional semiconductor material is oxidized. Alternatively, when the two-dimensional semiconductor material includes zirconium diselenide ($ZrSe_2$), the zirconium diselenide ($ZrSe_2$) may be converted into a zirconium oxide ($ZrO_x$, $x>0$) high-k material as the two-dimensional semiconductor material is oxidized.

According to one embodiment, the channel layer 100 may be oxidized by any one of oxidation methods such as plasma oxidation, native oxidation, and an oxidation method using ultraviolet (UV) rays. Further, the channel layer 100 may be oxidized in a different manner according to the type of the two-dimensional semiconductor material.

Specifically, when the two-dimensional semiconductor material includes $Bi_2O_2Se$, the channel layer 100 may be oxidized by any one of oxidation methods such as plasma oxidation, native oxidation, and the oxidation method using ultraviolet (UV) rays. Further, when the two-dimensional semiconductor material includes $Bi_2O_2Se$, a crystal structure of the $Bi_2SeO_5$ high-k material formed by oxidizing $Bi_2O_2Se$ according to the oxidation method of the channel layer 100 may be controlled. For example, when the channel layer 100 including $Bi_2O_2Se$ is oxidized using oxygen ($O_2$) plasma, an amorphous $Bi_2SeO_5$ high-k material may be formed. Alternatively, when the channel layer 100 including $Bi_2O_2Se$ is oxidized by native oxidation, a crystalline $Bi_2SeO_5$ high-k material may be formed. Alternatively, when the channel layer 100 including $Bi_2O_2Se$ is oxidized by the oxidation method using ultraviolet rays (e.g., UV-assisted intercalative oxidation), a single crystalline $\beta$-$Bi_2SeO_5$ high-k material may be formed.

When the two-dimensional semiconductor material includes zirconium diselenide ($ZrSe_2$), the channel layer 100 may be oxidized by native oxidation to form a zirconium oxide ($ZrO_x$, x>0) high-k material.

When the two-dimensional semiconductor material includes hafnium diselenide ($HfSe_2$) or hafnium disulfide ($HfS_2$), the channel layer 100 may be oxidized by native oxidation or oxygen ($O_2$) plasma to form hafnium oxide ($HfO_x$, x>0).

As described above, although the high-k material may be formed by using various oxidation methods according to the type of the two-dimensional semiconductor material, except for the case in which hafnium dioxide ($HfSe_2$) is oxidized by oxygen ($O_2$) plasma to form hafnium oxide ($HfO_2$), interface characteristics between the channel layer 100 and the dielectric layer 200 is low so that a subthreshold swing (SS) value is increased, thereby making it difficult to implement a low-power device.

That is, in the $Bi_2SeO_5$/$Bi_2O_2Se$ stack structure formed by the oxidation methods using plasma oxidation, the native oxidation, and ultraviolet rays, the $ZrO_x$/$ZrSe_2$ stack structure formed by the oxidation method using the native oxidation, the $HfO_x$/$HfSe_2$ stack structure formed by the oxidation method using the native oxidation, and the $HfO_x$/$HfS_2$ stack structure formed by the oxidation method using the native oxidation and the plasma oxidation, the interface characteristics between the channel layer 100 and t the dielectric layer 200 is low so that the subthreshold swing (SS) value is increased, thereby making it difficult to implement a low-power device.

On the other hand, the $HfO_2$/$HfSe_2$ stack structure formed by the plasma oxidation (e.g., $O_2$ plasma oxidation) method may have a subthreshold swing (SS) value close to a Boltzmann limit at room temperature because the interface characteristics between the channel layer 100 and the dielectric layer 200 is high, so that a low-power device is easily implemented. Hereinafter, the $HfO_2$/$HfSe_2$ stack structure formed by the plasma oxidation (e.g., $O_2$ plasma oxidation) method will be described in more detail.

FIGS. 4 to 6 are schematic views for explaining a method for manufacturing a $HfO_2$/$HfSe_2$ stack structure, FIG. 7 is a schematic view for explaining a manufacturing mechanism of the $HfO_2$/$HfSe_2$ stack structure in more detail, FIG. 8 is a schematic view for explaining a $HfSe_2$ oxidation process at an appropriate oxygen concentration, and FIG. 9 is a schematic view for explaining a $HfSe_2$ oxidation process at an excessive oxygen concentration.

Referring to FIGS. 4 to 7, when the oxidation process is performed on the channel layer 100 including hafnium diselenide ($HfSe_2$) through oxygen plasma ($O_2$ plasma), layer-by-layer oxidation, that is, oxidation for each layer may be performed.

More specifically, when the oxidation process is performed on the channel layer 100 through oxygen plasma, oxygen atoms O may penetrate into the channel layer 100, in which one oxygen atom O penetrating into the channel layer 100 may replace selenium atoms Se of the hafnium diselenide ($HfSe_2$) without an additional substitution energy barrier. In addition, the oxygen atom O replacing the selenium atom Se may form a covalent bond with three hafnium atoms (Hf). Accordingly, hafnium oxide ($HfO_2$) formed by oxidizing hafnium diselenide ($HfSe_2$) may be formed. That is, a region of the channel layer 100 including hafnium diselenide ($HfSe_2$) may be converted into the dielectric layer 200 including hafnium oxide ($HfO_2$). Thereafter, as shown in FIG. 5 and FIG. 7(a), a region of the dielectric layer 200 may be gradually increased by the continuously penetrated oxygen atoms O. That is, a thickness of the dielectric layer 200 may be gradually increased and a thickness of the channel layer 100 may be gradually decreased due to the continuously penetrated oxygen atoms O.

Meanwhile, as shown in FIGS. 5 and 7(b), the substituted selenium atoms Se generated when the penetrated oxygen atoms O substitute the selenium atoms Se of hafnium diselenide ($HfSe_2$) may be diffused into an oxygen vacancy $V_o$ in the dielectric layer 200 and then discharged to the outside of the dielectric layer 200 through the oxygen vacancies $V_o$ in the dielectric layer 200. In addition, the substituted selenium atoms Se may form an interface between the channel layer 100 and the dielectric layer 200 before being diffused into the oxygen vacancies in the dielectric layer 200. Accordingly, the channel layer 100 and the dielectric layer 200 may be prevented from being merged by an interface formed by the substituted selenium atoms Se. Therefore, the oxidation for each layer by the continuously penetrated oxygen atoms O may be easily performed.

However, the formation of the interface by the substituted selenium atom Se may be performed under a condition of an appropriate oxygen concentration, as shown in FIG. 8. That is, when hafnium diselenide ($HfSe_2$) is oxidized by oxygen ($O_2$) plasma, the oxidation for each layer may be easily performed only when the appropriate oxygen concentration condition is maintained, thereby manufacturing the $HfO_2$/$HfSe_2$ stack structure in which hafnium diselenide ($HfSe_2$) and hafnium oxide ($HfO_2$) are clearly distinguished. In contrast, when hafnium diselenide ($HfSe_2$) is oxidized under an excessive oxygen concentration condition, as shown in FIG. 9, since the interface is not formed by the substituted selenium atoms Se, there may be a problem in that the channel layer 100 and the dielectric layer 200 are merged. That is, when hafnium diselenide ($HfSe_2$) is oxidized under the excessive oxygen concentration condition, hafnium diselenide ($HfSe_2$) and hafnium oxide ($HfO_2$) may not be clearly distinguished from each other, and hafnium diselenide ($HfSe_2$) and hafnium oxide ($HfO_2$) may be mixed.

According to one embodiment, the oxygen concentration condition may be controlled according to power of oxygen ($O_2$) plasma provided to hafnium diselenide ($HfSe_2$). More specifically, the power of oxygen ($O_2$) plasma provided to the hafnium diselenide ($HfSe_2$) may be controlled to be greater than 7 W and less than 20 W. In contrast, when the power of oxygen ($O_2$) plasma is controlled to 20 W or greater, hafnium diselenide ($HfSe_2$) and hafnium oxide ($HfO_2$) may not be clearly distinguished from each other due to the excessive oxygen concentration, and hafnium diselenide ($HfSe_2$) and hafnium oxide ($HfO_2$) may be mixed. In addition, when the power of oxygen ($O_2$) plasma is controlled to 7 W or less, since no penetration of the minimum amount of oxygen atoms for forming the hafnium oxide ($HfO_2$) occurs, hafnium diselenide ($HfSe_2$) is not oxidized, and thus hafnium oxide ($HfO_2$) may not be formed.

As a result, the $HfO_2$/$HfSe_2$ stack structure according to the embodiment of the present invention is manufactured by oxidizing hafnium diselenide ($HfSe_2$) using oxygen ($O_2$) plasma, and since the interface by the substituted selenium atoms Se is formed between the channel layers 100 (HfSe$_2$) and the dielectric layers 200 (HfO$_2$) during the oxidation process, the interface characteristics between the channel layer 100 (HfSe$_2$) and the dielectric layers 200 (HfO$_2$) may be improved. Accordingly, an electronic device using the HfO$_2$/HfSe$_2$ stack structure according to the embodiment may have the subthreshold swing SS value close to the Boltzmann limit at room temperature, and thus, a low-power device may be easily implemented.

Hereinabove, the stack structure and the method for manufacturing the same according to the embodiment of the present invention have been described. Hereinafter, various application examples of the stack structure according to the embodiment of the present invention will be described.

Capacitor Using HfO$_2$/HfSe$_2$ Stack Structure

FIG. 10 is a flowchart for explaining a method for manufacturing a capacitor using the HfO$_2$/HfSe$_2$ stack structure according to the embodiment of the present invention, and FIG. 11 is a schematic view for explaining the capacitor using the HfO$_2$/HfSe$_2$ stack structure according to the embodiment of the present invention.

Referring to FIGS. 10 and 11, after a substrate SB is prepared (S210), a lower electrode BE may be formed on the substrate SB (S220). According to one embodiment, the substrate SB may be a silicon semiconductor substrate. Alternatively, according to another embodiment, the substrate SB may be a compound semiconductor substrate. Alternatively, according to still another embodiment, the substrate SB may be a glass substrate. Alternatively, according to still another embodiment, the substrate SB may be a plastic substrate. The type of the substrate SB is not limited.

A channel layer 100 including a two-dimensional semiconductor material may be formed on the lower electrode BE (S230). The two-dimensional semiconductor material may include hafnium diselenide (HfSe$_2$). According to one embodiment, the channel layer 100 may be formed by dry-transferring hafnium diselenide (HfSe$_2$) flakes mechanically exfoliated from a bulk crystal using polydimethylsiloxane (PDMS).

The channel layer 100 may be oxidized to form a dielectric layer 200 including a high-k material (S230). More specifically, the channel layer 100 including hafnium diselenide (HfSe$_2$) may be oxidized with oxygen (O$_2$) plasma to convert a partial region of the channel layer 100 into hafnium oxide (HfO$_2$). That is, a region in which hafnium diselenide (HfSe$_2$) is oxidized to be converted into hafnium oxide (HfO$_2$) may be defined as the dielectric layer 200.

Finally, an upper electrode TE may be formed on the dielectric layer 200 (S250). Accordingly, a MOS capacitor to which the HfO$_2$/HfSe$_2$ stack structure is applied may be manufactured.

In the MOS capacitor according to the embodiment, hafnium diselenide (HfSe$_2$) included in the channel layer 100 exhibits n-type semiconductor characteristics, and shows a behavior that is significantly unchanged in both a depletion region and an accumulation region according to various frequency ranges (1 kHz to 1 MHZ), so that the MOS capacitor may have a low level of interface trap (interface trap between the channel layer and the dielectric layer). In addition, the MOS capacitor according to the embodiment may have a constant dielectric constant k of 23 in various frequency ranges (1 kHz to 1 MHZ). That is, the MOS capacitor according to the embodiment has stable dielectric characteristics of a high-k constant, and thus may be easily applied to a low power and high frequency electronic apparatus.

Field Effect Transistor Using HfO$_2$/HfSe$_2$ Stack Structure

FIG. 12 is a flowchart for explaining a method for manufacturing a field effect transistor using the HfO$_2$/HfSe$_2$ stack structure according to the embodiment of the present invention, and FIG. 13 is a schematic view for explaining the field effect transistor using the HfO$_2$/HfSe$_2$ stack structure according embodiment of the present invention.

Referring to FIGS. 12 and 13, a source electrode S and a drain electrode D disposed to be spaced apart from each other may be prepared (S310). Thereafter, a channel layer 100 including a two-dimensional semiconductor material may be formed on the source electrode S and the drain electrode D (S320). More specifically, the channel layer 100 may be formed such that one side thereof makes contact the source electrode S and the other side thereof makes contact with the drain electrode D. Further, the two-dimensional semiconductor material may include hafnium diselenide (HfSe$_2$). According to one embodiment, the channel layer 100 may be formed by dry-transferring hafnium diselenide (HfSe$_2$) flakes mechanically exfoliated from a bulk crystal using polydimethylsiloxane (PDMS).

The channel layer 100 may be oxidized to form a dielectric layer 200 including a high-k material (S330). More specifically, the channel layer 100 including hafnium diselenide (HfSe$_2$) may be oxidized using oxygen (O$_2$) plasma to convert a partial region of the channel layer 100 into hafnium oxide (HfO$_2$). That is, a region in which hafnium diselenide (HfSe$_2$) is oxidized to be converted into hafnium oxide (HfO$_2$) may be defined as the dielectric layer 200.

Finally, a gate electrode GE may be formed on the dielectric layer 200 to cover the entire upper portion of the dielectric layer 200 (S250). Accordingly, a field effect transistor (FET) using the HfO$_2$/HfSe$_2$ stack structure may be manufactured.

The field effect transistor according to the embodiment may have excellent electrical characteristics due to the excellent interface characteristics of the HfO$_2$/HfSe$_2$ stack structure. More specifically, the field effect transistor according to the embodiment may have an ideal subthreshold swing (SS) value of 61 mV/dec close to the Boltzmann limit at room temperature, a high on-off ratio of about $10^8$, and a low gate leakage current value of $10^{-6}$ A/cm$^2$.

Impact Ionization Super-Tilt Switching Device Using HfO$_2$/HfSe$_2$ Stack Structure FIG. 14 is a flowchart for explaining a method for manufacturing an impact ionization super-tilt switching device using the HfO$_2$/HfSe$_2$ stack structure according to the embodiment of the present invention, and FIG. 15 is a schematic view for explaining the impact ionization super-tilt switching device using the HfO$_2$/HfSe$_2$ stack structure according to the embodiment of the present invention.

Referring to FIGS. 14 and 15, a source electrode S and a drain electrode D disposed to be spaced apart from each other may be prepared (S410). Thereafter, a channel layer 100 including a two-dimensional semiconductor material may be formed on the source electrode S and the drain electrode D (S420). More specifically, the channel layer 100 may be formed such that one side thereof makes contact the source electrode S and the other side thereof makes contact with the drain electrode D. Further, the two-dimensional semiconductor material may include hafnium diselenide (HfSe$_2$). According to one embodiment, the channel layer 100 may be formed by dry-transferring hafnium diselenide (HfSe$_2$) flakes mechanically exfoliated from a bulk crystal using polydimethylsiloxane (PDMS).

The channel layer 100 may be oxidized to form a dielectric layer 200 including a high-k material (S430). More specifically, the channel layer 100 including hafnium diselenide ($HfSe_2$) may be oxidized using oxygen ($O_2$) plasma to convert a partial region of the channel layer 100 into hafnium oxide ($HfO_2$). That is, a region in which hafnium diselenide ($HfSe_2$) is oxidized to be converted into hafnium oxide ($HfO_2$) may be defined as the dielectric layer 200.

Finally, a gate electrode GE may be formed on the dielectric layer 200 such that one region of the upper portion of the dielectric layer 200 is covered and the other region is exposed (S440). Accordingly, an impact ionization super-tilt switching device using the $HfO_2/HfSe_2$ stack structure may be manufactured. The impact ionization super-tilt switching device may have n-type characteristics as the $HfO_2/HfSe_2$ stack structure is applied.

According to one embodiment, the gate electrode GE may be formed to cover one region of the upper portion of the dielectric layer 200, and may be formed to be adjacent to the source electrode S between the source electrode S and the drain electrode D. That is, an upper surface of the dielectric layer 200 may be divided into a first region $A_1$ in which the gate electrode GE overlaps and a second region $A_2$ in which the gate electrode GE does not overlap so that the upper surface of the dielectric layer 200 is exposed to the outside.

According to one embodiment, a voltage for generating an electric field that is greater than a minimum electric field intensity (hereinafter, referred to as a "threshold electric field") for generating avalanche multiplication in the second region $A_2$ may be applied to the drain electrode D.

In addition, at the same time as a voltage is applied to the drain electrode D, the voltage may be applied to the gate electrode GE, and the voltage may be applied to be gradually increased. Therefore, an avalanche carrier multiplication phenomenon may be generated in the second region $A_2$. That is, a gate voltage is gradually increased while a strong electric field equal to or greater than a threshold electric field is applied to the first region $A_1$ through the voltage of the drain electrode D to generate the avalanche carrier amplification phenomenon, thereby implementing a super-tilt switching phenomenon at room temperature.

When an electric field is applied to the first region $A_1$, charge carriers are accelerated in the second region $A_2$. However, a charge carrier velocity is not infinitely increased, but saturates at a constant velocity due to collision with the lattice. However, when a sufficiently high electric field, that is, an electric field larger than a critical electric field, is applied, charge carriers sufficiently accelerated by the electric field collide with the lattice to raise electrons of a valence band to a conduction band, thereby generating a new electron-hole pair. The secondary electron-hole pairs acquire high energy again to continuously generate additional electron-hole pairs, and a density may be significantly accordingly, carrier increased. The avalanche multiplication means that carriers are amplified by the collision ionization, and the critical electric field means an electric field strength having a minimum magnitude at which the avalanche multiplication occurs.

The impact ionization super-tilt switching device according to the embodiment may have excellent electrical characteristics due to the excellent interface characteristics of the $HfO_2/HfSe_2$ stack structure. More specifically, the impact ionization super-tilt switching device according to the embodiment may have a very low subthreshold voltage swing (SS) value of 3.43 mV/dec by overcoming a thermionic limit (60 mV/dec) of a CMOS device. Accordingly, a supply voltage may be reduced while maintaining the high on-off ratio, thereby easily improving power consumption and reliability of the device.

Further, the impact ionization super-tilt switching device according to the embodiment may adjust a gate region through a structure in which the gate electrode GE overlaps only a portion of the channel layer 100 and the dielectric layer 200 having impact ionization characteristics, and may gradually increase the gate voltage while the strong electric field equal to or greater than the threshold electric field is applied to the channel layer 100, thereby increasing a probability of occurrence of the avalanche carrier amplification phenomenon, and as a result, the number of charge carriers generated in the channel layer 100 may be significantly increased, and as a result, a super-tilt switching device having a very low subthreshold swing (SS) value even at room temperature may be implemented.

In addition, according to the present invention, an inverter device having a high inverter gain and an ideal noise margin based on the super-tilt switching phenomenon may be implemented through a simple series connection circuit configuration with a transistor which may operate complementarily with the super-tilt switching device.

In addition, according to the present invention, the upper surface of the dielectric layer 200 may include the first region $A_1$ in which the gate electrode GE overlaps and the second region $A_2$ not overlapping the gate electrode GE, in which the first region $A_1$ and the second region $A_2$ may have a length ratio of 1:0.1 to 0.4. Accordingly, the number of charge carriers generated in the channel layer 100 may be significantly increased by increasing the probability of occurrence of the avalanche carrier amplification phenomenon occurring in the first region $A_1$, and as a result, a super-tilt switching device having a very low (5 mv/dec or less) subthreshold swing (SS) value even at room temperature and an optimized on/off ratio may be implemented. Alternatively, when the ratio of the length of the second area $A_2$ to the length of the first area $A_1$ is less than 0.1, the on/off ratio decreases as an off current increases, and as a result, the SS value may increase, and the probability of occurrence of impact ionization may decrease. On the other hand, when the ratio of the length of the second area $A_2$ to the length of the first area $A_1$ exceeds 0.4, there may be a problem that a step-switching phenomenon does not occur.

Architectural Film Using $HfO_2/HfSe_2$ Stack Structure

FIG. 16 is a schematic view for explaining an architectural film using the $HfO_2/HfSe_2$ stack structure according to the embodiment of the present invention.

Passive cooling is a building design approach that focuses on heat acquisition control and heat dissipation of a building in order to improve indoor thermal comfort with little or no energy consumption, and is a technology that adjusts temperature in a building by adjusting only a convection direction without a special temperature control device. An architectural film (particularly, a film used for window coating) among technologies related to the passive cooling technology, a film in which silicon carbide (Sic) and hafnium oxide ($HfO_2$) are alternately and repeatedly stacked ($HfO_2/SiC$) has been conventionally used, as shown in the upper part of FIG. 16.

However, hafnium diselenide ($HfSe_2$) may also be used instead of silicon carbide (Sic), and when hafnium diselenide ($HfSe_2$) is used, as described above in the present invention, since the $HfO_2/HfSe_2$ stack structure may be manufactured by a simple method for oxidizing hafnium diselenide ($HfSe_2$), process convenience may be improved compared to the conventional method, and a large area may also be easily manufactured.

Solar Cell Using $HfO_2/HfSe_2$ Stack Structure

FIG. 17 is a schematic view for explaining a solar cell using the $HfO_2/HfSe_2$ stack structure according to the embodiment of the present invention.

Referring to FIG. 17, the $HfO_2/HfSe_2$ stack structure according to the embodiment may be used as a blocking layer for preventing back reaction between transparent conductive oxide (TCO) of a dye-sensitized solar cell (DSSC) and an electrolyte. When back reaction occurs between the transparent conductive oxide (TCO) and the electrolyte, efficiency of the dye-sensitized solar cell (DSSC) may be significantly reduced. Accordingly, titanium oxide ($TiO_2$) is used as the blocking layer in the related art. However, when hafnium oxide ($HfO_2$) having a larger energy band gap than titanium dioxide ($TiO_2$) is used, electron recombination between the TCO and the electrolyte may be more effectively prevented, and thus, a problem of a decrease in efficiency of the DSSC may be more easily solved.

Hereinabove, various application examples of the $HfO_2/HfSe_2$ stack structure according to the embodiment of the present invention have been described. Hereinafter, various modification examples of the $HfO_2/HfSe_2$ stack structure according to the embodiment of the present invention will be described.

First Modification Example: Crystallization of $HfO_2$

FIG. 18 is a schematic view for explaining a first modification example of the $HfO_2/HfSe_2$ stack structure according to the embodiment of the present invention.

Referring to FIG. 18, a stack structure in which the channel layer 100 and the dielectric layer 200 are stacked on a substrate SB, that is, a $HfO_2/HfSe_2$ stack structure, may be formed, and then a dielectric layer 200 may be post-treated to change hafnium oxide ($HfO_2$) from an amorphous state to a crystalline state. That is, hafnium oxide ($HfO_2$) formed by oxidizing hafnium diselenide ($HfSe_2$) has an amorphous state, and may be post-treated to be changed into a crystalline state. According to one embodiment, the amorphous hafnium oxide ($HfO_2$) may be changed into a crystalline state by performing post-treatment such as thermal annealing, laser exposure, and E-beam exposure.

Since the crystalline hafnium oxide ($HfO_2$) may have relatively improved insulation characteristics compared to the amorphous hafnium oxide ($HfO_2$), the crystalline hafnium oxide ($HfO_2$) may be easily applied to a place where high insulation characteristics are required using the above-described method.

In addition, according to one embodiment, the amorphous hafnium oxide ($HfO_2$) may be changed into the crystalline hafnium oxide ($HfO_2$), and one region thereof may be changed into the crystalline hafnium oxide ($HfO_2$), whereas the remaining region thereof may remain as the amorphous hafnium oxide ($HfO_2$). For example, by post-treating only an upper surface of the amorphous hafnium oxide ($HfO_2$), an upper region of the dielectric layer 200 may be changed into the crystalline hafnium oxide ($HfO_2$), whereas a lower region, that is, a region in which the dielectric layer 200 is adjacent to the channel layer 100 may remain as the amorphous hafnium oxide ($HfO_2$). In this case, even gate leakage current reduction characteristics of the crystalline hafnium oxide ($HfO_2$) may be exhibited while maintaining excellent interface characteristics between the channel layer 100 and the dielectric layer 200, and thus the structure may be easily applied to various fields.

Second Modification Example Formation of $HfZrO_2$ Through Zr Doping

FIGS. 19 and 20 are schematic views for explaining a second modification example of the $HfO_2/HfSe_2$ stack structure according to the embodiment of the present invention.

Referring to FIG. 19, after hafnium diselenide ($HfSe_2$) and zirconium diselenide ($ZrSe_2$) are sequentially stacked on a substrate, oxygen ($O_2$) plasma may be provided to zirconium diselenide ($ZrSe_2$). In this case, zirconium diselenide ($ZrSe_2$) is decomposed to generate a zirconium (Zr) atom, and in this case, $HfZrO_2$ may be formed using the generated zirconium (Zr) atom. More specifically, when oxygen ($O_2$) plasma is continuously provided to zirconium diselenide ($ZrSe_2$), the zirconium (Zr) atom decomposed from zirconium diselenide ($ZrSe_2$) may be bonded to an oxygen (O) atom, and the zirconium-oxygen bond (Zr—O) may penetrate into the hafnium diselenide ($HfSe_2$). Thereafter, the penetrated zirconium-oxygen bond (Zr—O) may substitute a selenium (Se) atom of hafnium diselenide ($HfSe_2$) to form $HfZrO_2$. Further, the formed $HfZrO_2$ may be thermally annealed to crystallize $HfZrO_2$.

Referring to FIG. 20, After hafnium diselenide ($HfSe_2$) and zirconium diselenide ($ZrSe_2$) are sequentially stacked on the substrate, oxygen ($O_2$) plasma may be continuously provided to zirconium diselenide ($ZrSe_2$). In this case, the zirconium (Zr) atom decomposed from zirconium diselenide ($ZrSe_2$) may be bonded to the oxygen (O) atom, and the zirconium-oxygen bond (Zr—O) may penetrate into the hafnium diselenide ($HfSe_2$). Thereafter, the penetrated zirconium-oxygen bond (Zr—O) may substitute the selenium (Se) atom of hafnium diselenide ($HfSe_2$), so that hafnium diselenide ($HfSe_2$) may be fully converted into $HfZrO_2$. In addition, the formed $HfZrO_2$ may be thermally annealed to crystallize the $HfZrO_2$, and various transition metal dichalcogenides (TMDCs) may be inserted between the $HfZrO_2$ and the substrate.

Third Modification Example Full Oxidation of $HfSe_2$ to Convert $HfSe_2$ into $HfO_2$ FIG. 21 is a schematic view for explaining a third modification example of the $HfO_2/HfSe_2$ stack structure according to the embodiment of the present invention.

Referring to FIG. 21, after the channel layer 100 is formed on the substrate SB, oxygen ($O_2$) plasma may be continuously provided, thereby converting the entire channel layer 100 into the dielectric layer 200. That is, hafnium diselenide ($HfSe_2$) may be fully converted into hafnium oxide ($HfO_2$).

According to one embodiment, the above-described third modification example may be used as a method for integrating a gate dielectric on various two-dimensional semiconductors. For example, hafnium diselenide ($HfSe_2$) may be stacked on molybdenum disulfide ($MoS_2$), and then oxygen ($O_2$) plasma may be continuously provided to hafnium diselenide ($HfSe_2$), thereby fully converting the hafnium diselenide ($HfSe_2$) into hafnium oxide ($HfO_2$). Accordingly, a structure in which a gate dielectric ($HfO_2$) is integrated on a two-dimensional semiconductor ($MoS_2$) may be formed. More specifically, the above-described method may be performed by stacking hafnium diselenide ($HfSe_2$) on the two-dimensional semiconductor ($MoS_2$) and using the van der Waals (vdW) gap formed between the two-dimensional semiconductor ($MoS_2$) and hafnium diselenide ($HfSe_2$) as a defect free vdW interface.

Hereinafter, various modification examples of the stack structure according to the embodiment of the present invention have been described. Hereinafter, specific experimental examples and characteristic evaluation results of the $HfO_2/HfSe_2$ stack structure according to the embodiment of the present invention will be described.

Experimental Example 1: Confirmation of $HfO_2/HfSe_2$ Stack Structure Characteristics Hafnium diselenide ($HfSe_2$) was formed on a substrate, and then hafnium diselenide ($HfSe_2$) was subjected to plasma oxidation to convert one region of hafnium diselenide ($HfSe_2$) into hafnium oxide ($HfO_2$). In addition, two protection layers having a thickness of 5 nm were formed on hafnium oxide ($HfO_2$). More specifically, the plasma oxidation of hafnium diselenide ($HfSe_2$) was performed by a method for providing oxygen ($O_2$) plasma at a flow rate of 5 sccm and a pressure of 470 mTorr.

FIG. 22 is a TEM image of $HfSe_2$ oxidized with oxygen plasma having power of 7 W.

Referring to FIG. 22, it shows a transmission electron microscopy (TEM) image of $HfSe_2$ oxidized with oxygen plasma having power of 7 W. As can be seen from FIG. 22, $HfSe_2$ is not oxidized due to low plasma power.

FIG. 23 is a TEM image of $HfSe_2$ oxidized with oxygen plasma having power of 8 W.

Referring to FIG. 23, it shows a transmission electron microscopy (TEM) image of $HfSe_2$ oxidized with oxygen plasma having power of 8 W. As can be seen from FIG. 23, one region of $HfSe_2$ is converted into $HfO_2$.

FIG. 24 is a TEM image of $HfSe_2$ oxidized with oxygen plasma having power of 10 W.

Referring to FIG. 24, it shows a transmission electron microscopy (TEM) image of $HfSe_2$ oxidized with oxygen plasma having power of 8 W. As can be seen from FIG. 24, one region of $HfSe_2$ is converted into $HfO_2$, and $HfSe_2$ and $HfO_2$ are clearly distinguished due to an interface.

FIG. 25 is a TEM image of $HfSe_2$ oxidized with oxygen plasma having power of 20 W.

Referring to FIG. 25, it shows a transmission electron microscopy (TEM) image of $HfSe_2$ oxidized with oxygen plasma having power of 20 W. As can be seen from FIG. 25, one region of $HfSe_2$ is converted into $HfO_2$, but collapse of the interface occurs.

FIG. 26 is a TEM image of $HfSe_2$ oxidized with oxygen plasma having power of 30 W.

Referring to FIG. 26, it shows a transmission electron microscopy (TEM) image of $HfSe_2$ oxidized with oxygen plasma having power of 20 W. As can be seen from FIG. 26, one region of $HfSe_2$ is converted into $HfO_2$, but the collapse of the interface occurs more clearly.

As a result, as can be seen from FIGS. 22 to 26, when the $HfO_2/HfSe_2$ stack structure is manufactured, power of the oxygen plasma is necessarily controlled during the plasma oxidation process of $HfSe_2$. Specifically, it can be seen that plasma power exceeding at least 7 W is required to convert $HfSe_2$ into $HfO_2$, and maximum plasma power of less than 20 W is required to prevent the interface between $HfSe_2$ and $HfO_2$.

TABLE 1

| Plasma power | $HfO_2/HfSe_2$ state |
|---|---|
| 7 W | No $HfO_2$ is formed |
| 8 W | $HfO_2$ is formed and interface is formed between $HfO_2$ and $HfSe_2$ |

TABLE 1-continued

| Plasma power | $HfO_2/HfSe_2$ state |
|---|---|
| 10 W | $HfO_2$ is formed and interface is formed between $HfO_2$ and $HfSe_2$ |
| 20 W | $HfO_2$ is formed, but interface between $HfO_2$ and $HfSe_2$ is collapsed |
| 30 W | $HfO_2$ is formed, but interface between $HfO_2$ and $HfSe_2$ is collapsed |

FIG. 27 is a view for explaining an OM image and thickness change profile of $HfSe_2$ before being oxidized with oxygen plasma.

Referring to FIG. 27, an optical microscopy (OM) image and a thickness variation profile for $HfSe_2$ before being oxidized with oxygen plasma (0 min oxidation). As can be seen from FIG. 27, only $HfSe_2$ is observed before $HfSe_2$ is oxidized with oxygen plasma.

FIG. 28 is a view for explaining an OM image and thickness change profile of $HfSe_2$ oxidized with oxygen plasma for 3 minutes.

Referring to FIG. 28, an optical microscopy (OM) image and a thickness variation profile for $HfSe_2$ oxidized with oxygen plasma for 3 minutes (3 min oxidation). As can be seen from FIG. 28, $HfSe_2$ is partially converted into $HfO_2$.

FIG. 29 is a view for explaining an OM image and thickness change profile of $HfSe_2$ oxidized with oxygen plasma for 5 minutes.

Referring to FIG. 29, an optical microscopy (OM) image and a thickness variation profile for $HfSe_2$ oxidized with oxygen plasma for 5 minutes (5 min oxidation). As can be seen from FIG. 29, $HfSe_2$ is fully converted into $HfO_2$.

In addition, considering a molecular mass (336.41/210.5) and density (6.54/9.68 $g/cm^3$) of $HfO_2/HfSe_2$, it can be seen from the measurements of FIGS. 27 to 29 that a volume of $HfO_2$ converted from $HfSe_2$ is estimated to be 1:2.3.

FIG. 30 is a view for explaining a Raman analysis result for a plasma oxidation process of $HfSe_2$.

Referring to FIG. 30, it shows Raman spectra of $HfO_2$, $HfO_2/HfSe_2$, and the remaining $HfSe_2$ formed as $HfSe_2$ is subjected to plasma oxidation. As can be seen in FIG. 30, the reduced $A_{1g}$ Raman peak (red curve) that is seen even after 3 minutes of plasma treatment shows that there is still an unconverted single crystal $HfSe_2$ layer below $HfO_2$ converted after the plasma treatment, whereas the $A_{1g}$ Raman peak that disappeared after 5 minutes of the plasma treatment shows that the $HfSe_2$ is converted to completely amorphous $HfO_2$ (blue curve).

FIG. 31 is a view for explaining a change in a thickness of $HfSe_2$ according to plasma oxidation and a change in a thickness of $HfO_2$ converted from $HfSe_2$.

Referring to FIG. 31, it shows a change in total thickness of $HfSe_2$ over a plasma oxidation time (Total thickness) and a change in thickness of $HfO_2$ converted from $HfSe_2$ (Converted $HfO_2$ thickness). As can be seen from FIG. 31, as the plasma oxidation time increases, the thickness of $HfSe_2$ is reduced, whereas the thickness of $HfO_2$ changed from the $HfSe_2$ increases.

FIG. 32 is a view for explaining a conversion rate of $HfSe_2$ according to plasma oxidation of $HfSe_2$.

Referring to FIG. 32, a change in $HfO_2$ thickness (nm) of $HfSe_2$ over a plasma oxidization time (Plasma time, min) of $HfO_2$ is measured, and a conversion rate of $HfO_2$, that is, an oxidation rate, is derived from the measurement and shown. More specifically, $HfSe_2$ was subjected to plasma oxidation through oxygen plasma at a power of 10 W, a flow rate of 5 sccm, and a pressure of 470 mTorr. As can be seen from FIG. 32, the conversion rate of $HfO_2$, that is, the oxidation rate, is derived as about 2.1 nm/min.

FIG. 33 is a schematic view for defining various parameters required for calculating the thickness of $HfO_2$ converted from $HfSe_2$.

Since the thicknesses measured in FIGS. 27 to 31 include both the thickness of the unconverted $HfSe_2$ and the thickness of the converted $HfO_2$, the thickness of $HfO_2$ may not be directly determined through an atomic force microscope (AFM). Therefore, an indirect approach was applied to determine the thickness of the converted $HfO_2$ and as indicated by the black arrow in FIG. 33, the relevant factors were defined as follows.

TABLE 2

| Parameter | Description |
| --- | --- |
| $t_0$ | Thickness of initial $HfSe_2$ |
| $t_1$ | Thickness of $HfO_2$ converted from $HfSe_2$ |
| $t_2$ | Thickness of $HfSe_2$ converted from $HfO_2$ |
| $t_3$ | Overall thickness of $HfO_2/HfSe_2$ stack structure |

A quantitative relationship between the above-described parameters may be expressed as follows. A difference between the thickness $t_0$ of the initial $HfSe_2$ and the total thickness ty of the $HfO_2/HfSe_2$ stack structure may be the same as a difference between the thickness $t_2$ of $HfSe_2$ converted into $HfO_2$ and the thickness $t_1$ of $HfO_2$ converted from $HfSe_2$, and may be summarized as shown in the following <Equation 1>.

$$t_0 - t_3 = t_2 - t_1 \quad \text{〈Equation 1〉}$$

In addition, as described above, since the thickness t2 of $HfSe_2$ converted into $HfO_2$ is 2.3 times larger than the thickness t1 of $HfO_2$ converted from $HfSe_2$, it may be summarized as shown in the following <Equation 2>.

$$t_2 = 1.8 \times t_1 \quad \text{〈Equation 2〉}$$

The following <Equation 3> is derived in consideration of <Equation 1> and <Equation 2> described above, and since the thickness to of the initial $HfSe_2$ and the total thickness t3 of the $HfO_2/HfSe_2$ stack structure may be confirmed using the AFM, the thickness t1 of $HfO_2$ converted from $HfSe_2$ may be derived through <Equation 3>. In addition, as shown in FIG. 32, an oxidation rate of 2.1 nm/min was derived from the thickness t1 of $HfO_2$ converted from $HfSe_2$, and a constant oxidation rate was also confirmed from various $HfSe_2$ flakes. Accordingly, the high controllability of the plasma oxidation process may be confirmed.

$$t_0 - t_3 = 1.8 t_1 - t_1 = 0.8 t_1 \quad \text{〈Equation 3〉}$$

FIG. 34 is a view for explaining an XPS analysis result of the $HfO_2/HfSe_2$ stack structure.

Referring to FIG. 34, it shows an X-ray photoelectron spectroscopy (XPS) depth profile that is analyzed by reducing a thickness by 2.5 nm through sputtering at a speed of 0.5 nm/min after the $HfO_2/HfSe_2$ stack structure is manufactured. As can be seen from FIG. 34, a clear Se 3d peak and a disappearing O 1s peak (Hf—O) may be confirmed when the thickness is reduced by 10 nm. Accordingly, the thickness is reduced through the above-described thickness control conditions, and the accuracy of the oxidation rate may be confirmed once again.

FIG. 35 is a view showing a STEM image and an FFT pattern for the $HfO_2/HfSe_2$ stack structure.

Referring to FIG. 35, a scanning transmission electron microscopy (STEM) image for the $HfO_2/HfSe_2$ stack structure is shown on the right side, and a fast Fourier transform (FFT) pattern for each of $HfO_2$ and $HfSe_2$ of the $HfO_2/HfSe_2$ stack structures is shown on the left side.

As can be seen from the STEM image of FIG. 35, a clear interface in which no visible defect is shown even in a wide range may be confirmed. In addition, as can be seen from the FFT pattern of FIG. 35, an amorphous structure of $HfO_2$ and the crystal structure of $HfSe_2$ may be confirmed. More specifically, it can be seen that an interplanar distance of the unconverted $HfSe_2$ of (001) is estimated to be about 0.614 nm, and accordingly, the unconverted $HfSe_2$ maintains the original crystal structure.

FIG. 36 is a view showing a STEM image and an EDS mapping result for the $HfO_2/HfSe_2$ stack structure.

Referring to FIG. 36, a scanning transmission electron microscopy (STEM) image of the $HfO_2/HfSe_2$ stack structure is shown on the left side, and an energy dispersive spectrometer mapping (EDS) result is shown on the right side. As can be seen from the EDS mapping result of FIG. 36, hafnium (Hf) is confirmed in both $HfO_2$ and $HfSe_2$, selenium (Se) is confirmed only in $HfSe_2$, and oxygen (O) is confirmed only in $HfO_2$ and the substrate.

FIG. 37 is a view showing a high-resolution STEM image for the $HfO_2/HfSe_2$ stack structure.

As can be seen from FIG. 37, an atomically clean interface between $HfO_2$ and $HfSe_2$ may be confirmed again, and thus the merging of unconverted $HfSe_2$ and $HfO_2$ converted from $HfSe_2$ is limited due to the formation of $HfO_2$. In addition, it can be seen that due to the limitation, the process of forming the $HfO_2$ is performed by layer-by-layer oxidation.

FIG. 38 is a view for explaining an XPS analysis result for each of $HfO_2$ and $HfSe_2$ in the $HfO_2/HfSe_2$ stack structure.

Referring to FIG. 38, it shows an X-ray photoelectron spectroscopy (XPS) analysis result for each of $HfO_2$ and $HfSe_2$ in the $HfO_2/HfSe_2$ stack structure. As shown in FIG. 38, a peak of Hf 4f at 16.01 eV and a peak of O 1s at 532.4 eV show the same results as those of a general $HfO_2$ dielectric.

Experimental Example 2: Confirmation of Characteristics of MOS Capacitor to Which $HfO_2/HfSe_2$ Stack Structure Is Applied After a lower electrode having a thickness of 10 nm is formed on a substrate, hafnium diselenide ($HfSe_2$) mechanically exfoliated from a bulk crystal was dry transferred using PDMS. Thereafter, hafnium diselenide ($HfSe_2$) was subjected to plasma oxidation to convert one region of hafnium diselenide ($HfSe_2$) into hafnium oxide ($HfO_2$), and an upper electrode having a thickness of 30 nm was formed on hafnium oxide ($HfO_2$) to manufacture a MOS capacitor to which the $HfO_2/HfSe_2$ stack structure was applied. More specifically, hafnium diselenide ($HfSe_2$) was formed to have a thickness of 15 nm, and hafnium oxide ($HfO_2$) was formed to have a thickness of 10 nm.

FIG. 39 is a view showing capacitance-voltage characteristics and a schematic view of a MOS capacitor according to Experimental Example 2.

Referring to FIG. 39, a capacitance (nF/cm²) according to a gate voltage VG (V) of the MOS capacitor is measured and shown. As shown in FIG. 39, the capacitance accumulated as the gate voltage increases shows that HfSe₂ is a typical n-type semiconductor. In addition, it can be seen that there is a low level of interface trap through the unchanging behavior in both the depletion region and the accumulation region according to the frequency (1 kHz to 1 MHZ).

FIG. 40 is view showing conductance-voltage characteristics of the MOS capacitor according to Experimental Example 2.

Referring to FIG. 40, a conductance $G_P/W$ (nF/cm²) according to the gate voltage $V_G$ (V) of the MOS capacitor is measured and shown. As can be seen from FIG. 40, there is a substantially constant change in various frequencies (1 kHz to 1 MHZ).

FIG. 41 is a view for explaining a result of extracting an interface trap density of the MOS capacitor according to Experimental Example 2 by using conductance measured through FIG. 40.

Referring to FIG. 41, it can be confirmed that a conduction method using the conductivity of FIG. 40 is used to evaluate an interface charge trap density $D_{it}$ that determines a performance of the HfO₂/HfSe₂ stack structure, and as can be seen from FIG. 41, a very low interface charge trap density $D_{it}$ (~5.7×10¹⁰ cm⁻² eV⁻¹) is obtained. More specifically, the interface charge trap density $D_{it}$ was derived through the following <Equation 4>, and Samples 1 to 3 (Sample #1, Sample #2, and Sample #3) shown in FIG. 41 represent MOS capacitors manufactured by the same process, respectively.

$$D_{it} = \frac{2.5}{Aq}\left(\frac{G_p}{\omega}\right)_{peak} \qquad \text{⟨Equation 4⟩}$$

($D_{it}$: Interface charge trap density, $(Gp/\omega)_{peak}$: Maximum value of normalized conductance peak, q: Basic charge, A: Area of MOS capacitor)

FIG. 42 is a view for explaining an equivalent oxide thickness and a dielectric constant of the MOS capacitor according to Experimental Example 2.

Referring to FIG. 42, it shows an equivalent oxide thickness (EOT) and a dielectric constant (k) according to a frequency calculated from a conductance-voltage curve of the MOS capacitor. As can be seen from FIG. 42, the MOS capacitor shows a constant dielectric constant (k) of 23 in all frequency ranges, and it can be confirmed that HfO₂ chemically converted through the oxidation process is a dielectric having a stable high dielectric constant for low-power and high-frequency electronic apparatuses. In addition, the equivalent oxide thickness (EOT, ~1.6 nm) was derived from the above-described dielectric constant (k) value.

Experimental Example 3: Confirmation of
Characteristics of Field Effect Transistor to Which
HfO₂/HfSe₂ Stack Structure Is Applied Hafnium diselenide (HfSe₂) mechanically exfoliated from the bulk crystal was dry-transferred onto the source electrode and the drain electrode using PDMS. Thereafter, hafnium diselenide (HfSe₂) was subjected to plasma oxidation to convert one region of hafnium diselenide (HfSe₂)

into hafnium oxide (HfO₂), and a gate electrode having a thickness of 50 nm was formed on hafnium oxide (HfO₂) to manufacture a field effect transistor (FET) to which the HfO₂/HfSe₂ stack structure was applied. More specifically, the gate electrode was formed to cover the entire upper surface of hafnium oxide (HfO₂).

FIG. 43 is a schematic view of a field effect transistor according to Experimental Example 3.

Referring to FIG. 43, it shows the field effect transistor according to Experimental Example 3 to which the HfO₂/HfSe₂ stack structure is applied. As shown in FIG. 43, HfSe₂ is formed such that one side thereof makes contact with the source electrode (Source) and the other side thereof makes contact with the drain electrode (Drain), and the gate electrode is formed to cover the entire upper surface of HfO₂.

FIG. 44 is a view showing an ID-VG curve of the field effect transistor according to Experimental Example 3.

Referring to FIG. 44, $I_{DS}$ (A) according to $V_{GS}$ (V) of the field effect transistor according to Experimental Example 3 is measured and shown. As shown in FIG. 44, the field effect transistor has an ideal subthreshold swing (SS) value of 61 mV/dec close to the Boltzmann limit at room temperature, a high on-off ratio $I_{on/off}$ (~10⁸) and a low gate leakage current value of 10⁻⁶ A/cm². Accordingly, it can be seen that the HfO₂/HfSe₂ stack structure of the field effect transistor has excellent interface characteristics.

FIG. 45 is a view showing an ID-VG curve according to a gate voltage sweep of the field effect transistor according to Experimental Example 3.

Referring to FIG. 45, it shows hysteresis observed during a forward/reverse sweep. As can be seen in FIG. 45, the field effect transistor exhibits a small hysteresis of about 11 mV during a gate voltage sweep. Accordingly, it can be seen that the HfO₂/HfSe₂ stack structure of the field effect transistor includes a small trap concentration at the interface and inside the HfO₂.

FIG. 46 is a view showing an ID-VG curve according to a temperature of the field effect transistor according to Experimental Example 3.

Referring to FIG. 46, it shows a change in a subthreshold swing (SS) value according to a temperature (100 K to 300 K) of the field effect transistor according to Experimental Example 3. As can be seen from FIG. 46, as the temperature decreases from 300 K to 100 K, the subthreshold swing (SS) value also decreases from 61 mV/dec to 26 mV/dec.

FIG. 47 is a view showing a subthreshold swing value according to a temperature of the field effect transistor according to Experimental Example 3.

Referring to FIG. 47, it shows a change in the subthreshold swing (SS) value (mV/dec) as the temperature of the field effect transistor is changed from 50 K to 300 K. As can be seen from FIG. 47, as the temperature increases, the subthreshold swing also increases, which is value substantially identical to experimental data.

FIG. 48 is a view for explaining a simulation result of RC Delay characteristics according to an interface charge trap concentration of the field effect transistor according to Experimental Example 3.

Referring to FIG. 48, it shows a simulation result of RC Delay characteristics according to HfO₂/HfSe₂ interface charge trap density $D_{it}$ of the field effect transistor according to Experimental Example 3. As can be seen from FIG. 48, the significance of the low interface charge trap concentration $D_{it}$ can be seen through a simulation evaluation of RC Delay that may appear in a circuit according to the increase in the interface charge trap concentration $D_{it}$.

FIG. 49 is a view showing electrical characteristics of the field effect transistor according to Experimental Example 3 in which a thickness ratio of $HfO_2$:$HfSe_2$ is 1:1.

Referring to FIG. 49, a subthreshold swing (SS) value, an operation current value (On current), and a threshold voltage $V_{TH}$ of the field effect transistor according to Experimental Example 3 in which the thickness ratio of $HfO_2$:$HfSe_2$ is 1:1 are measured and shown. More specifically, each of the thickness of $HfO_2$ and the thickness of $HfSe_2$ is 10 nm. As can be seen from FIG. 49, the subthreshold swing (SS) value is measured to ~61.5 mV/dec, the operating current value (On current) was measured to be about ~$10^{-5}$ A, and the threshold voltage value $V_{TH}$ was measured to be about ~−0.75 V.

FIG. 50 is a view showing electrical characteristics of the field effect transistor according to Experimental Example 3 in which a thickness ratio of $HfO_2$:$HfSe_2$ is 1:2.

Referring to FIG. 50, a subthreshold swing (SS) value, an operation current value (On current), and a threshold voltage $V_{TH}$ of the field effect transistor according to Experimental Example 3 in which the thickness ratio of $HfO_2$:$HfSe_2$ is 1:2 are measured and shown. More specifically, the thickness of $HfO_2$ and the thickness of $HfSe_2$ are 10 nm and 20 nm, respectively.

As can be seen from FIG. 50, the subthreshold swing (SS) value is measured to be about ~80.7 mV/dec, the operating current value (On current) was measured to be about ~$10^{-7}$ A, and the threshold voltage value $V_{TH}$ was measured to be about ~−1.1 V.

FIG. 51 is a view showing electrical characteristics of the field effect transistor according to Experimental Example 3 in which a thickness ratio of $HfO_2$:$HfSe_2$ is 1:3.

Referring to FIG. 51, a subthreshold swing (SS) value, an operation current value (On current), and a threshold voltage $V_{TH}$ of the field effect transistor according to Experimental Example 3 in which the thickness ratio of $HfO_2$:$HfSe_2$ is 1:3 are measured and shown. More specifically, the thickness of $HfO_2$ and the thickness of $HfSe_2$ are 10 nm and 30 nm, respectively.

As can be seen from FIG. 51, the subthreshold swing (SS) value is measured to be about ~103.2 mV/dec, the operating current value (On current) was measured to be about ~$10^{-8}$ A, and the threshold voltage value $V_{TH}$ was measured to be about ~−1.6 V.

TABLE 3

| Classification | SS | On current | $V_{TH}$ |
|---|---|---|---|
| Thickness ratio of $HfO_2$:$HfSe_2$ 1:1 | ~61.5 mV/dec | ~$10^{-5}$ A | ~−0.75 V |
| Thickness ratio of $HfO_2$:$HfSe_2$ 1:2 | ~80.7 mV/dec | ~$10^{-7}$ A | ~−1.1 V |
| Thickness ratio of $HfO_2$:$HfSe_2$ 1:3 | ~103.2 mV/dec | ~$10^{-8}$ A | ~−1.6 V |

As a result, as can be seen from FIGS. 49 to 51, when the thickness of $HfSe_2$ is increased compared to the thickness of $HfO_2$, the subthreshold swing (SS) value increases, and the operation current value (On current) and the threshold voltage value $V_{TH}$ decreases, thereby deteriorating electrical characteristics. In addition, electrical characteristics were measured even when the ratio of the thickness of the $HfSe_2$ to the thickness of the $HfO_2$ was reduced, but when the ratio of the thickness of the $HfSe_2$ to the thickness of the $HfO_2$ was reduced to less than 1, it was confirmed that there was no substantial change compared to the case where the ratio of the thickness of the $HfSe_2$ to the thickness of the $HfO_2$ was 1. Accordingly, it can be seen that, when the field effect transistor using the $HfO_2$/$HfSe_2$ stack structure is manufactured, the ratio of the thickness of the $HfSe_2$ to the thickness of the $HfO_2$ is necessarily controlled to be 1 or less.

FIG. 52 is a view for explaining a result of measuring a subthreshold swing value of the field effect transistor according to Experimental Example 3 to which a $HfO_2$/$HfSe_2$ stack structure oxidized with oxygen plasma having power of 10 W is applied.

Referring to FIG. 52, a subthreshold swing value SS was derived by measuring $I_{DS}$ (A) according to $V_{GS}$ (V) for the field effect transistor according to Experimental Example 3 to which the $HfO_2$/$HfSe_2$ stack structure oxidized with oxygen plasma having power of 10 W was applied. As can be seen from FIG. 52, a subthreshold swing (SS) value (~65 mV/dec) is obtained when the power of 10 W is applied.

FIG. 53 is a view for explaining a result of measuring a subthreshold swing value of the field effect transistor according to Experimental Example 3 to which a $HfO_2$/$HfSe_2$ stack structure oxidized with oxygen plasma having power of 15 W is applied.

Referring to FIG. 53, a subthreshold swing value SS was derived by measuring $I_{DS}$ (A) according to $V_{GS}$ (V) for the field effect transistor according to Experimental Example 3 to which the $HfO_2$/$HfSe_2$ stack structure oxidized with oxygen plasma having power of 15 W was applied. As can be seen from FIG. 53, a subthreshold swing (SS) value of equal to or less than 98 mV/dec is obtained when the power of 15 W is applied.

FIG. 54 is a view for explaining a result of measuring a subthreshold swing value of the field effect transistor according to Experimental Example 3 to which a $HfO_2$/$HfSe_2$ stack structure oxidized with oxygen plasma having power of 20 W is applied.

Referring to FIG. 54, a subthreshold swing value SS was derived by measuring $I_{DS}$ (A) according to $V_{GS}$ (V) for the field effect transistor according to Experimental Example 3 to which the $HfO_2$/$HfSe_2$ stack structure oxidized with oxygen plasma having power of 20 W was applied. As can be seen from FIG. 54, a subthreshold swing (SS) value of equal to or less than 130 mV/dec is obtained when the power of 20 W is applied.

FIG. 55 is a view for explaining a result of measuring a subthreshold swing value of the field effect transistor according to Experimental Example 3 to which a $HfO_2$/$HfSe_2$ stack structure oxidized with oxygen plasma having power of 25 W is applied.

Referring to FIG. 55, a subthreshold swing value SS was derived by measuring $I_{DS}$ (A) according to $V_{GS}$ (V) for the field effect transistor according to Experimental Example 3 to which the $HfO_2$/$HfSe_2$ stack structure oxidized with oxygen plasma having power of 25 W was applied. As can be seen from FIG. 55, a subthreshold swing (SS) value of equal to or less than 192 mV/dec is obtained when the power of 25 W is applied.

FIG. 56 is a view for explaining a result of measuring a subthreshold swing value of the field effect transistor according to Experimental Example 3 to which a $HfO_2$/$HfSe_2$ stack structure oxidized with oxygen plasma having power of 30 W is applied.

Referring to FIG. 56, a subthreshold swing value SS was derived by measuring $I_{DS}$ (A) according to $V_{GS}$ (V) for the field effect transistor according to Experimental Example 3 to which the $HfO_2$/$HfSe_2$ stack structure oxidized with oxygen plasma having power of 30 W was applied. As can be seen from FIG. 56, a subthreshold swing (SS) value (~250 mV/dec) is obtained when the power of 30 W is applied.

TABLE 4

| Oxygen plasma power | Subthreshold swing (SS) value |
|---|---|
| 10 W | ~65 mV/dec |
| 15 W | ~98 mV/dec |
| 20 W | ~130 mV/dec |
| 25 W | ~192 mV/dec |
| 30 W | ~250 mV/dec |

As can be seen from FIGS. 52 to 56, as the oxygen plasma power increases from 10 W to 30 W, the subthreshold swing value increases from about ~65 mV/dec to about ~250 mV/dec. In addition, an equation capable of calculating the subthreshold swing (SS) value according to oxygen plasma power (W) is derived based on the results measured in FIGS. 52 to 56, and the derived equation is summarized through the following <Equation 5>.

$$y = y_0 + A1 \times \exp\left(-\frac{x}{t_1}\right) \qquad \text{<Equation 5>}$$

(x: Oxygen plasma power (based on W, only the numbers other than W is applied), y: Subthreshold swing value, $y_0$: −25.79881, A1: 50.00735, $t_1$: −16.5733)

As described above, since the field effect transistor to which the $HfO_2$/$HfSe_2$ stack structure is applied may derive the subthreshold swing value through only oxygen plasma power for oxidation of $HfSe_2$, the field effect transistor may be easily applied to various fields through prediction of the subthreshold swing value.

FIG. 57 is a view for explaining a result of measuring a leakage current value of the field effect transistor according to Experimental Example 3 to which a $HfO_2$/$HfSe_2$ stack structure oxidized with oxygen plasma having mutually different power is applied.

Referring to FIG. 57, leakage current values (Gate leakage current density, A/cm$^2$) according to $V_{GS}$ (V) are measured and shown for the field effect transistor according to Experimental Example 3 to which the $HfO_2$/$HfSe_2$ stack structure oxidized with the oxygen plasma having different powers (10 W, 15 W, 20 W, 25 W, and 30 W) is applied. As can be seen from FIG. 57, as the oxygen plasma power is increased from 10 W to 30 W, the leakage current value is also increased.

Experimental Example 4: Confirmation of Characteristics of Impact Ionization Super-Tilt Switching Device to Which $HfO_2$/$HfSe_2$ Stack Structure Is Applied Hafnium diselenide ($HfSe_2$) mechanically exfoliated from the bulk crystal was dry-transferred onto the source electrode and the drain electrode using PDMS. Thereafter, hafnium diselenide ($HfSe_2$) was subjected to plasma oxidation to convert one region of hafnium diselenide ($HfSe_2$) into hafnium oxide ($HfO_2$), and a gate electrode having a thickness of 50 nm was formed on hafnium oxide ($HfO_2$) to manufacture a field effect transistor (FET) to which the $HfO_2$/$HfSe_2$ stack structure was applied. More specifically, the gate electrode was formed to cover a portion of an upper surface of hafnium oxide ($HfO_2$) and expose the remaining part thereof to the outside.

FIG. 58 is a schematic view of an impact ionization super-tilt switching device according to Experimental Example 4.

Referring to FIG. 58, it shows the impact ionization super-tilt switching device according to Experimental Example 4 to which the $HfO_2$/$HfSe_2$ stack structure is applied. In addition, it shows a band structure diagram according to the gate voltage and drain voltage and an illustration representing an impact ionization phenomenon.

As can be seen from FIG. 58, $HfSe_2$ is formed such that one side thereof makes contact with the source electrode (Source) and the other side thereof makes contact with the drain electrode (Drain), in which $HfSe_2$ is divided into a region $L_{gated}$ in which the gate electrode overlaps $HfO_2$ and a region $L_{ungated}$ in which the gate electrode does not overlap $HfO_2$ and an upper surface of $HfO_2$ is exposed to the outside.

In addition, it can be confirmed that when a sufficiently high drain voltage $V_{BR}$ and a gate voltage are applied, an impact ionization phenomenon occurs in the region $L_{ungated}$ in which the gate electrode does not overlap $HfO_2$.

FIG. 59 is a view showing an ID-VG curve of the impact ionization super-tilt switching device according to Experimental Example 4.

Referring to FIG. 59, it shows transmission characteristics showing a rapid increase in current due to the impact ionization phenomenon occurring in the impact ionization super-tilt switching device according to Experimental Example 4. Further, a portion inserted in FIG. 59 shows a portion where super-tilt switching occurs in an enlarged manner. As can be seen from FIG. 59, the impact ionization super-tilt switching device according to Experimental Example 4 has a very low subthreshold swing (SS) value of 3.43 mV/dec by overcoming a thermionic limit (60 mV/dec) of the CMOS device.

FIG. 60 is a view showing an ID-VD curve of the impact ionization super-tilt switching device according to Experimental Example 4.

Referring to FIG. 60, it shows output characteristics showing a rapid increase in current due to the impact ionization phenomenon occurring in the impact ionization super-tilt switching device according to Experimental Example 4.

FIG. 61 is a view showing electron-hole pairs generated in a gate non-overlapping region of an impact ionization super-tilt switching device according to Experimental Example 4. Referring to FIG. 61, it shows a simulation result of an impact ionization rate and a generated electron-hole density in a region (ungated region) in which the gate electrode of the super gradient switching device according to Experimental Example 4 does not overlap $HfO_2$. As can be seen from FIG. 61, a sufficient number of electron-hole pairs are generated by impact ionization in the region (ungated region) in which the gate electrode does not overlap $HfO_2$.

FIG. 62 is a view showing a threshold voltage according to a change in a thickness of $HfO_2$ and a length of the gate non-overlapping region of the impact ionization super-tilt switching device according to Experimental Example 4.

Referring to FIG. 62, it shows a change in a threshold voltage $V_{BR}$ (V) through the adjustment of the $HfO_2$ thickness (nm) of the impact ionization super-tilt switching device according to Experimental Example 4 and a length of the region $L_{ungated}$ (nm) in which the gate electrode does not overlap $HfO_2$. As can be seen from FIG. 62, the super-tilt switching may be implemented under a lower driving voltage. FIG. 63 is a view showing channel currents according to various drain voltages and gate voltages of the impact ionization super-tilt switching device according to Experimental Example 4.

Referring to FIG. 63, it is possible to confirm a correlated precondition of the gate voltage and the drain voltage the super-tilt switching in the impact ionization super-tilt switching device according to Experimental Example 4.

FIG. 64 is a view for explaining a change in electrical characteristics according to the change in the length of the gate non-overlapping region of the impact ionization super-tilt switching device according to Experimental Example 4.

Referring to FIG. 64, it shows simulation results for a threshold voltage $V_{TH}$, a threshold voltage $V_{BR}$, and a on-off ratio according to the length $L_{ungated}$ (nm) of the region in which the gate electrode and $HfO_2$ of the impact ionization super-tilt switching device according to Exemplary Embodiment 4 do not overlap.

As can be seen from FIG. 64, when the length $L_{ungated}$ (nm) of the region in which the gate electrode does not overlap $HfO_2$ is reduced, the threshold voltage $V_{TH}$ and the threshold voltage $V_{BR}$ may be additionally reduced. Accordingly, it can be seen that power consumption and device reliability may be improved by reducing the supply voltage while maintaining a high on-off ratio.

Experimental Example 5: Confirmation of Characteristics of Transistor Integrated with Gate Dielectric on MoS₂ Two-Dimensional Semiconductor FIG. 65 is a schematic view for explaining a process of manufacturing a transistor according to Experimental Example 5.

Referring to FIG. 65, $MoS_2$ was formed on a substrate as a two-dimensional semiconductor, and a source electrode S and a drain electrode D were formed on one side and the other side of the $MoS_2$, respectively. Thereafter, $HfSe_2$ was formed on $MoS_2$, and oxygen plasma was continuously provided to the $HfSe_2$ to fully convert $HfSe_2$ into $HfO_2$. Finally, a gate electrode was formed on $HfO_2$ to manufacture the transistor according to Experimental Example 5.

FIG. 66 is a view for explaining $MoS_2$ semiconductor characteristics of the transistor according to Experimental Example 5.

Referring to FIG. 66, semiconductor characteristics of $MoS_2$ were confirmed by measuring $I_{DS}$ (A) according to $V_{BG/TG}$ (V) of the transistor according to Experimental Example 5. As can be seen from FIG. 66, $MoS_2$ has n-type semiconductor characteristics. In addition, it can be confirmed that the transistor according to Experimental Example 5 exhibits small hysteresis.

FIG. 67 is a view for explaining a subthreshold swing value of the transistor according to Experimental Example 5.

Referring to FIG. 67, a subthreshold swing (SS) value was derived by measuring $I_{DS}$ (A) according to $V_{TG}$ (V) of the transistor according to Experimental Example 5. As can be seen from FIG. 67, the transistor according to Experimental Example 5 has a low subthreshold swing value (~60.5 mV/dec).

That is, as can be seen from FIGS. 66 and 67, the transistor according to Experimental Example 5 has a very low subthreshold swing value and a small hysteresis, and thus, it can be seen that the transistor has excellent interface characteristics between $MoS_2$ and $HfO_2$, and it can be predicted that the interface characteristics are caused by a high-quality van der Waals (vdW) interface.

Experimental Example 6: Confirmation of Characteristics of Transistor Integrated with Gate Dielectric on WSe₂ Two-Dimensional Semiconductor $WSe_2$ was formed on a substrate as a two-dimensional semiconductor, and a source electrode S and a drain electrode D were formed on one side and the other side of the $WSe_2$, respectively. Thereafter, $HfSe_2$ was formed on $WSe_2$, and oxygen plasma was continuously provided to the $HfSe_2$ to fully convert $HfSe_2$ into $HfO_2$. Finally, a gate electrode was formed on $HfO_2$ to manufacture the transistor according to Experimental Example 6.

FIG. 68 is a view for explaining $Wse_2$ semiconductor characteristics of a transistor according to Experimental Example 6.

Referring to FIG. 68, semiconductor characteristics of $WSe_2$ were confirmed by measuring $I_{DS}$ (A) according to $V_{BG/TG}$ (V) of the transistor according to Experimental Example 6. As can be seen from FIG. 68, $WSe_2$ has p-type semiconductor characteristics. In addition, it can be confirmed that the transistor according to Experimental Example 6 exhibits small hysteresis.

FIG. 69 is a view for explaining a subthreshold swing value of the transistor according to Experimental Example 6.

Referring to FIG. 69, a subthreshold swing (SS) value was derived by measuring $I_{DS}$ (A) according to $V_{TG}$ (V) of the transistor according to Experimental Example 6. As can be seen from FIG. 69, the transistor according to Experimental Example 6 has a low subthreshold swing value (~61.3 mV/dec).

That is, as can be seen from FIGS. 68 and 69, the transistor according to Experimental Example 6 has a very low subthreshold swing value and a small hysteresis, and thus, it can be seen that the transistor has excellent interface characteristics between $WSe_2$ and $HfO_2$, and it can be predicted that the interface characteristics are caused by a high-quality van der Waals (vdW) interface.

While the present invention has been described in connection with the embodiments, it is not to be limited thereto but will be defined by the appended claims. In addition, it is to be understood that those skilled in the art can substitute, change or modify the embodiments in various forms without departing from the scope and spirit of the present invention.

What is claimed is:

1. A method for manufacturing a stack structure, the method comprising:

preparing a substrate;

forming a channel layer including a two-dimensional (2D) semiconductor material including hafnium diselenide ($HfSe_2$) on the substrate; and oxidizing the channel layer using oxygen ($O_2$) plasma to form a dielectric layer including a high-k material comprising hafnium oxide ($HfO_x$, x>0), wherein a power of oxygen ($O_2$) plasma is controlled to be greater than 7 W and less than 20 W, wherein an interface is formed between the channel layer and the dielectric layer by substitution of selenium atoms of the hafnium diselenide ($HfSe_2$) with oxygen atoms penetrating into the channel layer and replacing the selenium atoms of the hafnium diselenide ($HfSe_2$), wherein there is no collapse of the interface formed between the channel layer and the dielectric layer, and wherein a thickness of the dielectric layer formed by oxidizing the channel layer satisfies Equation 3 below, $$t_0 - t_3 = 1.8t_1 - t_1 = 0.8t_1 \qquad \langle\text{Equation 3}\rangle$$

($t_0$: a thickness of an initial channel layer, $t_1$: the thickness of the dielectric layer formed by oxidizing the channel layer, $t_3$: a combined total thickness of a post-oxidation channel layer and the dielectric layer).

2. The method of claim 1, wherein as the channel layer is oxidized, one region of the channel layer is converted into the dielectric layer including the high-k material, and the other region of the channel layer remains as the channel layer including the two-dimensional semiconductor material.

3. The method of claim 1, wherein the thickness of the dielectric layer is controlled according to an exposure time of the channel layer to the oxygen ($O_2$) plasma.

* * * * *